(12) United States Patent
Hann et al.

(10) Patent No.: US 11,941,483 B2
(45) Date of Patent: Mar. 26, 2024

(54) CROSS-TALK REDUCTION IN FAULT TOLERANT QUANTUM COMPUTING SYSTEM

(71) Applicant: Amazon Technologies, Inc., Seattle, WA (US)

(72) Inventors: Connor Hann, New Haven, CT (US); Kyungjoo Noh, Pasadena, CA (US); Patricio Arrangoiz Arriola, San Francisco, CA (US); Christopher Chamberland, Pasadena, CA (US); Fernando Brandao, Pasadena, CA (US)

(73) Assignee: Amazon Technologies, Inc., Seattle, WA (US)

( * ) Notice: Subject to any disclaimer, the term of this patent is extended or adjusted under 35 U.S.C. 154(b) by 454 days.

(21) Appl. No.: 17/217,946

(22) Filed: Mar. 30, 2021

(65) Prior Publication Data
US 2022/0180236 A1    Jun. 9, 2022

Related U.S. Application Data

(60) Provisional application No. 63/121,794, filed on Dec. 4, 2020.

(51) Int. Cl.
*G06N 10/00* (2022.01)
*G01R 31/3177* (2006.01)
(Continued)

(52) U.S. Cl.
CPC ......... *G06N 10/00* (2019.01); *G01R 31/3177* (2013.01); *G06N 10/40* (2022.01);
(Continued)

(58) Field of Classification Search
None
See application file for complete search history.

(56) References Cited

U.S. PATENT DOCUMENTS

| | | |
|---|---|---|
| 9,512,545 B2 | 12/2016 | Zhang |
| 9,940,586 B1 | 4/2018 | Epstein |

(Continued)

OTHER PUBLICATIONS

W. Pfaff, C. Axline, L. Burkhart, et al., "Schrodinger's Catapult: Launching Multiphoton Quantum States from a Microwave Cavity Memory," Nature Physics 13, 882 (2017), arXiv preprint arXiv:1612.05238v1, pp. 1-18.

(Continued)

*Primary Examiner* — Anh Q Tran
(74) *Attorney, Agent, or Firm* — Alexander A. Knapp; Kowert, Hood, Munyon, Rankin & Goetzel, P.C.

(57) ABSTRACT

A fault tolerant quantum computer is implementing using hybrid acoustic-electric qubits. A control circuit includes an asymmetrically threaded superconducting quantum interference devices (ATS) that excites phonons in a mechanical resonator by driving a storage mode of the mechanical resonator and dissipates phonons from the mechanical resonator via an open transmission line coupled to the control circuit, wherein the open transmission line is configured to absorb photons from a dump mode of the control circuit. Filters are included in the control circuit to suppress cross-talk errors. Additionally, frequencies and pump mode detunings for respective multiplexed control circuits are strategically selected to reduce cross-talk errors.

23 Claims, 22 Drawing Sheets

(51) Int. Cl.
  *G06N 10/40* (2022.01)
  *G06N 10/70* (2022.01)
  *H04B 10/00* (2013.01)
  *H04B 10/70* (2013.01)
(52) U.S. Cl.
  CPC ............. *G06N 10/70* (2022.01); *H04B 10/00* (2013.01); *H04B 10/70* (2013.01)

(56) References Cited

U.S. PATENT DOCUMENTS

| | | | |
|---|---|---|---|
| 10,404,214 | B2 | 9/2019 | Szocs |
| 10,803,396 | B2 | 10/2020 | Yoscovits |
| 11,037,068 | B2 | 6/2021 | Girvin |
| 11,307,242 | B1 | 4/2022 | Zeng |
| 2018/0053112 | A1 | 2/2018 | Bravyi |
| 2019/0049495 | A1 | 2/2019 | Ofek |
| 2019/0214561 | A1 | 7/2019 | Schrade |
| 2019/0266512 | A1 | 8/2019 | Shen |
| 2019/0385673 | A1 | 12/2019 | Bosman |
| 2020/0161446 | A1 | 5/2020 | Anderson |
| 2020/0242500 | A1* | 7/2020 | Girvin ................ G06N 10/70 |
| 2020/0264213 | A1* | 8/2020 | Przybysz ............ G06N 10/00 |
| 2021/0019223 | A1 | 1/2021 | Chamberland |
| 2021/0234086 | A1* | 7/2021 | Lescanne ............ G06N 10/20 |
| 2021/0384404 | A1 | 12/2021 | Finck |

OTHER PUBLICATIONS

D. Gottesman, "An Introduction to Quantum Error Correction and Fault-Tolerant Quantum Computation," Proceedings of Symposia in Applied Mathematics 68, 13 (2010), arXiv preprint arXiv:0904.2557v1, pp. 1-46.
C. Chamberland and M. E. Beverland, "Flag Fault-Tolerant Error Correction with Arbitrary Distance Codes," Quantum 2, 53 (2018), arXiv preprint arXiv:1708.02246v3, pp. 1-29.
J. Edmonds, "Paths, Trees, and Flowers," Canadian Journal of mathematics 17, pp. 449-467, (1965).
N. Delfosse and N. H. Nickerson, "Almost-Linear Time Decoding Algorithm for Tological Codes," arXiv e-prints, arXiv:1709.06218 (2017), pp. 1-10.
E. T. Campbell and M. Howard, "A Unified Framework for Magic State Distillation and Multiquibit Gate-Synthesis with Reduced Resource Cost," Physical Review A 95, 022316 (2017), arXiv e-print arXiv:1606.01904v4, pp. 1-23.
P. Brooks and J. Preskill, "Fault-Tolerant Quantum Computation with Asymmetric Bacon-Shor Codes," CORE, Physical Review A 87, 032310 (2013 American Physical Society), pp. 1-16.
J. T. Anderson, G. Duclos-Cianci, and D. Poulin, "Fault-Tolerant Convesion Between the Steane and Reed-Muller Quantum Codes," Physical Review Letters 113, 080501 (2014), arXiv e-print arXiv:1403.2734v1, pp. 1-6.
C. Vuillot, L. Lao, B. Criger, C. G. Almudever, K. Bertels, and B. M. Terhal, "Code Deformation and Lattice Surgery are Gauge Fixing," New Journal of Physics 21, 033028 (2019 IOP Publishing Ltd), pp. 1-21.
A. J. Landahl and C. Ryan-Anderson, "Quantum Computing by Color-Code Lattice Surgery," arXiv e-prints, arXiv:1407.5103 (2014), arXiv:1407.5103, pp. 1-13.
A. G. Fowler and C. Gidney, "Low Overhead Quantum Computation Using Lattice Surgery," arXiv:1808.06709 (2018), pp. 1-15.
D. Gottesman, Proceedings, "The Heisenberg Representation of Quantum Computers," XXII International Colloquium on Group Theoretical Methods in Physics , 32 (1999), arXiv e-print arXiv:quant-ph/9807006v1, pp. 1-20.
E. Dennis, A. Kitaev, A. Landahl, and J. Preskill, J. "Topological Quantum Memory," CORE, Journal of Mathematical Physics, vol. 43, No. 9, pp. 4452-4505 (2002 American Institute of Physics).
A. A. Kovalev and L. P. Pryadko, "Fault-Tolerance of "Bad" Quantum Low-Density Parity Check Codes," arXiv preprint arXiv:1208.2317 (2012), pp. 1-5.
R. Raussendorf and J. Harrington, "Fault-Tolerant Quantum Computation with Threshold in Two Dimensions," Physical Review Letters 98, 190504 (2007 The American Physical Society), pp. 1-4.
D. S. Wang, A. G. Fowler, and L. C. L. Hollenberg, "Surface Code Quantum Computing with Error Rates over 1%," ReasearchGate, Phys. Rev. A 83, 020302 (2011), pp. 1-5.
A. G. Fowler, "Proof of Finite Surface Code Threshold for Matching," Phys. Rev. Letters 109, 180502 (2012), pp. 1-5.
C. Chamberland, A. Kubica, T. J. Yoder, and G. Zhu, "Triangular Color Codes on Trivalent Graphs with Flag Qubits," New Journal of Physics 22, 023019 (2020 IOP Publishing, Ltd), pp. 1-24.
P. W. Shor, "Fault-Tolerant Quantum Computation," in Proceedings of the 37th Annual Symposium on Foundations of Computer Science, FOCS '96 (IEEE Computer Society, USA, 1996) p. 56, arXiv e-print arXiv:quant-ph/9605011v2, pp. 1-11.
E. Dennis, "Toward Fault-Tolerant Quantum Computation without Concatenation," Phys. Rev. A 63, 052314 (2001), arXiv e-print arXiv:quant-ph/9905027v2, pp. 1-13.
C. Jones, "Multilevel Distillation of Magic States for Quantum Computing," Phys. Rev. A 87, 042305 (2013), arXiv e-print arXiv:1210.3388v2, pp. 1-10.
A. G. Fowler, "Optimal Complexity Correction of correlated Errors in the Surface Code," arXiv:1310.0863 (2013), pp. 1-6.
M. B. Hastings and J. Haah, "Distillation with Sublogarithmic Overhead," Physical review letters 120, 050504 (2018), arXiv e-print arXiv:1709.03543v2, pp. 1-2.
C. Jones, "Novel Constructions for the Fault-Tolerant Toffoli Gate," Phys. Rev. A. 87, 022328 (2013), arXiv e-print arXiv:1212.5069v1, pp. 1-5.
B. Eastin, "Distilling One-Qubit Magic States into Toffoli States," Phys. Rev. A. 87, 032321 (2013), arXiv e-print arXiv:1212.4872v2, pp. 1-8.
Christopher Chamberland, Kyungjoo Noh, Patricio, Arrangoiz-Arriola, Earl T. Campbell, Connor T. Hann, Joseph Iverson, Harald Putterman, Thomas C. Bohdanowicz, Steven T. Flammia, Andrew Keller, Gil Refael, John Preskill, Liang Jiang, Amir H. Safavi-Naeini, Oskar Painter, and Fernando G. S. L. Brandao. "Building a fault-tolerant quantum computer using concatenated cat codes", arXiv e-prints, art. arXiv:2012.04108, Dec. 2020, pp. 1-118. URL https://ui.adsabs.harvard.edu/abs/2020arXiv201204108C.
Dave Bacon and Andrea Casaccino. "Quantum Error Correcting Subsystem Codes From Two Classical Linear Codes," arXiv e-prints, art. quant-ph/0610088, Oct. 2006, pp. 1-9.
Panos Aliferis and Andrew W. Cross, Subsystem fault tolerance with the Bacon-Shor code, Physical Review Letters, 98:220502, May 2007, pp. 1-4. doi:10.1103/PhysRevLett.98.220502. URL https://link.aps.org/doi/10.1103/PhysRevLett.98.220502.
U.S. Appl. No. 17/098,248, filed Nov. 13, 2020, Harald Esko Jakob, et al.
U.S. Appl. No. 17/218,046, filed Mar. 30, 2021, Christopher Chamberland, et al.
U.S. Appl. No. 17/098,237, filed Nov. 13, 2020, Patricio Arrangoiz Arriola, et al.
U.S. Appl. No. 17/098,240, filed Nov. 13, 2020, Earl Campbell, et al.
U.S. Appl. No. 17/098,245, filed Nov. 13, 2020, Kyungjoo Noh, et al.
U.S. Appl. No. 17/218,043, filed Mar. 30, 2021, Christopher Chamberland, et al.
U.S. Appl. No. 17/098,232, filed Nov. 13, 2020, Patricio Arrangoiz Arriola, et al.
U.S. Appl. No. 17/098,046, filed Nov. 13, 2020, Christopher Chamberland, et al.
U.S. Appl. No. 17/362,750, filed Jun. 29, 2021, Kyungjoo Noh, et al.
U.S. Appl. No. 17/362,754, filed Jun. 29, 2021, Christopher Chamberland, et al.
U.S. Appl. No. 17/362,761, filed Jun. 29, 2021, Kyungjoo Noh, et al.

(56) References Cited

OTHER PUBLICATIONS

Sergey Bravyi, et al., "Quantum Codes on a Lattice with Boundary," ArXiv Preprint: arXiv:quant-ph/9811052, 1998 pp. 1-6.
J. O'Gorman and E. T. Campbell, "Quantum Computation with Realistic Magic State Factories," Physical Review A 95, 032338 (2017), arXiv:1605.07197, pp. 1-22.
M. Motta, E. Ye, J. R. McClean, Z. Li, A. J. Minnich, R. Babbush, and G. K.-L. Chan, "Low rank representations for quantum simulation of electronic structure," (2018), arXiv:1808.02625, pp. 1-8.
C. Gidney and M. Ekera, "How to factor 2048 bit RSA integers in 8 hours using 20 million noisy qubits" (2019), arXiv:1905.09749 [quant-ph], pp. 1-31.
E. Campbell, A. Khurana, and A. Montanaro, "Applying Quantum Algorithms to Constraint Satisfaction Problems," Quantum 3, 167 (2019), arXiv:1810.05582, pp. 1-30.
I. D. Kivlichan, C. Gidney, D. W. Berry, N. Wiebe, J. McClean, W. Sun, Z. Jiang, N. Rubin, A. Fowler, A. Aspuru-Guzik, and et al., "Improved Fault-Tolerant Quantum Simulation of Condensed-Phased Correlated Electrons via Trotterization," Quantum 4, 296 (2020), arXiv:1902.10673, pp. 1-45.
D. K. Tuckett, S. D. Bartlett, and S. T. Flammia, "Ultrahigh Error Threshold for Surface Codes with Biased Noise," Phys. Rev. Lett. 120, 050505 (2018), arXiv:1708.08474, pp. 1-6.
D. K. Tuckett, A. S. Darmawan, C. T. Chubb, S. Bravyi, S. D. Bartlett, and S. T. Flammia, "Tailoring Surface Codes for Highly Biased Noise," Phys. Rev. X 9, 041031 (2019), arXiv:1812.08186, pp. 1-22.
D. K. Tuckett, S. D. Bartlett, S. T. Flammia, and B. J. Brown, "Fault-Tolerant Thresholds for the Surface Code in Excess of 5% Under Biased Noise," Phys. Rev. Lett. 124, 130501 (2020), arXiv:1907. 02554, pp. 1-10.
J. P. Bonilla Ataides, D. K. Tuckett, S. D. Bartlett, S. T. Flammia, and B. J. Brown, "The XZZX surface code," (2020), arXiv:2009. 07851 [quant-ph], pp. 1-16.
P. Aliferis and J. Preskill, "Fault-Tolerant Quantum Computation Against Biased Noise," Phys. Rev. A 78, 052331 (2008), arXiv:0710. 1301, pp. 1-9.
S. Puri, L. St-Jean, J. A. Gross, A. Grimm, N. E. Frattini, P. S. Iyer, A. Krishna, S. Touzard, L. Jiang, A. Blais, and et al., "Bias-Preserving Gates with Stabilized CAT Quibits," Science Advances 6, eaay5901 (2020), arXiv:1905.00450, pp. 1-25.
J. Guillaud and M. Mirrahimi, "Repetition Cat Qubits for Fault-Tolerant Quantum Computation," Phys. Rev. X 9, 041053 (2019), arXiv:1904.09474, pp. 1-23.
J. Guillaud and M. Mirrahimi, "Error Rates and Resource Overheads of Repetition Cat Qubits," (2020), arXiv:2009.10756 [quant-ph], pp. 1-17.
M. Mirrahimi, Z. Leghtas, V. V. Albert, S. Touzard, R. J. Schoelkopf, L. Jiang, and M. H. Devoret, "Dynamically Protected Cat-Quibits: A New Paradigm for Universal Quantum Computation," New Journal of Physics 16, 045014 (2014), pp. 1-31.
S. Puri, S. Boutin, and A. Blais, "Engineering the Quantum States of Light in a Kerr-nonlinear Resonator by Two-Photon Driving," NPJ Quantum Inf. 3, 18 (2017), pp. 1-7.
J. Cohen, "Autonomous quantum error correction with superconducting qubits," Ph.D. thesis, Universite Paris sciences et lettres (2017), HAL archives-ouvertes.fr, pp. 1-164.
V. V. Albert, K. Noh, K. Duivenvoorden, D. J. Young, R. T. Brierley, P. Reinhold, C. Vuillot, L. Li, C. Shen, S. M. Girvin, B. M. Terhal, and L. Jiang, "Performance and Structure of Single-Mode Bosonic Codes," Phys. Rev. A 97, 032346 (2018), pp. 1-30.
A. Joshi, K. Noh, and Y. Y. Gao, "Quantum Information Processing with Bosonic Qubits in Circuit QED," arXiv e-prints , arXiv:2008. 13471 (2020), arXiv:2008.13471 [quant-ph], pp. 1-26.
W. Cai, Y. Ma, W. Wang, C. L. Zou, and L. Sun, "Bosonic Quantum Error Correction Codes in Superconducting Quantum Circuits," arXiv e-prints , arXiv:2010.08699 (2020), arXiv:2010.08699 [quant-ph], pp. 1-23.
Z. Leghtas, S. Touzard, I. M. Pop, A. Kou, B. Vlastakis, A. Petrenko, K. M. Sliwa, A. Narla, S. Shankar, M. J. Hatridge, M. Reagor, L. Frunzio, R. J. Schoelkopf, M. Mirrahimi, and M. H. Devoret, "Confining the State of Light to a Quantum Manifold by Engineered Two-Photon Loss," Science 347, 853 (2015), 1412.4633, pp. 853-857.
S. Touzard, A. Grimm, Z. Leghtas, S. Mundhada, P. Reinhold, C. Axline, M. Reagor, K. Chou, J. Blumo, K. Sliwa, and et al., "Coherent Oscillations inside a Quantum Manifold Stabilized by Dissipation," Physical Review X 8, 021005 (2018), arXiv:1705. 02401, pp. 1-7.
S. Puri, A. Grimm, P. Campagne-Ibarcq, A. Eickbusch, K. Noh, G. Roberts, L. Jiang, M. Mirrahimi, M. H. Devoret, and S. M. Girvin, Stabilized Cat in a Driven Nonlinear Cavity: A Fault-Tolerant Error Syndrome Detector, Phys. Rev. X 9, 041009 (2019), pp. 1-29.
A. Grimm, N. E. Frattini, S. Puri, S. O. Mundhada, S. Touzard, M. Mirrahimi, S. M. Girvin, S. Shankar, and M. H. Devoret, "Stabilization and Operation of a Kerr-cat qubit," Nature 584, 205 (2020), arXiv:1907.12131, pp. 1-7.
R. Lescanne, M. Villiers, T. Peronnin, A. Sarlette, M. Delbecq, B. Huard, T. Kontos, M. Mirrahimi, and Z. Leghtas, "Exponential Suppression of bit-flips in a Qubit Encoded in an Oscillator," Nature Physics 16, 509 (2020), pp. 1-18.
F. Mac Williams and N. Sloane, "The Theory of Error-Correcting Codes," Book, (North Holland, 1988), pp. 1-770.
G. S. MacCabe, H. Ren, J. Luo, J. D. Cohen, H. Zhou, A. Sipahigil, M. Mirhosseini, and O. Painter, "Phononic Bandgap Nano-acoustic Cavity with Ultralong Phonon Lifetime," Science 370, 840 (2020), pp. 1-43.
P. Arrangoiz-Arriola, E. A. Wollack, Z. Wang, M. Pechal, W. Jiang, T. P. McKenna, J. D. Witmer, R. Van Laer, and A. H. Safavi-Naeini, "Resolving the energy levels of nanomechanical oscillator," Nature vol. 571, 537 (2019), pp. 1-11.
E. A. Wollack, A. Y. Cleland, P. Arrangoiz-Arriola, T. P. McKenna, R. G. Gruenke, R. N. Patel, W. Jiang, C. J. Sarabalis, and A. H. Safavi-Naeini, "Loss channels affecting lithium niobate phononic crystal resonators at cryogenic temperature," (2020), arXiv:2010. 01025 [physics.appph], pp. 1-15.
S. Bravyi and J. Haah, "Magic-state distillation with low overhead," CORE, Phys. Rev. A 86, 052329 (2012 American Physical Society), pp. 1-10.
A. M. Meier, B. Eastin, and E. Knill, "Magic-State Distillation with the Four-Qubit Code," Quant. Inf. and Comp. 13, 195 (2013), pp. 1-10.
E. T. Campbell and M. Howard, "Magic state parity-checker with pre-distilled components," Quantum 2, 56 (2018), pp. 1-19.
S. Bravyi and A. Kitaev, "Universal Quantum Computation with Ideal Clifford Gates and Noisy Ancillas," CORE, Phys. Rev. A 71, 022316 (2005 American Physical Society), pp. 1-14.
J. P. Paz and W. H. Zurek, "Continuous Error Correction," Proceedings of the Royal Society of London. Series A: Mathematical, Physical and Engineering Sciences 454, pp. 355-364 (1998).
C. Ahn, A. C. Doherty, and A. J. Landahl, "Continuous Quantum Error Correction via Quantum Feedback Control," Phys. Rev. A 65, 042301 (2002), pp. 1-10.
M. Sarovar and G. J. Milburn, "Continuos Quantum Error Correction by Cooling," Phys. Rev. A 72, 012306 (2005), pp. 1-7.
P. T. Cochrane, G. J. Milburn, and W. J. Munro, "Macroscopically Distinct Quantum Superposition States as a Bosonic Code for Amplitude Damping," Phys. Rev. A 59, 2631 (1999), pp. 1-5.
H. Jeong and M. S. Kim, Phys. "Efficient Quantum Computation Using Coherent States," Rev. A 65, 042305 (2002 The American Physical Society), pp. 1-6.
F. Reiter and A. S. Srensen, "Effective Operator Formalism for Open Quantum Systems," Phys. Rev. A 85, 032111 (2012), pp. 1-11.
N. E. Frattini, U. Vool, S. Shankar, A. Narla, K. M. Sliwa, and M. H. Devoret, "3-Wave Mixing Josephson Dipole Element," Applied Physics Letters 110, 222603 (2017), https://doi.org/10.1063/1. 4984142, pp. 1-5.
M. Mirhosseini, A. Sipahigil, M. Kalaee, and O. Painter, "Quantum transduction of optical photons from a superconducting qubit," (2020), arXiv:2004.04838 [quant-ph], pp. 1-17.

(56) References Cited

OTHER PUBLICATIONS

R. Lescanne, L. Verney, Q. Ficheux, M. H. Devoret, B. Huard, M. Mirrahimi, and Z. Leghtas, "Escape of a Driven Quantum Josephson Circuit into Unconfined States," Phys. Rev. Applied 11, 014030 (2019), pp. 1-12.

D. Sank, Z. Chen, M. Khezri, J. Kelly, R. Barends, B. Campbell, Y. Chen, B. Chiaro, A. Dunsworth, A. Fowler, E. Jerey, E. Lucero, A. Megrant, J. Mutus, M. Neeley, C. Neill, P. J. J. O'Malley, C. Quintana, P. Roushan, A. Vainsencher, T. White, J. Wenner, A. N. Korotkov, and J. M. Martinis, "Measurement-Induced State Transitions in a Superconducting Qubit: Beyond the Rotating Wave Approximation," Phys. Rev. Lett. 117, 190503 (2016), pp. 1-10.

Y. Zhang, B. J. Lester, Y. Y. Gao, L. Jiang, R. J. Schoelkopf, and S. M. Girvin, "Engineering Bilinear Mode Coupling in Circuit QED: Theory and Experiment," Phys. Rev. A 99, 012314 (2019 American Physical Society), pp. 1-39.

L. Verney, R. Lescanne, M. H. Devoret, Z. Leghtas, and M. Mirrahimi, "Structural Instability of Driven Josephson Circuits Prevented by an Inductive Shunt," Phys. Rev. Applied 11, 024003 (2019 American Physical Society), pp. 1-12.

D. F. V. James and J. Jerke, Can. J. "Effective Hamiltonian Theory and Its Applications in Quantum Information," Phys. 85, 625 (2007), pp. 1-5.

O. Gamel and D. F. V. James, "Time Averaged Quantum Dynamics and the Validity of the Effective Hamiltonian Model," Phys. Rev. A 82, 052106 (2010), pp. 1-8.

R. K. Naik, N. Leung, S. Chakram, P. Groszkowski, Y. Lu, N. Earnest, D. C. McKay, J. Koch, and D. I. Schuster, "Random Access Quantum Information Processors Using Multimode Circuit Quantum Electrodynamics," Nature Communications 8, 1904 (2017), pp. 1-7.

M. Pechal, P. Arrangoiz-Arriola, and A. H. Safavi-Naeini, "Superconducting Circuit Quantum Computing with Nanomechanical Resonators as Storage," Quantum Science and Technology. 4, 015006 (2018), pp. 1-10.

C. T. Hann, C.-L. Zou, Y. Zhang, Y. Chu, R. J. Schoelkopf, S. M. Girvin, and L. Jiang, "Hardware-Efficient Quantum Random Access Memory with Hybrid Quantum Acoustic Systems," Phys. Rev. Letters 123, 250501 (2019 American Physical Society), pp. 1-7.

P. Mundada, G. Zhang, T. Hazard, and A. Houck, "Suppression of Qubit Crosstalk ina Tunable Coupling Superconducting Circuit," Phys. Rev. Appl. 12, 10.1103/PhysRevApplied.12.054023, pp. 1-11, (2019).

Y. Chen, C. Neill, P. Roushan, N. Leung, M. Fang, R. Barends, J. Kelly, B. Campbell, Z. Chen, B. Chiaro, A. Dunsworth, E. Je rey, A. Megrant, J. Y. Mutus, P. J. J. O'Malley, C. M. Quintana, D. Sank, A. Vainsencher, J. Wenner, T. C. White, M. R. Geller, A. N. Cleland, and J. M. Martinis, "Qubit Architecture with High Coherence and Fast Tunable Coupling," Phys. Rev. Letters 113, 220502 (2014 American Physical Society), pp. 1-5.

L. Sun, A. Petrenko, Z. Leghtas, B. Vlastakis, G. Kirchmair, K. Sliwa, A. Narla, M. Hatridge, S. Shankar, J. Blumo, et al., "Tracking Photon Jumps ith Repeated Quantum Non-Demolition Parity Measurements," Nature 511, 444 (2014), pp. 1-20.

C. T. Hann, S. S. Elder, C. S. Wang, K. Chou, R. J. Schoelkopf, and L. Jiang, "Robust Readout of Bosonic Qubits in the Dispersive Coupling Regime," Phys. Rev. A 98, 022305 (2018 American Physical Society), pp. 1-13.

S. S. Elder, C. S. Wang, P. Reinhold, C. T. Hann, K. S. Chou, B. J. Lester, S. Rosenblum, L. Frunzio, L. Jiang, and R. J. Schoelkopf, "High-Fidelity Measurement of Qubits Encoded in Multilevel Superconducting Circuits," Phys. Rev. X 10, 011001 (2020 American Physical Society), pp. 1-10.

N. Didier, J. Bourassa, and A. Blais, Fast Quantum Nondemolition Readout by Parametric Modulation of Longitudinal Qubit-Oscillator Interaction, Phys. Rev. Letters, 115, 203601 (2015 American Physical Society), pp. 1-5.

A. A. Clerk, M. H. Devoret, S. M. Girvin, F. Marquardt, and R. J. Schoelkopf, "Introduction to Quantum Noise, Measurement and Amplification," Rev. Mod. Phys. 82, 1155 (2010), pp. 1-96.

P. Krantz, M. Kjaergaard, F. Yan, T. P. Orlando, S. Gustavsson, and W. D. Oliver, "A Quantum Engineer's Guide to Superconduction Qubits," Applied Physics Reviews 6, 021318 (2019), pp. 1-58.

Y. Tomita and K. M. Svore, "Low-Distance Surface Codes under Realistic Quantum Noise," Physical Review A 90, 062320 (2014), arXiv preprint: arXiv:1404.3747v1, pp. 1-14.

D. P. DiVincenzo and P. Aliferis, Effective Fault-Tolerant Quantum Computation with Slow Measurements, CORE, Phys. Rev. Letters 98, 020501 (2007), pp. 1-10.

C. Chamberland, P. Iyer, and D. Poulin, "Fault-tolerant Quantum Computing int he Pauli or Clifford Frame with Slow Error Diagnostics," Quantum 2, 43 (2018), pp. 1-11.

J. Kelly, R. Barends, A. G. Fowler, A. Megrant, E. Jeffrey, T. C. White, D. Sank, J. Y. Mutus, B. Campbell, Y. Chen, et al., "State Preservation by Repetitive Error Detection in a Superconducting Quantum Circuit," Nature 519, 66 (2015), pp. 1-30.

C. Horsman, A. G. Fowler, S. Devitt, and R. V. Meter, "Surface Code Quantum Computing by Lattice Surgery," IOP Institute of Physics, New Journal of Physics 14, 123011 (2012), pp. 1-28.

A. J. Landahl and C. Ryan-Anderson, "Quantum Computing by Color-Code Lattice Surgery," arXiv preprint arXiv:1407.5103 (2014), pp. 1-13.

D. Litinski and F. v. Oppen, "Lattice Surgery with a Twist: Simplifying Clifford Gates of Surface Codes," Quantum 2, 62 (2018), arXiv Preprint arXiv:1709.02318v2, pp. 1-16.

D. Litinski, "A Game of Surface Codes: Large-Scale Quantum Computing with Lattice Surgery," Quantum 3, 128 (2019), arXiv Preprint arXiv:1808.02892v3, pp. 1-37.

A. Kubica, B. Yoshida, and F. Pastawski, "Unfolding the Color Code," IOP Institute of Physics, New Journal of Physics 17, 083026 (2015), pp. 1-27.

S. Bravyi, G. Smith, and J. A. Smolin, "Trading Classical and Quantum Computational Resources," Physical Review X 6, 021043 (2016), arXiv Preprint arXiv:1506.01396v1, pp. 1-14.

A. Paler and A. G. Fowler, "OpenSurgery for Topical Assemblies," arXiv preprint arXiv:1906.07994 (2019), pp. 1-4.

A. G. Fowler, M. Mariantoni, J. M. Martinis, and A. N. Cleland, "Surface Codes: Towrads Practical Large-Scale Quantum Computation," Phys. Rev. A 86, 032324 (2012 American Physical Society), pp. 1-48.

A. G. Fowler, "Time-Optimal Quantum Computation," arXiv preprint arXiv:1210.4626 (2012), pp. 1-5.

C. Chamberland and A. W. Cross, "Fault-Tolerant Magic State Preparation with Flag Qubits," Quantum 3, 143 (2019), arXiv preprint arXiv:1811.00566v2, pp. 1-26.

C. Chamberland and K. Noh, "Very Low Overhead Fault-Tolerant Magic State Preparation Using Redundant Ancilla Encoding and Flag Qubits," NPJ Quantum Information 6, 91 (2020), arXiv preprint arXiv:2003.03049v1, pp. 1-27.

J. Haah, M. B. Hastings, D. Poulin, and D. Wecker, Magic State Distillation with Low Space Overhead and Optimal Asymptotic Input Count, Quantum 1, 31 (2017), arXiv preprint arXiv:1703.07847v3), pp. 1-42.

A. Paetznick and B. W. Reichardt, "Universal Fault-Tolerant Quantum Computation with only Transversal Gates and Error Correction," Physical Review Letters 111, 090505 (2013), arXiv preprint arXiv:1304.3709v2, pp. 1-5.

M. Vasmer and D. E. Browne, "Three-Dimensional Surface Codes: Transversal Gates and Fault-Tolerant Architectures," Physical Review A 100, 012312 (2019 American Physical Society), arXiv preprint arXiv:1801.04255, 2018, pp. 1-20.

J. Haah and M. B. Hastings, "Codes and Protocols for Distilling T, Controlled-S, and Toffoli Gates," Quantum 2, 71 (2018), arXiv preprint arXiv:1709.02832v3, pp. 1-29.

D. Litinski, "Magic State Distillation: Not as Costly as You Think," Quantum 3, 205 (2019), arXiv preprint arXiv:1905.06903v3, pp. 1-22.

E. T. Campbell and M. Howard, "Unifying Gate-Synthesis and Magic State Distillation," Physical review letters 118, 060501 (2017), arXiv preprint arXiv:1606.0190v2, pp. 1-5.

N. Wiebe and C. Granade, "Efficient Bayesian Phase Estimation," Phys. Rev. Letters. 117, 010503 (2016), arXiv preprint arXiv:1508.00869v1, pp. 1-12.

(56) References Cited

OTHER PUBLICATIONS

C. Gidney, "Halving the Cost of Quantum Addition," Quantum 2, 74 (2018), arXiv preprint arXiv:1709.06648v3, pp. 1-6.
C. Gidney and A. G. Fowler, "Efficient Magic State Factories with Catalyzed |CCZ>-2|T> Transformation," Quantum 3, 135 (2019), arXiv preprint arXiv:1812.01238v3, pp. 1-24.
S. Bravyi, D. Browne, P. Calpin, E. Campbell, D. Gosset, and M. Howard, "Simulation of Quantum Circuits by Low-Rank Stabilizer Decompositions," Quantum 3, 181 (2019), arXiv preprint arXiv:1808.00128v2, pp. 1-48.
B.-X. Zheng, C.-M. Chung, P. Corboz, G. Ehlers, M.-P. Qin, R. M. Noack, H. Shi, S. R. White, S. Zhang, and G. K.-L. Chan, "Strip Order in the Underdoped Region of the Two-Dimensional Hubbard Model," Science 358, 1155 (2017), arXiv preprint arXiv:1701.00054v2, pp. 1-78.
M. Li, D. Miller, M. Newman, Y. Wu, and K. R. Brown, "2D Compass Codes," Phys. Rev. X 9, 021041 (2019 American Physical Society), pp. 1-11.
C. Chamberland, G. Zhu, T. J. Yoder, J. B. Hertzberg, and A. W. Cross, "Topological and Subsystem Codes on Low-Degree Graphs with Flag Qubits," Phys. Rev. X 10, 011022 (2020), arXiv preprint arXiv:1907.09528v2, pp. 1-21.
D. M. Debroy, M. Li, S. Huang, and K. R. Brown, "Logical Performance of 9 Quibit Compass COdes in Ion Traps with Crosstalk Errors," Quantum Science and Technology 5, 034002 (2020), arXiv preprint arXiv:1910.08495v2, pp. 1-12.
S. Huang and K. R. Brown, "Fault-Tolerant Compass Codes," Phys. Rev. A 101, 042312 (2020 American Physical Society), pp. 1-6.
P. Aliferis, D. Gottesman, and J. Preskill, "Quantum Accuracy Threshold for Concatenated Distance-3 Codes," Quantum Info. Comput. 6, 97 (2006), arXiv preprint arXiv:quant-ph/0504218v2, pp. 1-58.
S. E. Nigg, H. Paik, B. Vlastakis, G. Kirchmair, S. Shankar, L. Frunzio, M. H. Devoret, R. J. Schoelkopf, and S. M. Girvin, "Black-Box Superconducting Circuit Quantization," Phys. Rev. Letters 108, 240502 (2012 American Physical Society), pp. 1-5.

M. Pechal and A. H. Safavi-Naeini, "Millimeter-wave Interconnects for Microwave-Frequency Quantum Machines," Phys. Rev. A 96, 042305 (2017), arXiv preprint arXiv:1706.05368v1, pp. 1-14.
J. M. Kreikebaum, K. P. O'Brien, A. Morvan, and I. Siddiqi, "Improving Wafer-Scale Josephson Junction Resistance Variation in Superconducting Quantum Coherent Circuits," Superconductor Science and Technology 33, 06LT02 (2020), IOP Publishing, pp. 1-7.
V. S. Ferreira, J. Banker, A. Sipahigil, M. H. Matheny, A. J. Keller, E. Kim, M. Mirhosseini, and O. Painter, Collapse and Revival of an Artificial Atom Coupled to a Structured Photonic Reservoir (2020), arXiv:2001.03240 [quant-ph], pp. 1-19.
R. Azouit, A. Sarlette, and P. Rouchon, Adiabatic elimination for open quantum systems with effective Lindblad master equations (2016), arXiv:1603.04630 [quant-ph], pp. 1-9.
R. Azouit, F. Chittaro, A. Sarlette, and P. Rouchon, "Towards Generic Adiabatic Elimination for Bipartite Open Quantum Systems," Quantum Science Technology 2, 044011 (2017 IOP Publishing Ltd.), pp. 1-16.
E. A. Sete, J. M. Martinis, and A. N. Korotkov, "Quantum Theory of a Bandpass Purcell Filter for Qubit Readout," Phys. Rev. A 92, 012325 (2015 American Physical Society), pp. 1-13.
D. F. James and J. Jerke, "Effective Hamiltonian Theory and Its Applications in Quantum Information," Canadian Journal of Physics 85, 625 (2007), https://doi.org/10.1139/p07-060, pp. 1-5.
J. Heinsoo, C. K. Andersen, A. Remm, S. Krinner, T. Walter, Y. Salathe, S. Gasparinetti, J.-C. Besse, A. Potocnik, A. Wallra, and C. Eichler, "Rapid High-Fidelity Multiplexed Readout of Superconducting Qubits," Phys. Rev. Applied 10, 034040 (2018), arXiv prepint: arXiv:1801.07904v1, pp. 1-13.
E. Jeffrey, D. Sank, J. Y. Mutus, T. C. White, J. Kelly, R. Barends, Y. Chen, Z. Chen, B. Chiaro, A. Dunsworth, A. Megrant, P. J. J. O'Malley, C. Neill, P. Roushan, A. Vainsencher, J. Wenner, A. N. Cleland, and J. M. Martinis, "Fast Accurate State Measurement with Superconducting Qubits," Phys. Rev. Letters 112, 190504 (2014 American Physical Society), pp. 1-5.

\* cited by examiner

CROSS-TALK REDUCTION IN FAULT TOLERANT QUANTUM COMPUTING SYSTEM

PRIORITY CLAIM

This application claims benefit of priority to U.S. Provisional Application Ser. No. 63/121,794 entitled "FAULT-TOLERANT QUANTUM COMPUTER", filed Dec. 4, 2020, and which is incorporated herein by reference in its entirety.

BACKGROUND

Quantum computing utilizes the laws of quantum physics to process information. Quantum physics is a theory that describes the behavior of reality at the fundamental level. It is currently the only physical theory that is capable of consistently predicting the behavior of microscopic quantum objects like photons, molecules, atoms, and electrons.

A quantum computer is a device that utilizes quantum mechanics to allow one to write, store, process and read out information encoded in quantum states, e.g. the states of quantum objects. A quantum object is a physical object that behaves according to the laws of quantum physics. The state of a physical object is a description of the object at a given time.

In quantum mechanics, the state of a two-level quantum system, or simply, a qubit, is a list of two complex numbers whose squares sum up to one. Each of the two numbers is called an amplitude, or quasi-probability. The square of an amplitude gives a potentially negative probability. Hence, each of the two numbers correspond to the square root that event zero and event one will happen, respectively. A fundamental and counterintuitive difference between a probabilistic bit (e.g. a traditional zero or one bit) and the qubit is that a probabilistic bit represents a lack of information about a two-level classical system, while a qubit contains maximal information about a two-level quantum system.

Quantum computers are based on such quantum bits (qubits), which may experience the phenomena of "superposition" and "entanglement." Superposition allows a quantum system to be in multiple states at the same time. For example, whereas a classical computer is based on bits that are either zero or one, a qubit may be both zero and one at the same time, with different probabilities assigned to zero and one. Entanglement is a strong correlation between quantum particles, such that the quantum particles are inextricably linked in unison even if separated by great distances.

A quantum algorithm is a reversible transformation acting on qubits in a desired and controlled way, followed by a measurement on one or multiple qubits. For example, if a system has two qubits, a transformation may modify four numbers; with three qubits this becomes eight numbers, and so on. As such, a quantum algorithm acts on a list of numbers exponentially large as dictated by the number of qubits. To implement a transform, the transform may be decomposed into small operations acting on a single qubit, or a set of qubits, as an example. Such small operations may be called quantum gates and the arrangement of the gates to implement a transformation may form a quantum circuit.

There are different types of qubits that may be used in quantum computers, each having different advantages and disadvantages. For example, some quantum computers may include qubits built from superconductors, trapped ions, semiconductors, photonics, etc. Each may experience different levels of interference, errors and decoherence. Also, some may be more useful for generating particular types of quantum circuits or quantum algorithms, while others may be more useful for generating other types of quantum circuits or quantum algorithms. Also, costs, run-times, error rates, availability, etc. may vary across quantum computing technologies.

For some types of quantum computations, such as fault tolerant computation of large scale quantum algorithms, overhead costs for performing such quantum computations may be high. For example for types of quantum gates that are not naturally fault tolerant, the quantum gates may be encoded in error correcting code. However this may add to the overhead number of qubits required to implement the large scale quantum algorithms. Also, performing successive quantum gates, measurement of quantum circuits, etc. may introduce probabilities of errors in the quantum circuits and/or measured results of the quantum circuits.

Figure 1A:
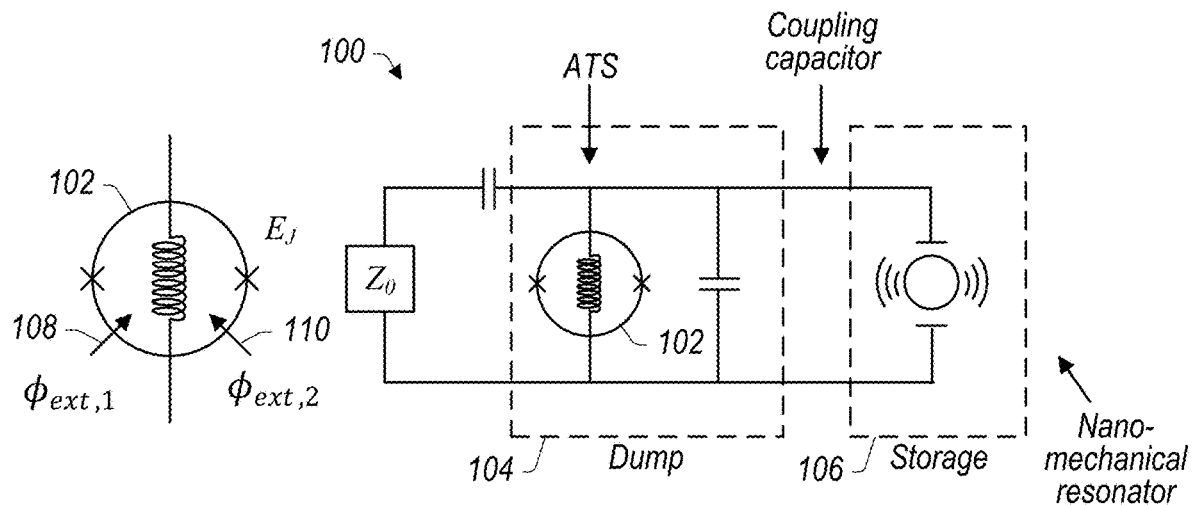
FIG. 1A illustrates a system comprising a nano-mechanical linear resonator and an asymmetrically-threaded superconducting quantum interference device (ATS) that is configured to implement hybrid acoustic-electrical qubits, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION

The present disclosure relates to methods and apparatus for reducing cross talk errors in quantum circuits/quantum algorithms that are fault-tolerant and that efficiently use resources.

In order to perform quantum computations, universal fault-tolerant quantum computers may be required to be built with the capability of implementing all gates from a universal gate set with low logical error rates. Further, the overhead cost for achieving such low error rates may need to be low. In order to achieve fault tolerance, surface codes are often used. However, such surface codes must also be fault tolerant and efficiently use resources.

In some embodiments, efficiently implementing a universal gate set and/or surface codes may involve multiple layers of a quantum computer/quantum algorithm. For example at a lowest layer, building blocks of a quantum computer may include nano-mechanical resonators that are controlled using an asymmetrically-threaded superconducting quantum interference device (asymmetrically-threaded SQUID or ATS). The nano-mechanical resonators may be configured to resonate at one or more frequencies and may be coupled to the ATS, wherein the ATS controls the phonic modes. Also the ATS may be coupled to a bandpass filter and then an open transmission line that enables photons from the ATS to be adsorbed by the environment. At a next level, error correction may be implemented for the quantum computer comprising nano-mechanical resonators and an ATS. For example error corrected codes may be built that utilize the ATS and phononic modes of the nano-mechanical resonators to detect and/or correct errors. At yet another level, gates may be implemented for the quantum computer using the error corrected codes as inputs or outputs to the gates. Also, qubits of the gates may be error corrected. At yet a higher level logical gates may be built that utilize one or more of the physical gates.

In some embodiments, for qubits of a surface code, one or more spurious photon dissipation processes of multiplexed control circuits (e.g. multiplexed ATSs) that control multiple phononic modes for qubits of the surface code that are implemented using multiple ones of the nano-mechanical resonators coupled to the multiplexed control circuit may give rise to cross-talk. Such cross talk may lead to stochastic errors induced by effective dissipators (type I errors), stochastic errors induced by effective Hamiltonians (type II errors), and/or coherent errors induced by effective Hamiltonians (type III errors). In some embodiments, a filter bandpass range of a filter included in the multiplexed control circuit (e.g. multiplexed ATS) may be selected such that type I and type II errors are suppressed. Moreover, strategic selection of phononic mode frequencies and detunings of dump modes of the multiplexed control circuits (e.g. multiplexed ATSs) may effectively suppress type III errors.

In some embodiments, cross talk errors introduced into measurements of stabilizers of a surface code may be corrected when decoding a measurement history using a matching graph and minimum weight perfect matching (MWPM). For example, in some embodiments, additional edges are added to the matching graph to identify and correct for errors introduced due to cross-talk.

Also, in some embodiments, a hybrid Bacon-Shor surface code may be used instead of a traditional surface code. The hybrid Bacon-Shor surface code may only require four phonic modes per given multiplexed control circuit (e.g. four phonic modes coupled to a given multiplexed ATS). This is in comparison to a traditional surface code that couples five phononic modes per multiplexed control circuit (e.g. five phononic modes coupled to a given multiplexed ATS). The reduction in coupling ratio of phononic modes per multiplexed control circuit (e.g. multiplexed ATS) may reduce probabilities of cross talk errors as compared to traditional surface codes.

Asymmetrically Threaded Superconducting Quantum Interference Device (ATS)-Phononic Hybrid System In some embodiments, a circuit for use in a quantum computer may comprise nano-mechanical linear resonators and an asymmetrically threaded superconducting quantum interference device (SQUID, ATS). The nano-mechanical resonators and ATS may implement qubits that are hybrid acoustic-electrical qubits, for example as opposed to electromagnetic qubits. In some embodiments, both the nano-mechanical resonators and ATS may be situated on a same component and may provide for easily extending a system to include additional components with additional nano-mechanical resonators that implement additional hybrid acoustic-electrical qubits. This may also enable scaling of a number of qubits needed for a quantum computer by including more or fewer components. Such an approach may allow for simpler extension and scaling than a system wherein components that implement qubits are integrated into a single chip, and newly designed chips are required to extend or scale the system to have more or fewer qubits. As used herein, the terms "mechanical". "acoustic", "phononic", etc. may be used to describe mechanical circuits as opposed to electromagnetic circuits.

In some embodiments, more phononic resonators (e.g. nano-mechanical resonators) may be connected to a same control circuit, such as an ATS, than is possible for electromagnetic resonators. This is due, at least in part, to the smaller size of the phononic resonators as compared to electromagnetic resonators. However, in such systems crosstalk between the phononic resonators coupled to the same control circuit must be addressed in order to avoid errors. Multiplexed control of phononic resonators using a common control circuit, such as an ATS, is further discussed in detail below.

In some embodiments, a structure of a chip comprising phononic resonators may take the form of a planar circuit with metal components that form superconducting circuits, such as the ATS. The ATS may be physically connected via wire leads to very small (e.g. micron-sized or nano-sized) suspended mechanical devices, such as a linear nano-mechanical resonator. The suspended mechanical devices may be located on a same chip with the ATS circuit or may by located on a separate chip that has been heterogeneously integrated via a flip chip, or similar component, with a bottom chip comprising the ATS and/or additional suspended mechanical devices, e.g. other mechanical resonators.

In some embodiments, electrical connections to the ATS may be laid on top of a piezoelectric material that has been etched into a pattern to form the nano-mechanical resonators. In some embodiments, different variables, such as piezoelectric coefficient, density, etc. may affect how strongly coupled the ATS is to the mechanical resonators. This coupling may be expressed in terms of a phonon coupling rate in the Hamiltonian for the system.

When coupling a nano-structure, such as a nano-mechanical resonator, to an electrical circuit, very small capacitors are required since the nano-structure components, e.g. nano-mechanical resonators, are also very small. Typically in an electrical circuit, such as an ATS circuit, there are other capacitances. Since the capacitor for the nano-structure is very small, these other capacitances in the circuit may lower the signal voltage and thus dilute a signal directed to one of the nano-components, such as a nano-mechanical resonator. However, to deal with this issue, a high-impedance inductor may be coupled in the control circuit between the ATS and the nano-mechanical resonator. The high-impedance inductor may have a very low parasitic capacitance, thus electrical fields directed at the nano-mechanical resonators may act on the nano-mechanical resonators with only minimal dilution due to capacitance of the inductor (e.g. parasitic capacitance). Also, the high impedance inductor may suppress loss mechanisms.

In some embodiments, the non-linear coupling of the nano-mechanical resonators may be given by $g_2 \hat{a}^2 \hat{b}^\dagger$+h.c., where $g_2$ is a coupling rate between a storage mode (a) and a dump mode (b). In some embodiments, the non-linearity may be implemented using an asymmetrically threaded SQUID (superconducting quantum interference device), also referred to herein as an "ATS." The ATS may comprise a superconducting quantum interference device (SQUID) that has been split approximately in the middle by a linear inductor. In its most general form, the ATS potential is given by the following equation:

$$U(\hat{\phi}) = \tfrac{1}{2} E_{L,b} \hat{\phi}^2 - 2E_j \cos(\phi_\Sigma)\cos(\hat{\phi}+\phi_\Delta) + 2\Delta E_j \sin(\phi_\Sigma)\sin(\hat{\phi}+\phi_\Delta)$$

In the above equation, $\hat{\phi}$ is the phase difference across the ATS, $\phi_\Sigma := (\phi_{ext,1}+\phi_{ext,2})/2$, $\phi_\Delta := (\phi_{ext,1}-\phi_{ext,2})/2$, and $\phi_{ext,1}$ ($\phi_{ext,2}$) is the magnetic flux threading the left (right) loop, in units of the reduced magnetic flux quantum $\Phi_0^2 = h/2E$. Here $E_{L,b} = \Phi_0^2/L_b$; $E_j = (E_{j,1}+E_{j,2})/2$; and $$\Delta E_j = \frac{(E_{j,1} - E_{j,2})}{2}$$

is the junction asymmetry. This ATS potential can be further simplified by tuning $\phi_\Sigma$ and $\phi_\Delta$ with two separate flux lines. For example, FIG. 1A illustrates ATS 102 included in control circuit 100, wherein ATS 102 includes separate flux lines 108 and 110. Note that FIG. 1A includes ATS 102 in control circuit 100 and also an enlarged depiction of ATS 102 adjacent to control circuit 102 that shows ATS 102 in more detail. The flux lines may be set such that:

$$\phi_\Sigma = \frac{\pi}{2} + \epsilon_p(t) \text{ and}$$

$$\phi_\Delta = \frac{\pi}{2}$$

In the above equations, $\epsilon_p(t) = \epsilon_{p,0} \cos(\omega_p t)$ is a small alternating current (AC) component added on top of the direct current (DC) basis. At this bias point, and assuming that $|\epsilon_p(t)| \ll 1$ then the equation above for $U(\hat{\phi})$ can be reduced to:

$$U(\hat{\phi}) = \tfrac{1}{2} E_{L,b} \hat{\phi}^2 - 2E_j \epsilon_p(t)\sin(\hat{\phi}) + 2\Delta E_j \cos(\hat{\phi}).$$

Figure 1B:
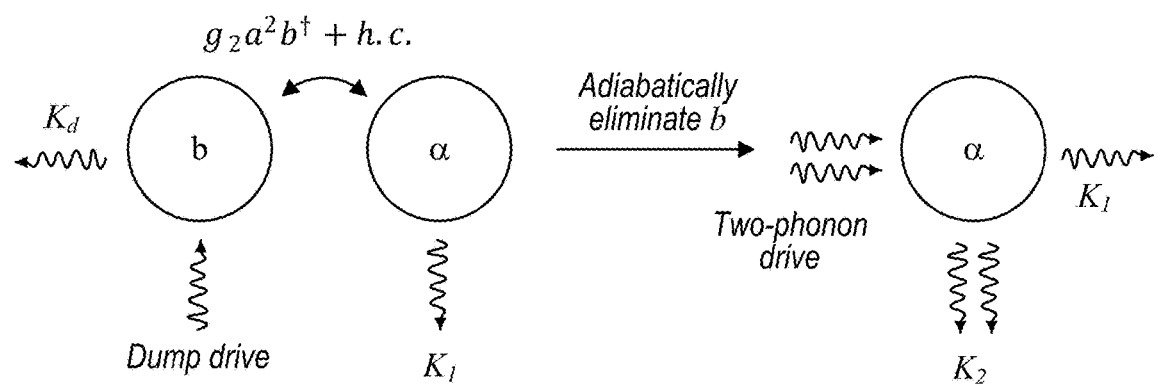
FIG. 1B illustrates a modelling of a storage mode (a) and a dump mode (b) of a hybrid acoustic-electrical qubit, wherein for large energy decay rates ($K_b$) that are significantly larger than a two-phonon coupling rate ($g_2$) the dump mode can be adiabatically eliminated, such that the hybrid acoustic-electrical qubit can be modeled as having a single phonon decay rate ($K_1$) and being driven by a two phonon drive having a two-phonon decay rate ($K_2$), according to some embodiments.

Using the control circuit 100 shown in FIG. 1A, quantum information may be stored in a state of a linear mechanical resonator. For example quantum information may be stored in storage mode 106. The stored quantum information may also be autonomously error corrected by way of artificially induced two-phonon driving and two-phonon decay controlled by the ATS. These two phonon processes are induced through the non-linear interaction $g_2 \hat{a}^2 \hat{b}^\dagger$+h.c. between the storage mode a and an ancillary mode b, called the dump, such as dump mode 104 shown in FIG. 1A. The dump mode is designed to have a large energy decay rate $K_d$ so that it rapidly and irreversibly "dumps" the photons it contains into the environment. If $K_d$ is much larger (e.g. ~10× or more) than the coupling rate $g_2$, then the dump mode can be adiabatically eliminated from the Hamiltonian, for example as shown in FIG. 1B. For example, as shown on the right side of FIG. 1B, the emission of phonon pairs via $g_2 \hat{a}^2 \hat{b}^\dagger$ can be accurately modeled as a dissipative process described by a dissipator $\sim D[a^2]$. Additionally, if the dump mode is linearly driven as $\epsilon^* b e^{-\omega_d t}$+h.c. this provides the required energy to stimulate the reverse process $g^*_2 (a^{+2})b$, which in the adiabatic elimination, as shown in FIG. 1B, can be modeled as an effective two-phonon drive. Altogether, the dynamics can be accurately modeled through the equation:

$$\frac{d\rho}{dt} = K_2 D[a^2 - \alpha^2], \text{ where } \alpha = \epsilon/g_2 \text{ and } k_2 = 4g_2^2/K_d$$

The steady states of the dynamics of the system shown in FIG. 1B are the coherent states $|\alpha\rangle$, $|-\alpha\rangle$, or any arbitrary superposition of the two. This protected subspace can be used to encode a qubit through the following definition of a logical basis: $|0_L\rangle = |\alpha\rangle$, $|1_L\rangle = |-\alpha\rangle$. Qubits encoded in this way are effectively protected from X errors (e.g. bit flips) because the bit-flip rate decays exponentially with the code distance $|\alpha|^2$, as long as $K_2|\alpha|^2 \gg K_1$, wherein $K_1$ is the ordinary (e.g. single-photon) decay rate of the storage mode. Since $|\alpha|^2 \sim 1$, this condition is generally equivalent to $K_2/K_1 \gg 1$. However, Z errors (e.g. phase flips) may not be protected by this code.

As discussed above, an ATS is formed by splitting a SQUID with a linear inductor. The magnetic flux threading of each of the two resulting loops of the ATS can be controlled via two nearby on-chip flux lines, such as flux lines 108 and 110 shown in FIG. 1A. These flux lines can be tuned to appropriate values and can send radio frequency (rf) signals at appropriate frequencies for a desired non-linear interaction to be resonantly activated in the nano-mechanical resonator. The dump mode 104, may further be strongly coupled to a dump line of characteristic impedance $Z_0$, which induces a large energy decay rate as required.

In some embodiments, the nano-mechanical storage resonator (e.g. storage 106) may be a piezoelectric nano-mechanical resonator that supports resonances in the GHz range. These resonances may be coupled to superconducting circuits of the control circuit 100 via small superconducting electrodes (e.g. terminals) that either directly touch or closely approach the vibrating piezoelectric region of the nano-mechanical resonators. The values of the nonlinear coupling rate $g_2$, the two-phonon dissipation rate $k_2$, and the ratio $K_2/K_1$ can be calculated as follows:

First, compute the admittance $Y_m(\omega)$ seen at the terminals of the nano-mechanical resonator using a finite element model solver. Next, find an equivalent circuit using a Foster synthesis algorithm (further discussed below). Then, diagonalize the combined circuit and compute the zero-point phase fluctuations $\phi_{a,zp}$ and $\phi_{b,zp}$. Furthermore, compute the dissipation rates $k_b$ and $k_1$ of the eigenmodes. Next compute $$g_2 = \left(\frac{E_j}{\hbar}\right) \epsilon_0 \phi_{a,zp}^2 \phi_{b,zp}^2 / 2. \text{ Also, compute } k_2 = 4g_2^2/k_d.$$

In some embodiments, a nano-mechanical element, such as the nano-mechanical resonator that implements storage mode 106 and dump mode 104 may be represented as an equivalent circuit that accurately captures its linear response. This can be done using Foster synthesis if the admittance $Y_m(\omega)$ seen from the terminals of the mechanical resonator is known. For example, the admittance may be computed using finite element modeling. In some embodiments, a Foster network may be used to accurately represent a one-dimensional (e.g. linear) phononic-crystal-defect resonator (PCDR), which may be a type of nano-mechanical resonator used in some embodiments. In some embodiments, the dump resonator may be modeled as having a fixed impedance, such as 1 kilo ohms.

Figure 2:
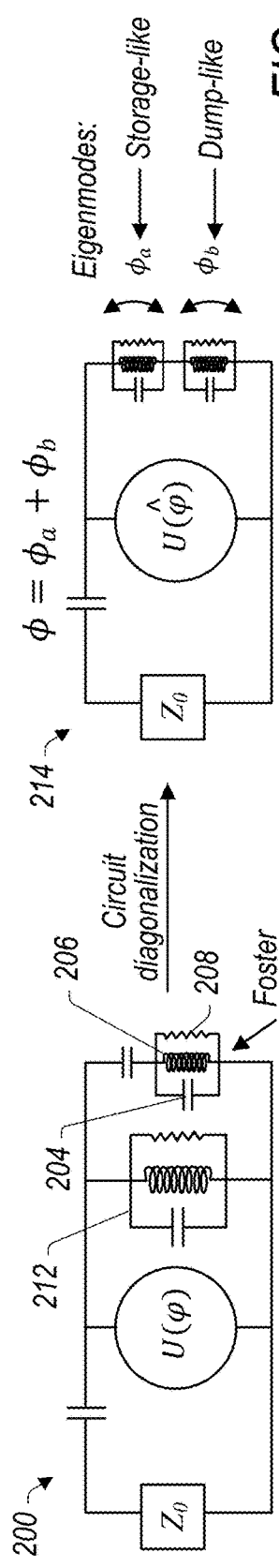
FIG. 2 illustrates a Foster network representing a one dimensional phononic-crystal-defect resonator (PCDR), according to some embodiments.

For example FIG. 2 illustrates a version of control circuit 100 that has been represented using a Foster network (e.g. equivalent circuit 200). In its simplest form, equivalent circuit 200 may be represented as 'a DC capacitance' in series with an LC block (e.g. L represents an inductor and C represents a capacitor for the LC block), wherein an additional resistor is inserted to include the effects of the loss in the resonator. For example, Foster network 210 is modeled to include capacitor 204, inductor 206, and resistor 208. The linear part of the dump resonator (including the inductor that splits the ATS) can also be represented as an LC block, such as LC block 212. In this representation the dump resonator (e.g. 212) and the storage resonator (e.g. 210) are represented as two linear circuits with a linear coupling and can therefore be diagnolized by a simple transformation of coordinates. For example, FIG. 2 illustrates a diagnolized circuit representation 214. The resulting "storage-like" (â) and "dump-like" (b̂) eigenmodes both contribute to the total phase drop across the ATS. For example, $\hat{\phi}=\varphi_a$, $(\hat{a}+\hat{a}^\dagger)+\varphi_b(\hat{b}+\hat{b}^\dagger)$. These modes therefore mix the via the ATS potential, which may be redefined as $U(\hat{\phi}) \rightarrow U(\hat{\phi})-E_{L,b}\hat{\varphi}^2/2$ because the inductor has already been absorbed into the linear network. The zero-point phase fluctuations of each mode are given by:

$$\varphi_{k,j} = \sqrt{\frac{\hbar}{2\omega_k}} (C^{-1/2} U)_{jk}$$

In the above equation C is the Maxwell capacitance matrix of the circuit. U is the orthogonal matrix that diagnolizes $C^{-1/2} L^{-1} C^{-1/2}$, where $L^{-1}$ is the inverse inductance matrix. The index $k \in \{a,b\}$ labels the mode and j labels the node in question. Note that in some instances as described herein the notation of j may be omitted because it is clear from context, e.g. the node of interest is the one right above the ATS.

The way in which the ATS mixes the modes is explicit given the third-order term in the Taylor series expansion of the $\sin(\hat{\phi})$ contains terms of the form $\hat{a}^2\hat{b}^\dagger$+h.c., which is the required coupling. This is a reason for using the ATS as opposed to an ordinary junction, which has a potential ~$\cos(\hat{\phi})$.

For analysis the pump and drive frequencies may be set to $\omega_p=2\omega_a-\omega_b$ and $\omega_d=\omega_b$. This brings the terms $g_2\hat{a}^2\hat{b}^\dagger$+h.c. into resonance and allows the other terms in the rotating wave approximation (RWA) to be dropped. The coupling is given by $g_2=\epsilon_0 E_j \varphi_a^2 \varphi_b/2\hbar$. Additionally, a linear drive $\epsilon^*_d \hat{b}$+h.c. at frequency $\omega_d=\omega_b$ is added to supply the required energy for the two-photon drive.

Multi-Mode Stabilization/ATS Multiplexing

In some embodiments, the scheme as described above may be extended to be used in a multi-mode setting, in which N>1 storage resonators are simultaneously coupled to a single dump +ATS (e.g. multiplexed control circuit). This may allow for the cat subspaces of each of the storage modes to be stabilized individually. For example, a dissipator of the form $\Sigma_n D[a_n^2 - \alpha^2]$. However, in order to avoid simultaneous or coherent loss of phonons from different modes (which fails to stabilize the desired subspaces), an incoherent dissipator is required. This can be achieved if the stabilization pumps and the drives for the different modes are purposefully detuned as follows:

$$H = \Sigma_m (\Sigma_m (\epsilon^{*(d)}_m(t) \hat{b}^\dagger + h.c.) + \Sigma_{m,i,j} (g^{*(m)}_{ij}(t) a_i a_j \hat{b}^\dagger + h.c.), \text{ where } \epsilon^{*(d)}_m(t) = \epsilon^{*(d)}_m e^{i\Delta_m t} \text{ and } g^{*(m)}_{ij}(t) = g^*_2 e^{i(2\omega_m - \omega_i + \Delta_m)t}$$

In the above equation $\omega_m^{(p)}=2\omega_m-\omega_b+\Delta_m$ and $\omega_m^{(d)}=\omega_b-\Delta_m$ are the pump and drive frequencies for mode m. By detuning the pumps, the pump operators of different modes can rotate with respect to each other. If the rotation rate is larger than $k_2$ then the coherences of the form $a_i^2 \rho (a_j^\dagger)^2$ in the Lindbladian vanish in a time averaged sense. The drive de-tunings allow the pumps and drives to remain synchronized even though the pumps have been detuned relative to one another.

In some embodiments, the modes $a_1$ and $a_2$ may be simultaneously stabilized using a multiplexed ATS (e.g. multiplexed control circuit), wherein the pumps have been detuned. Simulations may be performed to determine the detuning parameters using the simulated master equation, as an example:

$$\dot{\rho} = -i \left[ \frac{\Delta}{2} a_1^\dagger a_1 + \left( \epsilon_2 e^{i\Delta t} a_1^{\dagger 2} + \epsilon_2 a_2^{\dagger 2} + h.c. \right), \rho \right] + k_2 D[a_1^2 + a_2^2](\rho)$$

Bandwidth Limits

The above described tuning works best when the detuning $\Delta$ is relatively small as compared to $k_b$. This is due to the fact that, unlike the single-mode case, where $k_2 = 4g_2^2/k_b$, the two-phonon decay of the multi-mode system is given by:

$$k_{2,n} = \frac{4|g|^2}{k_b} \frac{1}{1 + 4(\Delta_n/k_b)^2}$$

The Lorentzian suppression factor can be understood by the fact that photons/phonons emitted by the dump mode as a result of stabilizing mode n are emitted at a frequency $\omega_b + \Delta_n$ and are therefore "filtered" by the Lorentzian lineshape of the dump mode which has linewidth $k_b$. This sets an upper bound on the size of the frequency region that the de-tunings are allowed to occupy. Furthermore, in some embodiments, the de-tunings $\Delta_n$ may all be different from each other by amount greater than $k_2$ in order for the dissipation to be incoherent. In a frequency domain picture, the spectral lines associated with emission of photons/phonons out of the dump must all be resolved. This, also sets a lower bound on the proximity of different tunings. As such, since an upper bound and lower bound are set, bandwidth limits for the de-tunings may be determined. Also, taking into account these limitations, an upper bound on the number of modes that can be simultaneously stabilized by a single dump can also be determined. For example, if de-tunings are selected to be $\Delta_n=n\Delta$, with $\Delta \sim k_2$, then the maximum number of modes that may be simultaneously stabilized may be limited as $N_{max} \sim k_b/\Delta \sim k_b/k_2$. As a further example, for typical parameters, such as $k_b/2\pi \sim 10$ MHz and $k_2/2\pi \sim 1$ MHz, this results in bandwidth limits that allow for approximately 10 modes to be simultaneously stabilized.

Figure 3:
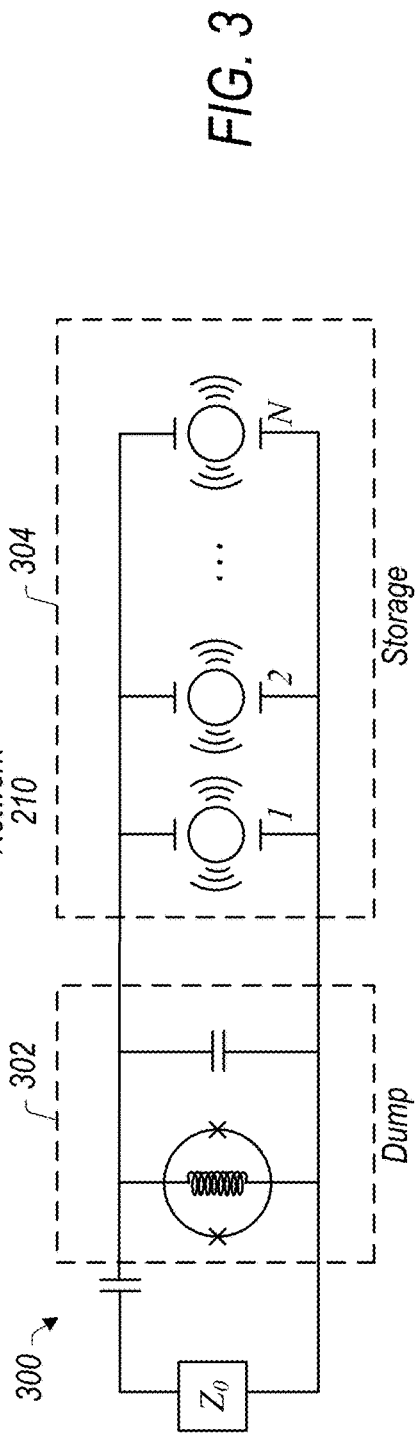
FIG. 3 illustrates a system comprising a plurality of nano-mechanical linear resonators and an asymmetrically-threaded superconducting quantum interference device (ATS) that is configured to provide multi-mode stabilization to hybrid acoustic-electrical qubits implemented via the plurality of nano-mechanical linear resonators, according to some embodiments.

For example, FIG. 3 illustrates a control circuit 300 that includes a single dump resonator 302 that stabilizes multiple storage resonators 304.

Use of a High-Impedance Inductor to Enhance Coupling Between a Dump Resonator and One or More Storage Resonators In some embodiments, the coupling rate $g_2$ may be increased by using a high impedance inductor. This is because $g_2$ depends strongly on the effective impedance $Z_d$ of the dump resonator. For example, $g_2 \sim Z_d^{5/2}$. Thus, in some embodiments, using a large inductor in the ATS may result in a large effective impedance $Z_d$. In some embodiments, the inductor chosen to be included in the ATS circuit may be sufficiently linear to ensure stability of the dump circuit when driven strongly during stabilization. For example, a high impedance inductor used may comprise a planar meander or double-spiral inductor, a spiral inductor with air bridges, an array with a large number of (e.g. greater than 50) highly transparent Josephson junction, or other suitable high impedance inductor.

Filtering in Multi-Mode Stabilization/Multiplexed ATS

Figure 4:
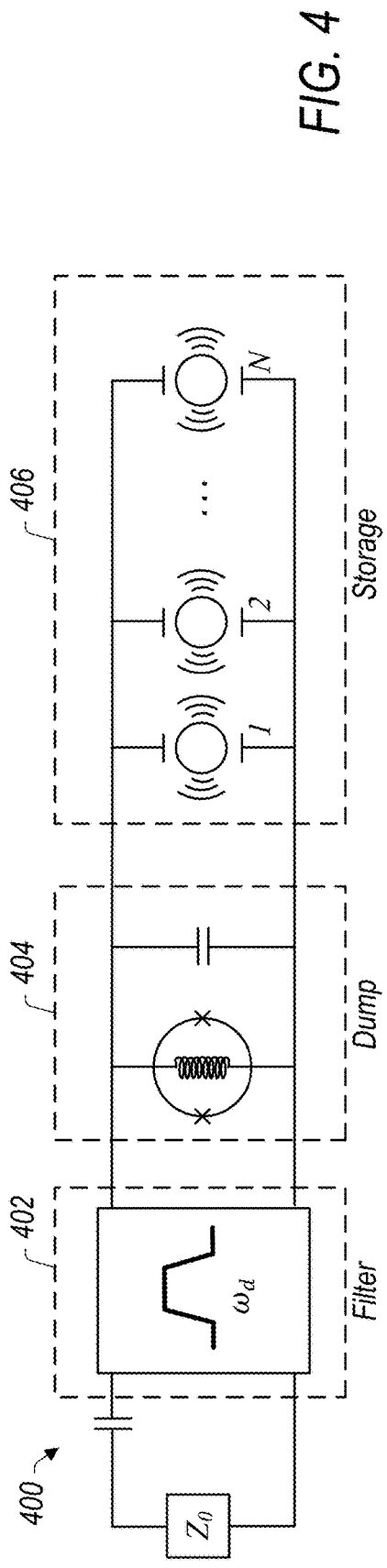
FIG. 4 illustrates a system comprising a plurality of nano-mechanical linear resonators and an asymmetrically-threaded superconducting quantum interference device (ATS) that is configured to provide multi-mode stabilization to hybrid acoustic-electrical qubits implemented via the plurality of nano-mechanical linear resonators, wherein a microwave filter suppresses correlated decay processes, according to some embodiments.

In some embodiments, microwave filters (e.g. metamaterial waveguides) may be used to alleviate the limitations with regard to bandwidth limits as discussed above. Such filters may also be used to eliminate correlated errors in multiplexed stabilization embodiments. For example, FIG. 4 illustrates control circuit 400 that includes a single dump resonator 404, multiple storage resonators 406, and a filter 402.

More specifically, when stabilizing multiple storage modes with the same dump resonator and ATS device a number of cross-terms appear in the Hamiltonian that would otherwise not be there in the single-mode case. For example, these terms take the form of $g_2 a_j a_k b^+ e^{-ivt}$. After adiabatic elimination of the b mode (for example as discussed in regard to FIG. 1B), these terms effectively become jump operators of the form $k_{2,eff} a_j a_k e^{-ivt}$. Unlike the desired jump processes $k_2, a_j^2$, which result in the individual stabilization of the cat subspace of each resonator, the correlated decay terms result in simultaneous phase flips of the resonators j and k. For example, these correlated errors can be damaging to the next layer of error correction, such as in a repetition or striped surface code.

In some embodiments, in order to filter out the unwanted terms in the physical Hamiltonian that give rise to effective dissipators that cause correlated phase flips, the de-tunings of the unwanted terms may be larger than half the filter bandwidth. This may result in an exponential suppression of the unwanted terms. Said another way, the de-tunings and filter may be selected such that detuning of the effective Hamiltonian is larger than half the filter bandwidth. Moreover, the filter mode (along with the dump mode) may be adiabatically eliminated from the model in a similar manner as discussed in FIG. 1B for the adiabatic elimination of the dump mode. This may be used to determine an effective dissipator for a circuit such as control circuit 400 that includes both dump resonator 404 and filter 402.

As discussed above, correlated phase errors may be suppressed by a filter if the corresponding emitted photons have frequencies outside of the filter pass bandwidth. In some embodiments, all correlated phase errors may be simultaneously suppressed by carefully choosing the frequencies of the storage modes. For example cost functions may be used taking into account a filter bandwidth to determine optimized storage frequencies. For example, in some embodiments a single ATS/dump may be used to suppress decoherence associated with all effective Hamiltonians for 5 storage modes. In such embodiments, all dominant sources of stochastic, correlated phase errors in the cat qubits may be suppressed. Cross talk suppression via selection of filter passband ranges and strategic selection of phononic mode frequencies and dump mode detunings is further discussed in detail below.

Multi-Terminal Mechanical Resonators

In some embodiments, nano-mechanical resonators, such as those shown in FIGS. 1-4 may be designed with multiple terminals that allow a given nano-mechanical resonator to be coupled with more than one ATS/control circuit. For example a single connection ATS may include a ground terminal and a signal terminal, wherein the signal terminal couples with a control circuit comprising an ATS. In some embodiments, a multi-terminal nano-mechanical resonator may include more than one signal terminal that allows the nano-mechanical resonator to be coupled with more than one control circuit/more than one ATS. For example, in some embodiments, a nano-mechanical resonator may include three or more terminals that enable the nano-mechanical resonator to be coupled with three or more ATSs. If not needed an extra terminal could be coupled to ground, such that the multi-terminal nano-mechanical resonator functions like a single (or fewer) connection nano-mechanical resonator. In some embodiments, different signal terminals of a same nano-mechanical resonator may be coupled with different ATSs, wherein the ATSs may be used to implement gates between mechanical resonators, such as a CNOT gate. For example, this may allow for implementation of gates on the stabilizer function.

Example Physical Gate Implementations

Recall the Hamiltonian of a system comprising of multiple phononic modes $\hat{a}_k$ coupled to a shared ATS mode $\hat{b}$:

$$\hat{H} = \sum_{k=1}^{N} \omega_k \hat{a}_k^\dagger \hat{a}_k + \omega_b \hat{b}^\dagger \hat{b} - 2E_J \epsilon_p(t) \sin\left(\sum_{k=1}^{N} \hat{\phi}_k + \hat{\phi}_b\right)$$

wherein $\hat{\phi}_k \equiv \varphi_k(\hat{a}_k + \hat{a}_k^\dagger)$ and $\hat{\phi}_b \equiv \varphi_b(\hat{b} + \hat{b}^\dagger)$. Also, $\varphi_k$ and $\varphi_b$ quantify zero-point fluctuations of the modes $\hat{a}_k$ and $\hat{b}$. To simplify the discussion, neglect small frequency shifts due to the pump $\epsilon_p(t)$ for the moment and assume that the frequency of a mode is given by its bare frequency (in practice, however, the frequency shifts need to be taken into account; see below for the frequency shift due to pump). Then, in the rotating frame where every mode rotates with its own frequency, the following is obtained:

$$\hat{H}_{rot} = -2E_J \epsilon_p(t) \sin\left(\sum_{k=1}^{N} \varphi_k \hat{a}_k e^{-\omega_k t} + h.c. + \varphi_b \hat{b} e^{-\omega_b t} + h.c.\right)$$

where $\varphi_k$ and $\varphi_b$ quantify zero-point fluctuations of the modes $\hat{a}_k$ and $\hat{b}$. Note that the rotating frame has been used where each mode rotates with its own frequency.

First, a linear drive on a phononic mode, say $\hat{a}_k$, can be readily realized by using a pump $\epsilon_p(t) = \epsilon_p \cos(\omega_p t)$ and choosing the pump frequency $\omega_p$ to be the frequency of the mode that is to be drive, that is, $\omega_p = \omega_k$. Then, by taking only the leading order linear term in the sine potential (e.g., $\sin(\hat{x}) \cong \hat{x}$ we get the desired linear drive:

$$\hat{H}_{rot} = 2E_J \epsilon_p \varphi_k (\hat{a}_k + \hat{a}_k^\dagger) + H'$$

where H' comprises fast-oscillating terms such as $-E_J \epsilon_p (\varphi_l \hat{a}_l e^{-i(\omega_l - \omega_k)t} + h.c.)$ with $l \neq k$ and $E_J \epsilon_p (\varphi_b \hat{b} e^{-i(\omega_b - \omega_k)t} + h.c.)$ as well as other terms that rotate even faster. Since the frequency differences between different modes are on the order of 100 MHz but $|\epsilon_z|/(2\pi)$ is typically much smaller than 100 MHz, the faster oscillating terms can be ignored using a rotating wave approximation (RWA).

To avoid driving unwanted higher order terms, one may alternatively drive the phononic mode directly, at the expense of increased hardware complexity, instead of using the pump $\epsilon_p(t)$ at the ATS node.

Now moving on to the implementation of the compensating Hamiltonian for a CNOT gate. For example a compensating Hamiltonian for a CNOT gate may have the form:

$$\hat{H}_{CNOT} = \frac{\pi}{4\alpha T}(\hat{a}_1 + \hat{a}_1^\dagger - 2\alpha)(\hat{a}_2^\dagger \hat{a}_2 - \alpha^2)$$

Without loss of generality, consider the CNOT gate between the modes $\hat{a}_1$ (control) and $\hat{a}_2$ (target). Note that $\hat{H}_{CNOT}$ comprises an optomechanical coupling $$\frac{\pi}{4\alpha T}(\hat{a}_1 + \hat{a}_1^\dagger)\hat{a}_2^\dagger \hat{a}_2$$

between two phononic modes, a linear drive on the control mode $$-\left(\frac{\pi\alpha}{4T}\right)(\hat{a}_1 + \hat{a}_1^\dagger),$$

and a selective frequency shift of the target mode $$-\left(\frac{\pi}{2T}\right)\hat{a}_2^\dagger \hat{a}_2.$$

To realize the optomechanical coupling, one might be tempted to directly drive the cubic term $\hat{a}_1 \hat{a}_2^\dagger \hat{a}_2$+h.c. in the sine potential via a pump $\epsilon_p(t)=\epsilon_p \cos(\omega_p t)$. However, the direct driving scheme is not suitable for a couple of reasons: since the term $\hat{a}_1 \hat{a}_2^\dagger \hat{a}_2$ rotates with frequency $\omega_1$, the required pump frequency is given by $\omega_p=\omega_1$ which is the same pump frequency reserved to engineer a linear drive on the $\hat{a}_1$ mode. Moreover, the term $\hat{a}_1 \hat{a}^\dagger \hat{a}_2$ rotates at the same frequency as those of undesired cubic terms. Hence, even if the linear drive is realized by directly driving the phononic mode $\hat{a}_1$, one cannot selectively drive the desired optomechanical coupling by using the pump frequency $\omega_p=\omega_1$ due to the frequency collision with the other cubic terms.

In some embodiments, to overcome these frequency collision issues, the optomechanical coupling is realized by off-resonantly driving the term $(\hat{a}_1+\lambda)\hat{a}_2 \hat{b}^\dagger$. For example, we use fact that a time-dependent Hamiltonian $\hat{H}=\lambda \hat{A}\hat{b}^\dagger e^{i\Delta t}$ yields an effective Hamiltonian $\hat{H}_{eff}=(x^2/\Delta)\hat{A}^\dagger \hat{A}$ upon time-averaging assuming that the population of the $\hat{b}$ mode is small (e.g. $\hat{b}^\dagger \hat{b} \ll 1$) and the detuning $\Delta$ is sufficiently large. Hence given a Hamiltonian $\hat{H}=x(\hat{a}_1+\lambda)\hat{a}_2 \hat{b}^\dagger e^{-\Delta t}$+h.c., we get $$\hat{H}_{eff} = \frac{x^2 \lambda}{\Delta}\left(\hat{a}_1 + \hat{a}_1^\dagger + \lambda + \frac{1}{\lambda}\hat{a}_1^\dagger \hat{a}_1\right)\hat{a}_2^\dagger \hat{a}_2$$

In particular, by choosing $\Delta=-2\alpha$, we can realize the optomechanical coupling as well as the selective frequency shift of the $\hat{a}_2$ mode, e.g. $\hat{H}_{eff} \propto (\hat{a}_1+\hat{a}_1^\dagger-2\alpha)\hat{a}_2^\dagger \hat{a}_2$ up to an undesired cross-Ker term $-\hat{a}_1^\dagger \hat{a}_1 \hat{a}_2^\dagger \hat{a}_2/(2\alpha)$. In this scheme, we have the desired selectivity because the term $(\hat{a}_1+\lambda)\hat{a}_2 \hat{b}^\dagger$ is detuned from other undesired terms such as $(\hat{a}_1+\lambda)\hat{a}_k \hat{b}^\dagger$ with $k \geq 3$ by a frequency difference $\omega_2-\omega_k$. Thus, the unwanted optomechanical coupling $(\hat{a}_1+\hat{a}_1^\dagger)\hat{a}_k^\dagger \hat{a}_2$ can be suppressed by a suitable choice of the detuning $\Delta$. It is remarked that the unwanted cross-Kerr term $\hat{a}_1^\dagger \hat{a}_1 \hat{a}_2^\dagger \hat{a}_2$ can in principle be compensated by off-resonantly driving another cubic term $\hat{a}_1 \hat{a}_2 \hat{b}^\dagger$ with a different detuning $\Delta' \neq \Delta$.

Lastly, similar approaches as used in the compensating Hamiltonian for the CNOT gate can also be used for a compensating Hamiltonian for a Toffoli gate.

Example Processes for Implementing an ATS-Phononic Hybrid System

Figure 5:
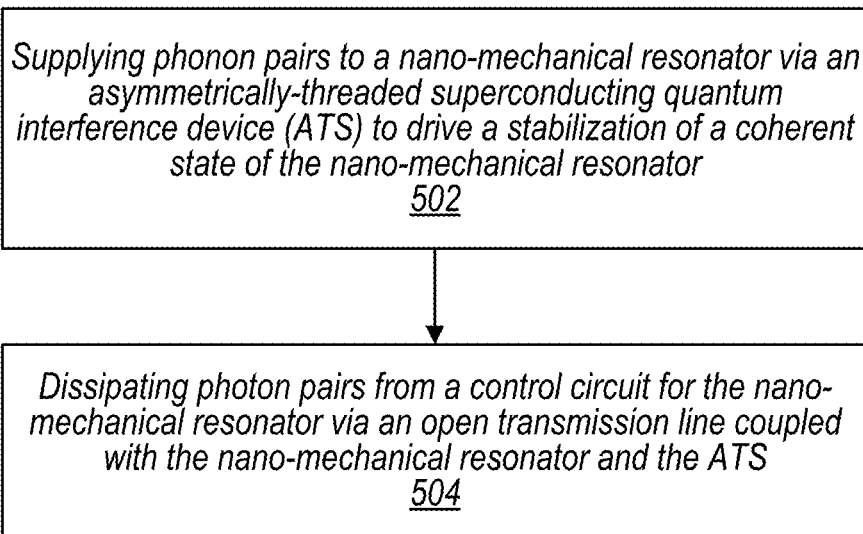
FIG. 5 illustrates a process of stabilizing a nano-mechanical resonator using an asymmetrically-threaded superconducting quantum interference device (ATS), according to some embodiments.

FIG. 5 illustrates a process of stabilizing a nano-mechanical resonator using an asymmetrically-threaded superconducting quantum interference device (ATS), according to some embodiments.

At block 502, a control circuit of a system comprising one or more nano-mechanical resonators causes phonon pairs to be supplied to the nano-mechanical resonator via an ATS to drive a stabilization of a storage mode of the nano-mechanical resonator such that the storage mode is maintained in a coherent state. Also, at block 504, the control circuit dissipates phonon/photon pairs from the nano-mechanical resonator via an open transmission line of the control circuit that is coupled with the nano-mechanical resonator and the ATS.

Figure 6:
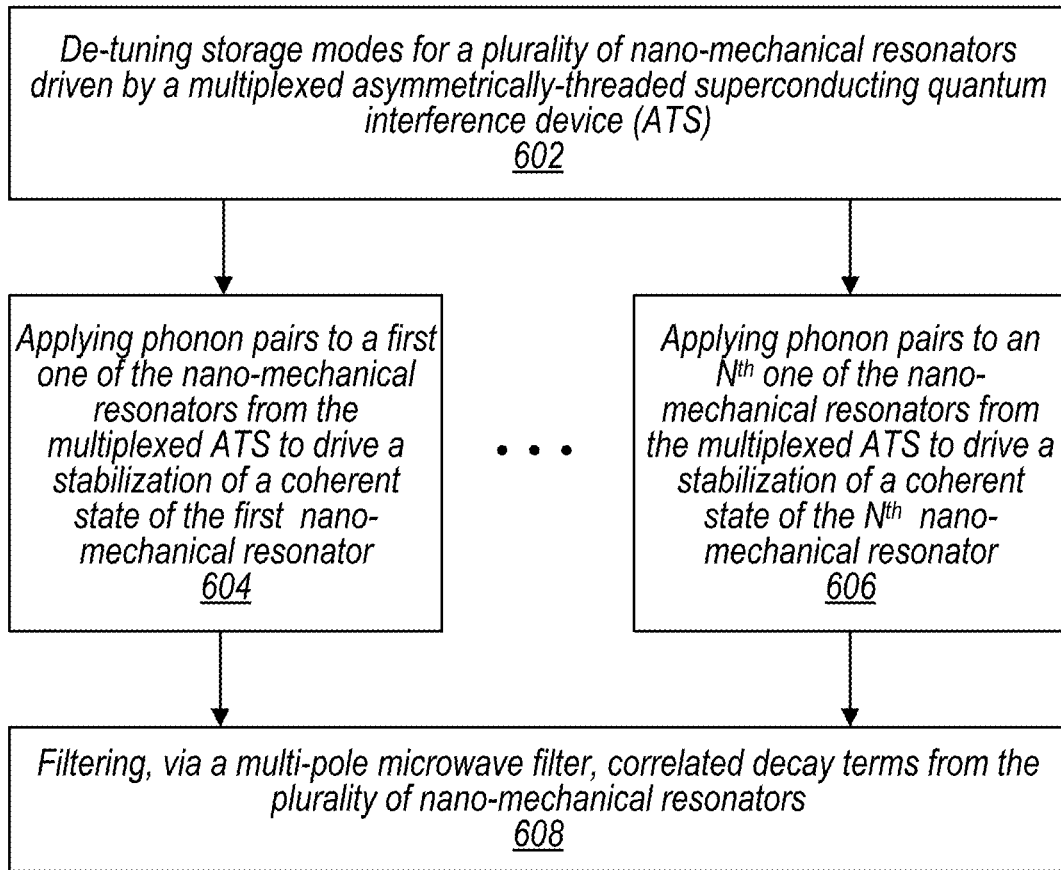
FIG. 6 illustrates a process of stabilizing multiple nano-mechanical resonators using a multiplexed control circuit (e.g. multiplexed ATS), according to some embodiments.

FIG. 6 illustrates a process of stabilizing multiple nano-mechanical resonators using a multiplexed ATS, according to some embodiments.

At block 602, storage modes for a plurality of nano-mechanical resonators that are driven by a multiplexed ATS are chosen such that the storage modes are de-tuned. For example, block 602 may include detuning storage modes supported by a plurality of nano-mechanical resonators from a dump resonator containing an asymmetrically-threaded superconducting quantum interference device At block 604 phonon pairs are supplied to a first one of the nano-mechanical resonators at a first frequency and at 606 phonon pairs are supplied to other ones of the nano-mechanical resonators at other frequencies such that the frequencies for the respective storage modes of the nano-mechanical resonators are detuned. For example, blocks 604 and 606 may include applying a pump and drive to an ATS to activate two-phonon driven-dissipative stabilization to a first one of the nano-mechanical resonators and suppressing, via a microwave bandpass filter, correlated decay processes from the plurality of nano-mechanical resonators.

Additionally, the storage mode frequencies and a bandwidth for a filter of the control circuit may be selected such that de-tunings of unwanted terms are larger than half the filter bandwidth. Then, at block 608 a microwave filter with the determined filter bandwidth properties may be used to filter correlated decay terms from the plurality of nano-mechanical resonators.

Cross-Talk Suppression Via Filtering, Phononic Mode Frequency Selection, and Dump Mode Detuning Selection In acting as a nonlinear mixing element, the ATS (e.g. multiplexed control circuit) not only mediates the desired $(g_2 \hat{a}_n^2 \hat{b}^\dagger$+h.c.) interactions, but it also mediates spurious interactions between different storage modes. How such interactions can give rise to cross-talk among the cat qubits, and subsequently how this cross-talk can be mitigated is further discussed blow. Such as mitigation through a combination of filtering and phonon-mode frequency optimization. While most spurious interactions mediated by the ATS are far detuned and can be safely neglected in the rotating wave approximation, there are others which cannot be neglected. Most concerning among these are interactions of the form:

$$g_2 \hat{a}_i \hat{a}_j \hat{b}^\dagger e^{i\delta_{ijk}t} + h.c.$$

for $j \neq k$, where: $\delta_{ijk} = \omega_k^{(p)} - \omega_i - \omega_j + \omega_b$. This interaction converts two phonons from different modes, j and k, into a single buffer mode photon, facilitated by the pump that stabilizes mode i. These interactions cannot be neglected in general because they have the same coupling strength as the desired interactions in the Hamiltonian (as discussed above), and they can potentially be resonant or near-resonant, depending on the frequencies of the phonon modes involved.

There are three different mechanisms through which the interactions can induce crosstalk among the cat qubits. These mechanisms are described in detail further below. First, analogously to how the desired interactions lead to two-phonon losses, the undesired interactions lead to correlated, single-phonon losses:

$$k_{eff} D[\hat{a}_j \hat{a}_k] \to k_{eff} |\alpha|^4 D[\hat{Z}_j \hat{Z}_k]$$

where the rate $k_{eff}$ will be discussed shortly. The arrow denotes projection onto the code space, illustrating that these correlated losses manifest as stochastic, correlated phase errors in the cat qubits.

Second, the interplay between different interactions gives rise to new effective dynamics generated by the Hamiltonians of the form:

$$\hat{H}_{eff} = x \hat{a}_i^\dagger \hat{a}_j^\dagger \hat{a}_m \hat{a}_n e^{i(\delta_{imn} - \delta_{ijk})t} + h.c., \to$$
$$x|\alpha|^4 \hat{Z}_i \hat{Z}_j \hat{Z}_k \hat{Z}_l e^{i(\delta_{lmn} - \delta_{ijk})t} + h.c.$$

where the coupling rate x is further defined below. The projection onto the code space in the second line reveals that $\hat{H}_{eff}$ can induce undesired, coherent evolution within the code space.

Third, $\hat{H}_{eff}$ can also evolve the system out of the code space, changing the phonon-number parity of one or more modes in the process. Though the engineered dissipation subsequently returns the system to the code space, it does not correct changes to the phonon-number parity. The net result is that $\hat{H}_{eff}$ also induces stochastic, correlated phase errors in the cat qubits, $$\gamma_{eff} D[\hat{Z}_i \hat{Z}_j \hat{Z}_k \hat{Z}_l]$$

where the rate $\gamma_{eff}$ will be discussed shortly.

Figure 7A:
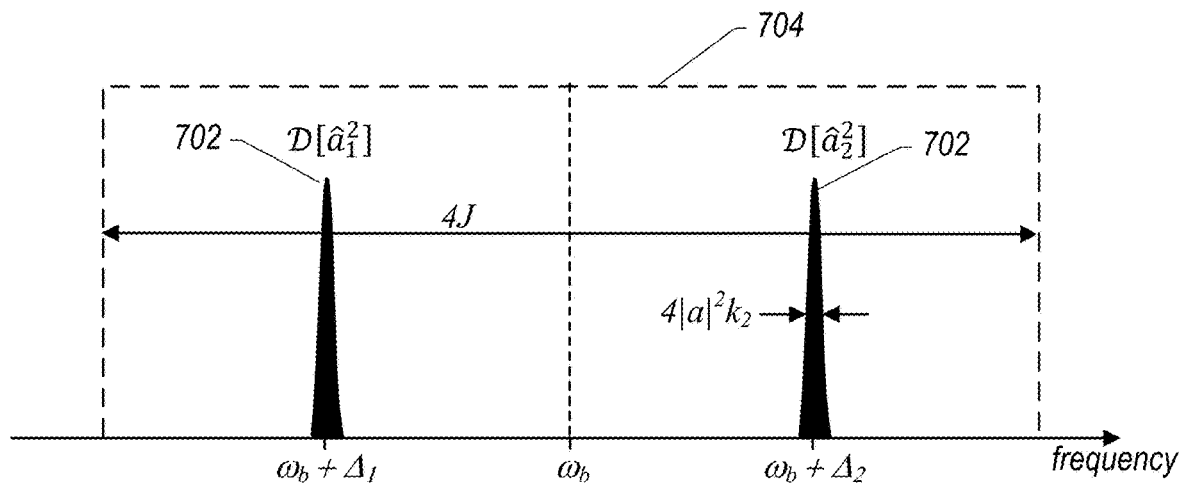
FIG. 7A illustrates dissipation of photons from a multiplexed control circuit (e.g. multiplexed ATS) at frequencies falling within a filter passband of a microwave filter included in the multiplexed control circuit, wherein dissipations at frequencies within the filter passband are strong and dissipations associated with frequencies outside of the filter passband are suppressed, according to some embodiments.
Figure 7B:
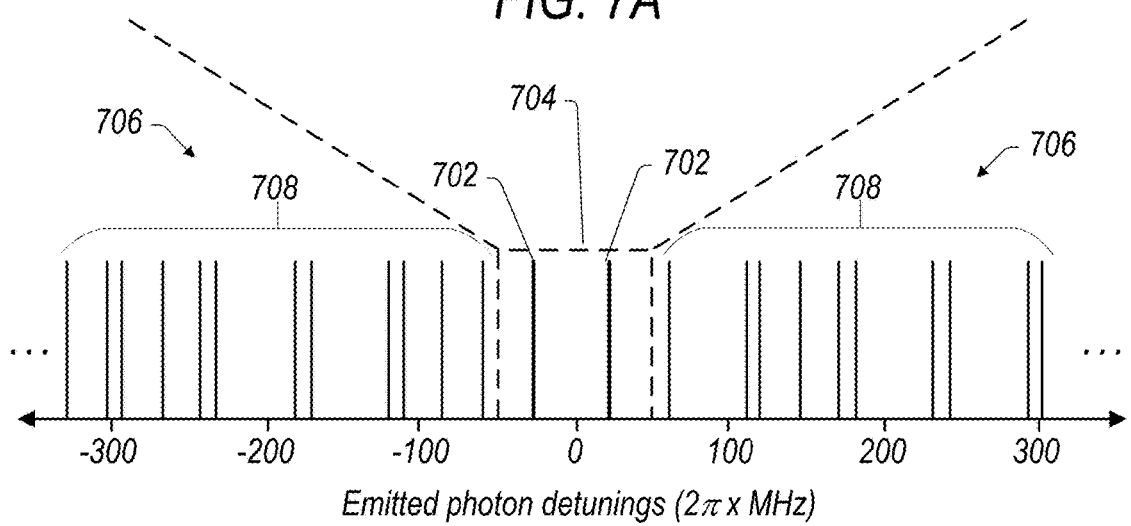
FIG. 7B illustrates a larger frequency spectrum than shown in FIG. 7A, wherein photon emission frequencies associated with correlated errors, such as due to cross talk, falling outside of the filter passband of the filter are suppressed, according to some embodiments.
Figure 7C:
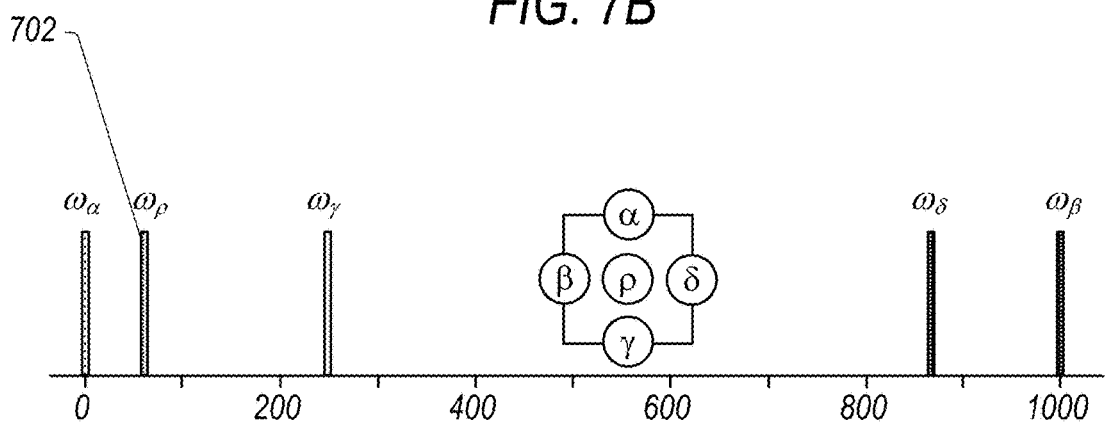
FIG. 7C illustrates phonon mode frequencies that are selected for phononic modes stabilized by a multiplexed control circuit (e.g. multiplexed ATS) such that associated photon emissions (as shown in FIG. 7B) associated with correlated errors, such as due to cross talk, occur at frequencies outside of the filter passband of the filter (such as the microwave filter shown in FIG. 4), according to some embodiments.

However, in some embodiments, all of these types of cross-talk can be suppressed through a combination of filtering and phonon-mode frequency optimization. For example it is possible to achieve $k_{eff} \approx 0$ and $\gamma_{eff} \approx 0$, provided $$|\delta_{ijk}| > 2J,$$

$$|\delta_{ijk} - \delta_{imn}| > 2J$$

respectively. This suppression can be understood as follows. The decoherence associated with $k_{eff}$ and $\gamma_{eff}$ results from the emission of photons at frequencies $\omega_b + \delta_{ijk}$ and $\omega_b \pm (\delta_{ijk} - \delta_{imn})$ respectively. When the frequencies of these emitted photons lie outside the filter passband, their emission (and the associated decoherence) is suppressed. Crucially, it can be arranged for all such errors to be suppressed simultaneously by carefully choosing the frequencies of the phonon modes, as shown in FIGS. 7A-7C. The configuration of mode frequencies in FIG. 7C was found via a numerical optimization procedure described in further detail below. The optimization also accounts for the undesired coherent evolution: the detunings $\delta_{ijk} - \delta_{imn}$ are maximized so that $\hat{H}_{eff}$ is rapidly rotating and its damaging effects are mitigated (this suppression is quantified further below). Additionally, it is noted that in FIG. 7B all emitted photon frequencies associated with crosstalk lie at least 10 MHz outside of the filter passband. As a result, the crosstalk suppression is robust to variations in the phonon mode frequencies of the same order. Larger variations in the phonon mode frequencies can be accommodated by reducing the filter bandwidth.

Thus it is demonstrated that crosstalk can be largely suppressed within the five-mode unit cells of the phononic architecture described herein.

With regard to FIGS. 7A-7C, FIG. 7A shows frequency multiplexing. The five lines shown in FIG. 7A are the five frequencies for the five phonon modes ($\omega_\alpha$, $\omega_\beta$, $\omega_\gamma$, $\omega_\delta$, and $\omega_\rho$). Because the desired couplings ($g_2 \hat{a}_n^2 \hat{b}^\dagger e^{i\Delta_n t} + h.c.$) are detuned by different amounts, photons lost to the environment via the buffer have different frequencies. When the corresponding emitted photons (702) are spectrally well resolved, $|\Delta_n - \Delta_m| \gg 4|\alpha|^2 k_2$, the modes are stabilized independently. Dissipation associated with photon emissions at frequencies inside the filter passband (704) is strong, while dissipation associated with emission at frequencies outside the passband is (706) suppressed. In FIG. 7B the lines 708 denote photon emission frequencies associated with various correlated errors, calculated for the specific phonon mode frequencies plotted in FIG. 7C. The mode frequencies are deliberately chosen so that all emissions associated with correlated errors occur at frequencies outside the filter passband (e.g. none of the lines 708 fall within the filter passband box 704). In other words, Equations above are simultaneously satisfied for any choices of the indices that lead to nontrivial errors in the cat qubits.

As mentioned above, the predominant sources of crosstalk are undesired terms in the Hamiltonian of the form $$g_2 \hat{a}_i \hat{a}_j \hat{b}^\dagger e^{i\delta_{ijk}t} + h.c.$$

where: $\delta_{ijk} = \omega_k^{(p)} - \omega_i - \omega_j + \omega_b$.

In this formulation, the dependence of $g_2$ on the indices i,j has been neglected for simplicity. In contrast to the other undesired terms in the Hamiltonian, these terms have the potential to induce large crosstalk errors because they both (i) have coupling strengths comparable to the desired terms, and (ii) can be resonant or near-resonant. In particular, the undesired term is resonant ($\delta_{ijk} = 0$) for $2\omega_k + \Delta_k = \omega_i + \omega_j$. This resonance condition can be satisfied, for example, when the storage modes have near uniformly spaced frequencies.

These unwanted terms may not be exactly resonant in practice, but it cannot generally be guaranteed that they will be rotating fast enough to be neglected in the RWA either. In contrast, all other undesired terms are detuned by at least $\min_n |\omega_n - \omega_b|$, which is on the order of $\sim 2\pi \times 1$ GHz for the parameters considered herein. It is therefore useful to focus on crosstalk errors induced by the terms in the Hamiltonian directly above.

These terms can lead to three different types of correlated errors:

Type I: Stochastic errors induced by effective dissipators;

Type II: Stochastic errors induced by effective Hamiltonians; and

Type III: Coherent errors induced by effective Hamiltonians.

Without mitigation, these correlated phase errors could be a significant impediment to performing high-fidelity operations.

Type I. Stochastic Errors Induced by Effective Dissipators

The terms in the Hamiltonian above can lead to correlated photon losses at rates comparable to $k_2$, resulting in significant correlated phase errors in the cat qubits. These deleterious effects manifest when one adiabatically eliminates the buffer mode. Applying effective operator formalism to the operators:

$$\hat{H}^{(1)} = g_2 \hat{a}_i \hat{a}_j \hat{b}^\dagger e^{i\delta_{ijk}t} + h.c.$$

$$\hat{L}^{(1)} = \sqrt{k_b} \hat{b}$$

obtains the effective operators:

$$H_{eff}^{(1)} = -\frac{|g_2|^2 \delta_{ijk}}{\delta_{ijk}^2 + \frac{k_b^2}{4}} (\hat{a}_i \hat{a}_j)^\dagger (\hat{a}_i \hat{a}_j) + h.c.,$$

$$\hat{L}_{eff}^{(1)} = \frac{g_2 \sqrt{k_b}}{\delta_{ijk} - ik_b/2} \hat{a}_i \hat{a}_j e^{i\delta_{ijk}t}$$

The effective Hamiltonian preserves phonon-number parity and thus does not induce phase flips. The effective jump operator $\hat{L}_{eff}$ describes correlated single-phonon losses in modes i and j at a rate:

$$k_{eff} = \frac{k_b |g_2|^2}{\delta_{ijk}^2 + \frac{k_b^2}{4}}$$

which is comparable to $k_2$ for $\delta_{ijk} \lesssim k_b$. These correlated single photon losses induce correlated phase flips in the cat qubits, which can be seen by projecting $\hat{L}_{eff}$ into the code space, $$\hat{L}_{eff}^{(1)} \to \sqrt{k_{eff}} \, \alpha^2 \hat{Z}_i \hat{Z}_j e^{i\delta_{ijk}t}.$$

Type II: Stochastic Errors Induced by Effective Hamiltonians

The interplay of different terms of the form of the Hamiltonian can lead to further correlated errors. As an example, consider the operators:

$$\hat{H}^{(2)} = g_2 \hat{a}_i \hat{a}_j \hat{b}^\dagger e^{i\delta_{ijk}t} + g_2 \hat{a}_l \hat{a}_m \hat{b}^\dagger e^{i\delta_{lmn}t} + h.c.$$

$$\hat{L}^{(2)} = \sqrt{k_b} \hat{b}.$$

Adiabatically eliminating the buffer mode yields, $$\hat{H}_{eff}^{(2)} = [x(\hat{a}_i \hat{a}_j)^\dagger (\hat{a}_l \hat{a}_m) e^{i(\delta_{lmn} - \delta_{ijk})t} + h.c.] + \ldots$$

$$\hat{L}_{eff}^{(2)} = \frac{g_2 \sqrt{k_b}}{\delta_{ijk} - ik_b/2} \hat{a}_i \hat{a}_j e^{i\delta_{ijk}t} + \frac{g_2 \sqrt{k_b}}{\delta_{lmn} - ik_b/2} \hat{a}_l \hat{a}_m e^{i\delta_{lmn}t}.$$

where $$x = -\frac{|g_2|^2}{2} \left[ \frac{1}{\delta_{ijk} - ik_b/2} + \frac{1}{\delta_{lmn} + ik_b/2} \right]$$

and "..." denotes additional terms in the Hamiltonian that preserve phonon-number parity. Note that the effective dissipator $\hat{L}_{eff}^{(2)}$ leads to Type I correlated phase errors. Indeed, for sufficiently large $|\delta_{ijk} - \delta_{lmn}|$ the action of $\hat{L}_{eff}^{(2)}$ can be approximated by replacing it with two independent dissipators of the form $\hat{L}_{eff}^{(1)}$.

What is different about this example is that the effective Hamiltonian $\hat{H}_{eff}^{(2)}$ contains terms $\propto (\hat{a}_i \hat{a}_j)^\dagger (\hat{a}_l \hat{a}_m)$ that generally do not preserve phonon-number parity. Such terms can unitarily evolve the system out of the code space, changing the parity in the process. In turn, the engineered dissipation returns the system to the code space, but it does so without changing the parity. Therefore, the net effect of such excursions out of the code space and back is to induce stochastic parity-flips in the storage modes, which manifest as correlated phase errors on the cat qubits. The errors are stochastic even though the evolution generated by $\hat{H}_{eff}^{(2)}$ is unitary because the stabilization itself is stochastic. Specifically, the errors are of the form $D[\hat{Z}_i \hat{Z}_j \hat{Z}_l \hat{Z}_m]$, which one can show by adiabatically eliminating the excited states of the storage modes.

Type III: Coherent Errors Induced by Effective Hamiltonians

The parity-non-preserving effective Hamiltonian $\hat{H}_{eff}^{(2)}$ also induces non-trivial coherent evolution within the code space. This can be seen by projecting $\hat{H}_{eff}^{(2)}$ into the code space $$\hat{H}_{eff}^{(2)} \to (|\alpha|^4 x \hat{Z}_i \hat{Z}_j \hat{Z}_l \hat{Z}_m) e^{i(\delta_{lmn} - \delta_{ijk})t} + h.c.$$

This undesired evolution does not decohere the system but can nevertheless degrade the fidelity of operations.

Cross-Talk Mitigation Using Filtering

In some embodiments, type I and type II errors can be suppressed by placing a bandpass filter (as described above and shown in FIG. 4, element 402) at the output port of the buffer mode. The purpose of the filter is to allow photons of only certain frequencies to leak out of the buffer, such that the desired engineered dissipation remains strong but spurious dissipative processes are suppressed. A crucial requirement of this approach is that the desired dissipative processes be spectrally resolvable from the undesired ones, which is shown to be achievable further below.

In some embodiments, a tight-binding model is used where the filter consists of a linear chain of M bosonic modes with annihilation operators $\hat{c}_i$, and each with the same frequency $\omega_b$. Modes in the chain are resonantly coupled to their nearest neighbors with strength J. The first mode in the chain couples to the buffer mode $\hat{b}$, which is no longer coupled directly to the open 50Ω waveguide. Instead, the M-th mode is now the one which couples strongly to the waveguide, such that its single-photon loss rate is given by $k_c$. The buffer-filter system is described by the Hamiltonian (in the rotating frame)

$$H_{buffer+filter} = J(\hat{c}_1^\dagger \hat{b} + \hat{c}_1 \hat{b}^\dagger) + \sum_{i=1}^{M-1} J(\hat{c}_{i+1}^\dagger \hat{c}_i + \hat{c}_{i+1} \hat{c}_i^\dagger)$$

together with the dissipator $k_c D[\hat{c}_M]$. These additional modes act as a ban pass filer, as further shown below, with frequency $\omega_b$ and bandwidth 4J, and they suppress the emission of photons with frequencies outside of this passband.

Suppression of Type I Errors

To illustrate the suppression of Type I errors, consider the operators $$\hat{H}^{(3)} = (g_2 \hat{a}_i \hat{a}_j \hat{b}^\dagger e^{i\delta_{ijk}t} + h.c.) + \hat{H}_{buffer+filter}$$

$$\hat{L}^{(3)} = \sqrt{k_c} \hat{c}_M$$

where the first term in $\hat{H}^{(3)}$ is the same as an unwanted term from $\hat{H}^{(1)}$. In some embodiments, both the buffer and filter modes are adiabatically eliminated in order to obtain an effective dynamics for only the storage modes. It is noted that adiabatically eliminating the buffer and filter modes together is not fundamentally different from adiabatically eliminating the buffer. This yields the effective dissipator $$\hat{L}_{eff}^{(3)} \sqrt{k_{eff}(M)} \hat{a}_i \hat{a}_j e^{i\delta_{ijkl}}$$

Figure 8A:
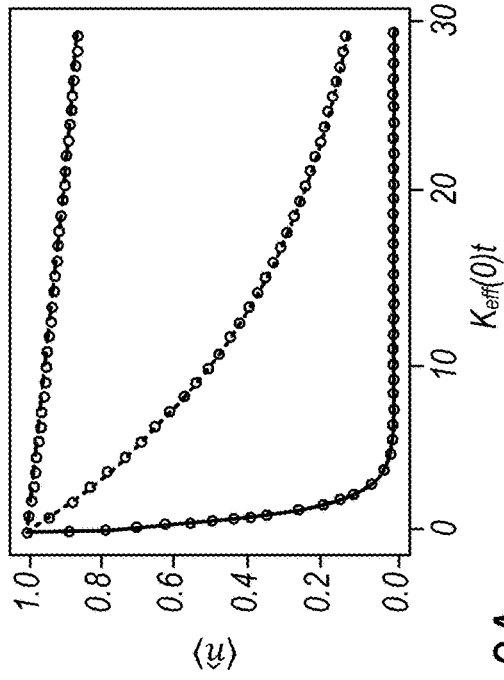
FIG. 8A illustrates plots showing suppression of type I cross talk errors (e.g. stochastic errors induced by effective dissipaters), according to some embodiments.

In this regime, $k_{eff}(M)$ is exponentially suppressed with increasing M via the factor $(J/\delta_{ijk})^{2M}$. These rates are plotted as a function of $\delta_{ijk}$ in FIG. 8A (left side) where the exponential suppression of the decoherence rates outside the filter band is evident. FIG. 8A (right side) also shows the results of analogous master equation simulations. Because good quantitative agreement is observable with the analytical expression, it is concluded that Type I errors are indeed suppressed by the filter, provided $|\delta_{ijk}|>2J$.

Suppression of Type II Errors

To illustrate the suppression of Type II errors consider a toy model that both captures the relevant physics and is easy to study numerically. Consider the operators:

$$\hat{H}^{(4)} = \underbrace{(g\hat{a}\hat{b}^\dagger e^{i\delta_1 t} + g\hat{b}^\dagger e^{i\delta_2 t} + h.c.) + [g_2(\hat{a}^2 - \alpha^2)\hat{b}^\dagger + h.c.]}_{\hat{H}_{buffer+filter}} +$$

$$\hat{L}^{(4)} = \sqrt{k_c} \hat{c}_M$$

where $\hat{a}$ is the annihilation operator for the single storage mode considered in this model. In this toy model, the first portion of $\hat{H}^{(4)}$ should be understood as analogous to $\hat{H}^{(2)}$. Indeed the former can be obtained from the latter by replacing $\hat{a}_i \hat{a}_j \to \hat{a}$ and $\hat{a}_i \hat{a}_m \to 1$.

Adiabatically eliminating the buffer and filter modes yields the effective operators $$\hat{H}_{eff}^{(4)} = [x_{eff}(M) \hat{a} e^{i(\delta_1 - \delta_2)t} + h.c.] + \ldots$$

$$\hat{L}_{eff}^{(4)} = \sqrt{k_{eff}^{(\delta 1)}(M)} \hat{a} e^{i\delta_1 t} + \sqrt{k_{eff}^{(0)}(M)} (\hat{a}^2 - \alpha^2).$$

Here " . . . " denotes a parity-preserving term ($\propto \hat{a}^\dagger \hat{a}$) that is omitted. Also, $k_{eff}^{(\delta)}(M)$ denotes the effective loss rate with the replacement $\delta_{ijk} \to \delta$, and $$x_{eff}(M) \approx -\frac{|g|^2}{2}\left(\frac{1}{\delta_1} + \frac{1}{\delta_2}\right)$$

is independent of M in the limit $\delta_{1,2} \gg J, k_b$. The first term in $\hat{L}_{eff}^{(4)}$ gives rise to Type I errors that are suppressed by the filter.

It follows from energy conservation that Type II errors induced by $\hat{H}_{eff}^{(4)}$ result in photon emissions at frequency $\omega_b + \delta_2 - \delta_1$. Intuitively, such emissions should be exponentially suppressed when this frequency lies outside the filter pass band. However, this suppression is not apparent in the operators $\hat{H}_{eff}^{(4)}$, because, in the course of deriving $\hat{H}_{eff}^{(4)}$, the filter was already eliminated. After adiabatic elimination the only vestige of the filter is the term $\sqrt{k_{eff}^{(0)}}(M)(\hat{a}^2 - \alpha^2)$, which embodies the behavior of the filter at frequency $\omega_b$, but not at frequency $\omega_b + \delta_2 - \delta_1$. As such, proceeding to calculate the Type II error rate from these operators is not valid, and an alternate approach is required.

In order to properly capture the subtle interplay between the effective Hamiltonian, the stabilization, and the filter, the adiabatic elimination can be deferred. Focus is placed on the regime where the terms in the first portion of the Hamiltonian are rapidly rotating, so that evolution generated by $\hat{H}^{(4)}$ is well approximated by its time average. The term $\hat{b}^\dagger \hat{b}$ can be replaced with its expected value of 0. Doing so reveals that $\hat{H}_{eff}^{(4)}$ can be understood as arising from the time averaged dynamics of the unwanted terms in $\hat{H}^{(4)}$ in the limit of large $\delta_{1,2}$. In effect, time averaging provides a way of introducing $\hat{H}^{(4)}$ into the dynamics without having to eliminate the filter, thereby allowing study of the interplay of the filter and effective Hamiltonian.

Begin by taking the operators $\hat{H}^{(4)}$ and $\hat{L}^{(4)}$ and adiabatically eliminating the buffer, the filter, and all excited states of the storage mode, i.e. all states that do not lie within the code space. Adiabatically eliminating the storage mode excited states is valid in the regime where the engineered dissipation is strong relative to couplings that excite the storage mode ($\hat{H}_{eff}^{(4)}$ in this case), such that these excited states are barely populated. It is found that the phase flip rate is exponentially suppressed by the filter, $$\gamma_{eff}(M) \approx \gamma_{eff}(0) \left(\frac{J}{\delta_1 - \delta_2}\right)^{2M}$$

Figure 8B:
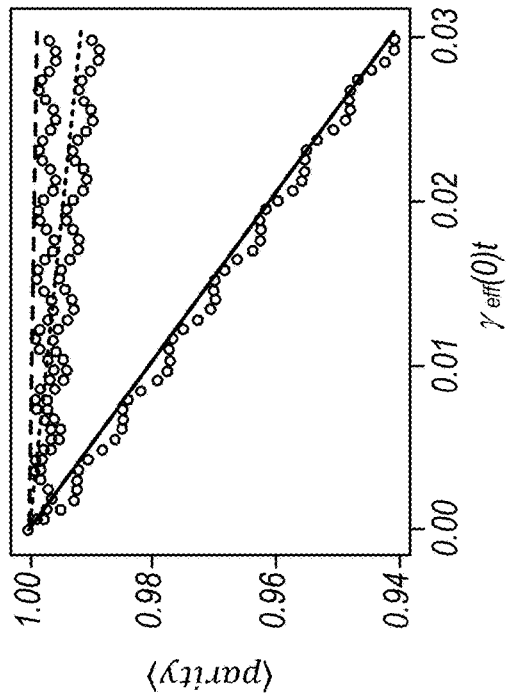
FIG. 8B illustrates plots showing suppression of type II cross talk errors (e.g. coherent errors induced by effective Hamiltonians), according to some embodiments.

In FIG. 8B (left side), the rates $\gamma_{eff}(M)$ as a function of $\delta_1 - \delta_2$ are plotted, where the decoherence rates outside the filter band is again evident. FIG. 8B on the right side shows the results of corresponding master simulation equations. Thus it can be concluded that Type II errors are also suppressed by the filter, provided the effective Hamiltonian detuning lies outside the filter passband.

Cross-Talk Mitigation Using Mode Frequency Optimization

In addition to suppressing Type I and Type II errors via the filter, Type III errors can be suppressed by carefully selecting the of the phonon modes. In doing so, so, the effects of Type III errors can also be simultaneously minimized. Importantly, the phonon mode frequencies are chosen to be compatible with error correction in the surface code. However, the surface code architecture may constrain the choice of phonon mode frequencies. To understand the constraints imposed by the implementation of the surface code, recall that each ATS (e.g. multiplexed control circuit) is coupled to five phononic modes. Among the five modes, four modes (two data and two ancilla modes for the surface code) are stabilized in the cat-code manifold by an ATS. Another mode (readout mode) is dedicated to measuring cat qubits in the X basis and is not stabilized by any ATS. Since every data or ancilla mode couples to two ATSs, each ATS is only responsible for stabilizing two of the five phononic modes to which it couples. Thus, for each given ATS, it is necessary to determine which two phononic modes should be stabilized. An important consideration in deciding which phononic modes should be stabilized by a given ATS is that each ATS is used to realize four CNOT gates (performed in four different time steps) to measure the stabilizers of the surface code. While a CNOT gate is being performed, the target mode of the CNOT gate is stabilized by a rotating jump operator $$\hat{L}_2(t) = \hat{a}_2^2 - \alpha^2 + \left(\frac{\alpha}{2}\right)\left(\exp\left[\frac{2i\pi t}{T}\right] - 1\right)(\hat{a}_1 - \alpha)$$

that acts non-trivially both on the target mode ($\hat{a}_2$) and the control mode ($\hat{a}_1$). Thus, while a CNOT gate is being performed, the target mode must be stabilized by the ATS that also couples to the control mode.

Figure 9:
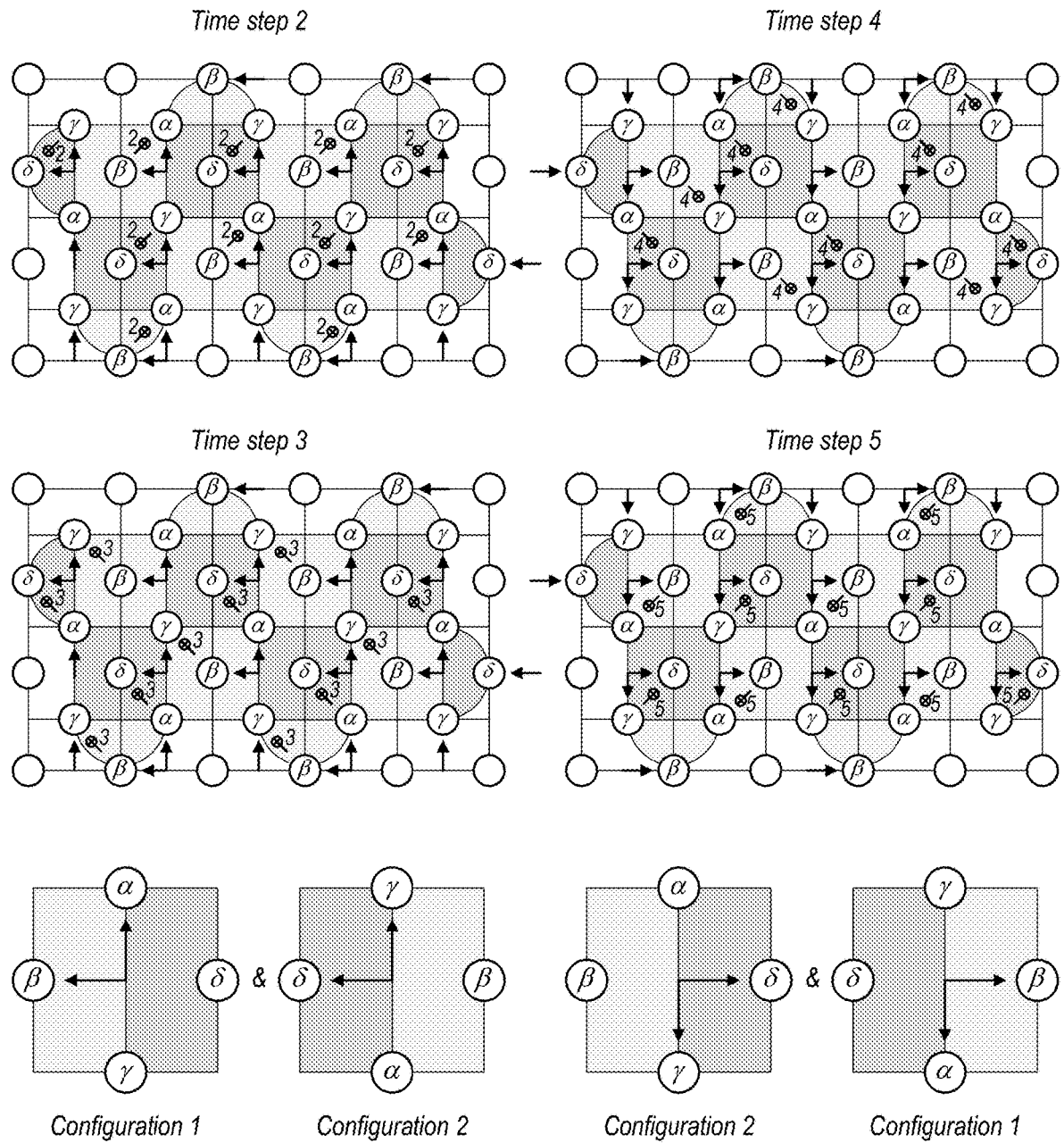
FIG. 9 illustrates an example sequence of time steps for cat qubit stabilization in a surface code architecture and configurations from the perspective of multiplexed control circuits (e.g. multiplexed ATSs) that perform the stabilizations, according to some embodiments.

FIG. 9 shows how these stabilization constraints can be satisfied. In the top panel of the figure, four time steps are shown of the surface-code stabilizer measurement (out of six, state preparation and measurement time steps are omitted) time steps. During each time step, different CNOT gates between data and ancilla cat qubits are applied. Data modes are labeled as $\alpha$ and $\gamma$ and ancilla modes are labeled as $\beta$ and δ. Ancilla modes labelled as β(δ) are used to measure the X-type (Z-type) stabilizers of the surface code. Black arrows indicate which phononic modes are stabilized by each ATS at each time step; each phononic mode at the tip of a black arrow is stabilized by the ATS at the arrow's tail. Importantly, every target mode of a CNOT gate is stabilized by an ATS that also couples to the corresponding control mode at all time steps. Note, however, that a given ATS stabilizes different modes at different time steps, as summarized in the bottom panel of FIG. 9. In particular, there are two stabilization configurations: in configuration 1 (2) modes α,β(γ,δ) are stabilized by the given ATS, and the remaining modes γ,δ(α,β) are stabilized by some other neighboring ATSs.

The goal is to choose the frequencies of the phonon modes and detunings of the pumps in order to minimize crosstalk. In order to ensure that the choice of mode frequencies is compatible with the surface-code stabilizer measurement, assign modes with the same label in FIG. 9 to have the same frequency. Thus, there are only five mode frequencies that must be chosen: the frequencies $\omega_\alpha$, $\omega_\beta$, $\omega_\gamma$, $\omega_\delta$ corresponding to the four labels in FIG. 9, plus the frequency of the readout mode (not shown in FIG. 9), which can be taken to be the same in each unit cell and denote by $\omega_p$. Similarly, there are four pump detunings, $\Delta_\alpha$, $\Delta_\beta$, $\Delta_\gamma$, $\Delta_\delta$, that must be chosen. Here, as above, $\Delta_i$ denotes the detuning of the pump (and buffer drive) used to stabilize mode i.

A cost function C can be constructed that quantifies cross-talk as a function of these nine parameters (five mode frequencies and four pump detunings). Numerically minimizing C allows results in finding choices of the frequencies and detunings that minimize crosstalk.

First, C should be large if any emitted photons associated with Type I and II errors lie inside the filter's bandwidth 4J. Thus, take C=1 if any of the following conditions are met for either of the two stabilization configurations shown in FIG. 9:

$|\delta_{ijk}|<2J$ (Type I errors not suppressed)
$|\delta_{ijk}-\delta_{lmn}|<2J$ (Type II errors not suppressed)
$|\delta_{iii}|>2J$ (Desired dissipation suppressed)

In other words, set C=1 if any Type I or II errors are not suppressed by the filter, or if any of the desired engineered dissipation is suppressed by the filter. These conditions must be checked for both stabilization configurations shown in FIG. 9; checking both configurations is necessary in order to ensure that Type I and II crosstalk is suppressed by the filter at all time steps.

Second, C should be large if the coherent Type III errors have significant damaging effects. Recall that these errors are generated by effective Hamiltonian terms, $|\alpha|^4 x \hat{Z}_i \hat{Z}_j \hat{Z}_l \hat{Z}_m e^{i(\delta_{lmn}-\delta_{ijk})t} + h.c.$ When these terms are rapidly rotating, e.g. when $|\alpha^4 x| \ll |\delta_{ijk}-\delta_{lmn}|$, their effects are suppressed. Indeed, these terms effectively induce detuned Rabi oscillations between states of different parity, and the magnitude of these oscillations is small in the far-detuned limit. To quantify this suppression, note that these micro-oscillation errors remain coherent during gates but can be converted to incoherent, correlated ^Z errors when the X-type stabilizers are measured. The probability $p_{ijklmn}$ of inducing a correlated phase error upon a such a measurement scales quadratically in the ratio of the coupling strength and detuning, $$p_{ijklmn} = \left(\frac{|\alpha^4 x|}{\delta_{i,jk}-\delta_{lmn}}\right)^2.$$

Among the various Type III errors, focus is placed on those that induce phase errors in both of the data modes α and γ since such errors are specific to the architecture described herein and not taken into account in the standard surface-code analysis.

Figure 10:
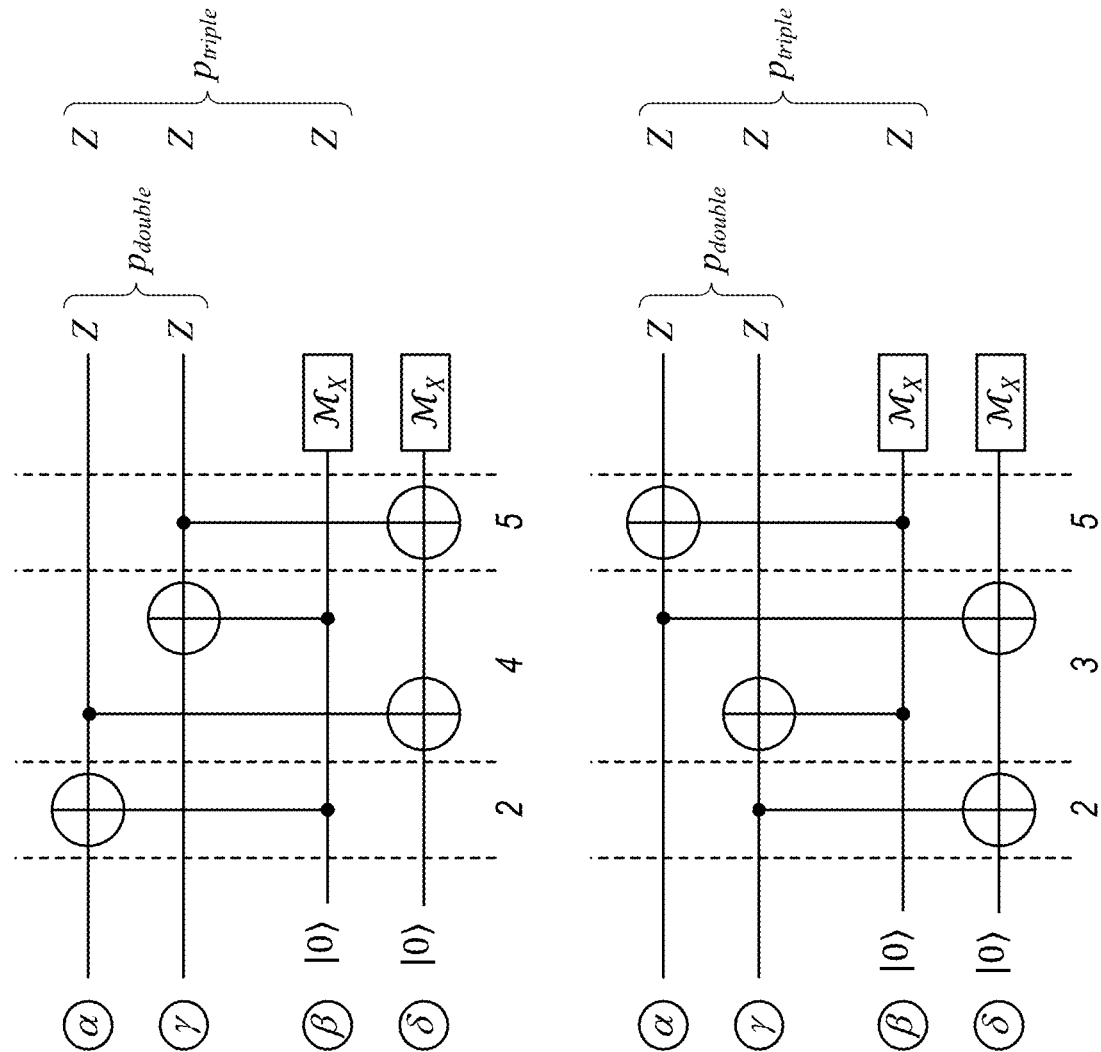
FIG. 10 illustrates definitions for probabilities associated with type III cross talk errors (e.g. coherent errors induced by effective Hamiltonians), according to some embodiments.
Figure 10:
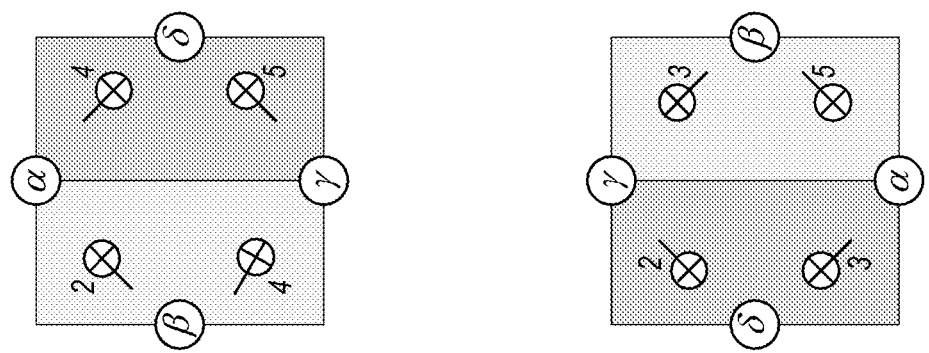

In particular define $p_{double}$ as the total probability at least one Type III error $\propto \hat{Z}_\alpha \hat{Z}_\gamma \hat{I}_\beta$ and $p_{triple}$ as the total probability of at least one Type III error $\propto \hat{Z}_\alpha \hat{Z}_\gamma \hat{Z}_\beta$. Explicitly, $$p_{double} = \sum_{\{ijklmn\} \in D} p_{ijklmn}, \quad p_{triple} = \sum_{\{ijklmn\} \in T} p_{ijklmn},$$

where D and T denote sets of indices that give rise to errors a $\propto \hat{Z}_\alpha \hat{Z}_\gamma \hat{I}_\beta$ and $\propto \hat{Z}_\alpha \hat{Z}_\gamma \hat{Z}_\beta$, respectively. For example, as shown in FIG. 10. Note that the $\hat{Z}$ error on the ancilla mode β manifests as a flipped X-basis measurement outcome. On the other hand, $\hat{Z}$ errors on the ancilla mode δ do not flip the measurement outcomes. This is because the mode δ is measured in the Z-basis, and Z-basis measurements commute with $\hat{Z}$ errors.

For the cost function, take C=1 if Type I or II errors are not suppressed by the filter (see aforementioned conditions on the $\delta_{ijk}$) otherwise, take $C = \frac{1}{2}(p_{double}^{(1)} + p_{triple}^{(1)} + p_{double}^{(2)} + p_{triple}^{(2)})$ where $p_{double}^{(i)}$ and $p_{triple}^{(i)}$ denote the values for $p_{double}$ and $p_{triple}$ for the i-th double triple double triple stabilization configuration. This equation represents the average probability of a Type III error occurring during one time step. Costs C<<1 are thus only achieved when both the probability of Type III errors is small, and all Type I and II errors are suppressed by the filter.

Having defined the cost function C, a numerical search can be performed for the values of the mode frequencies and pump detunings which minimize the cost. In performing this optimization, two additional restrictions may be placed on allowed frequencies and detunings. First, restrict the mode frequencies to lie within a 1 GHz bandwidth. This is done because the modes are supported by phononic crystal-defect resonators (PCDRs), and as such all mode frequencies must lie within the phononic bandgap, or at least within the union of two separate bandgaps each associated with different PCDRs. These bandgaps are typically not more than 500 MHz wide for the devices considered in the preceding sections. Second, restrict the values of the detunings to $\Delta = \pm J$. This is done to maximize use of the filter bandwidth; emitted photons are detuned from one another by 2J and from the nearest band edge by J. Additionally, because the filter bandwidth restricts the maximum achievable $k_2$, take J to be as large as possible while still allowing for C<<1.

Figure 11A:
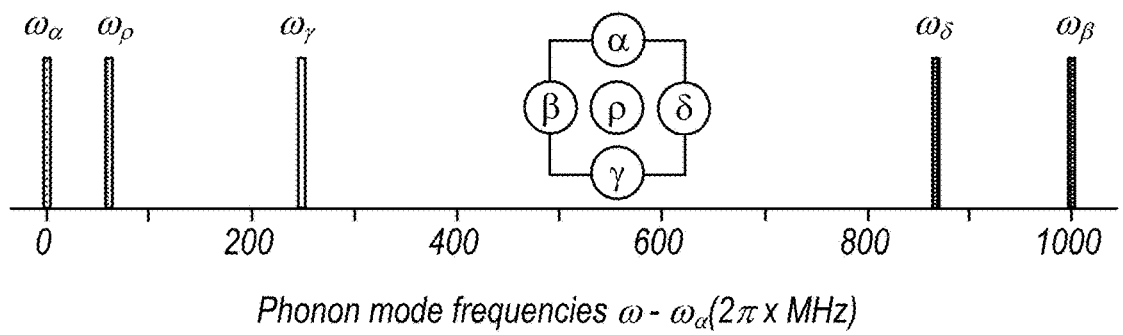
FIG. 11A illustrates optimized phonon mode frequencies for phononic modes coupled to a multiplexed control circuit (e.g. multiplexed ATS), according to some embodiments.
Figure 11B:
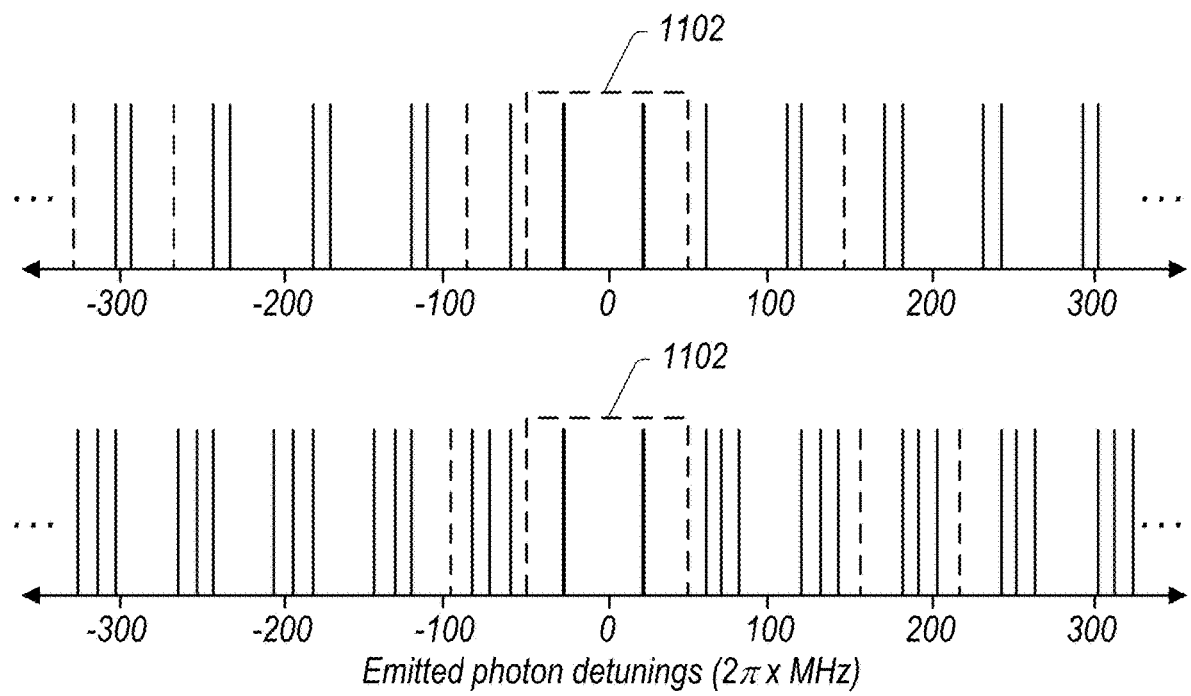
FIG. 11B illustrates corresponding emitted photon detunings, wherein type I and type II cross talk errors are suppressed due to photons emitted from a parity non-preserving process (e.g. a process giving rise to type I or type II cross talk errors) being sufficiently detuned such that the emitted photons are emitted at frequencies falling outside of the filter pass band, according to some embodiments.

Optimized results are shown in FIGS. 11A and 11B. For the optimal configurations, all Type I and Type II errors are simultaneously suppressed by the filter. Note also that all emitted photon frequencies associated with Type I or II errors lie at least 10 MHz outside the filter passband. As a result, the optimized configuration is robust to deviations in the mode frequencies of the same order, and larger deviations can be tolerated by decreasing the filter bandwidth. Moreover, for realistic values of |α| and $g_2 C \ll 1$, indicating that Type III errors are strongly suppressed. Therefore, all dominant sources of crosstalk are strongly suppressed. The top plot in FIG. 11B is for the case where modes α and β(γ and δ) are stabilized simultaneously. The lines outside of the filter pass band 1102 indicate photons emitted via parity non-preserving Type I and Type II processes. The filter pass band 1102 cover the region [−50,50] (2π×MHz), representing a bandpass filter with center frequency $\omega_b$ and a 4J=2π× 100 MHz passband. The five lines shown in FIG. 11A are the five optimized frequencies for the five phonon modes ($\omega_\alpha$, $\omega_\beta$, $\omega_\gamma$, $\omega_\delta$, and $\omega_\rho$).

Frequency optimization results are also shown in the following table. The parameters 4J and ω are given in units of 2π×MHz. The Type III error probabilities and the cost C are expressed in terms of α and $g_2$. For realistic choices of $$|\alpha| = \sqrt{8} \text{ and } \frac{g_2}{2\pi} = 2$$

MHz, the cost function evaluates to C=1.05×10⁻⁴ and C=1.23×10⁻³ for the four- and five-mode configurations, respectively. For the analysis fixed values are used for the pump detunings, $-\Delta_\alpha = \Delta_\beta = \Delta_\gamma = \Delta_\delta = J$.

| # of modes | 4J | $\omega_\alpha, \omega_\beta, \omega_\gamma, \omega_\delta, \omega_\rho$ | $\frac{1}{2}(p^{(1)}_{double} + p^{(2)}_{double})$ | $\frac{1}{2}(p^{(1)}_{triple} + p^{(2)}_{triple})$ | C |
|---|---|---|---|---|---|
| 4 | 180 | 0, 1000, 798, 101, — | $1.22 \times 10^{-10} \left[\frac{|\alpha|^2 g_2}{2\pi \text{ MHz}}\right]^4$ | $3.87 \times 10^{-10} \left[\frac{|\alpha|^2 g_2}{2\pi \text{ MHz}}\right]^4$ | $1.60 \times 10^{-9} \left[\frac{|\alpha|^2 g_2}{2\pi \text{ MHz}}\right]^4$ |
| 5 | 100 | 0, 1000, 242, 879, 61 | $1.83 \times 10^{-8} \left[\frac{|\alpha|^2 g_2}{2\pi \text{ MHz}}\right]^4$ | $5.20 \times 10^{-10} \left[\frac{|\alpha|^2 g_2}{2\pi \text{ MHz}}\right]^4$ | $1.88 \times 10^{-8} \left[\frac{|\alpha|^2 g_2}{2\pi \text{ MHz}}\right]^4$ |

Figure 12:
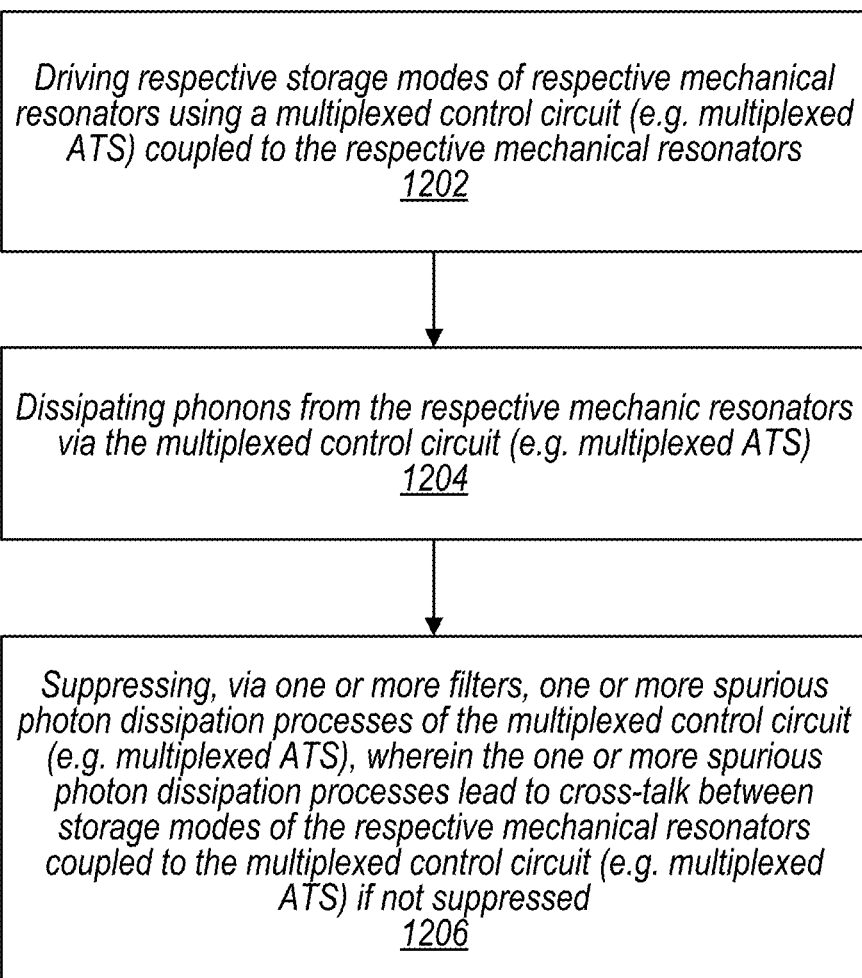
FIG. 12 is a flowchart illustrating a multiplexed control circuit (e.g. multiplexed ATS) stabilizing phononic modes of cat qubits and also suppressing cross-talk, according to some embodiments.

FIG. 12 is a flowchart illustrating a multiplexed control circuit (e.g. multiplexed ATS) stabilizing phononic modes of cat qubits and also suppressing cross-talk, according to some embodiments.

At 1202, respective storage modes of mechanical resonators are driven by a multiplexed control circuit (e.g. multiplexed ATS). At 1204, phonons are dissipated from phononic modes of the mechanical resonators via the multiplexed control circuit (e.g. multiplexed ATS). At 1206, one or more filters suppress one or more spurious photon dissipation processes of the multiplexed control circuit (e.g. multiplexed ATS), wherein the one or more spurious photon dissipation processes lead to cross-talk between storage modes of the respective mechanical resonators coupled to the multiplexed control circuit (e.g. multiplexed ATS) if not suppressed.

Figure 13:
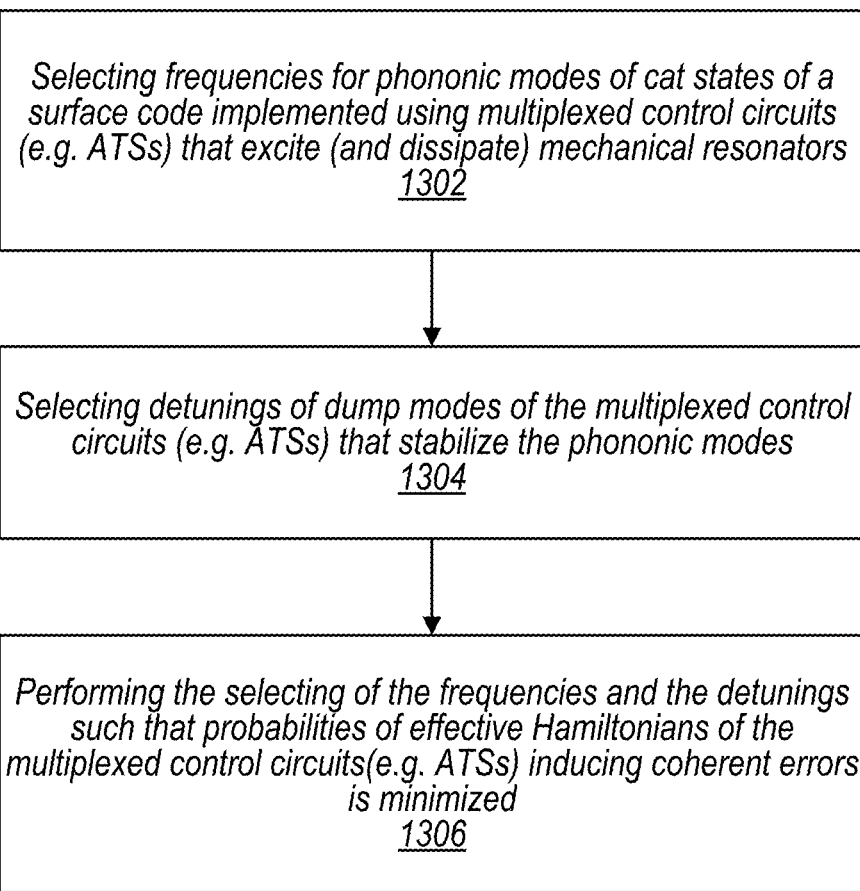
FIG. 13 is a flowchart illustrating a process for selecting frequencies for phononic modes and detunings of pump modes such that probabilities that the effective Hamiltonians of the multiplexed control circuits (e.g. multiplexed ATSs) induce coherent errors (e.g. type III cross talk errors) is minimized, according to some embodiments.

FIG. 13 is a flowchart illustrating a process for selecting frequencies for phononic modes and detunings of pump modes such that probabilities that the effective Hamiltonians of the multiplexed control circuits (e.g. multiplexed ATSs) induce coherent errors (e.g. type III cross talk errors) is minimized, according to some embodiments.

At 1302, frequencies are selected for phononic modes of cat states of a surface code implemented using multiplexed control circuits (e.g. ATSs) that excite (and dissipate) mechanical resonators. At 1304, detunings of dump modes are selected, wherein (1306) the selecting of the frequencies and the detunings is performed such that probabilities of effective Hamiltonians of the multiplexed control circuits (e.g. ATSs) inducing coherent errors is minimized.

Figure 14:
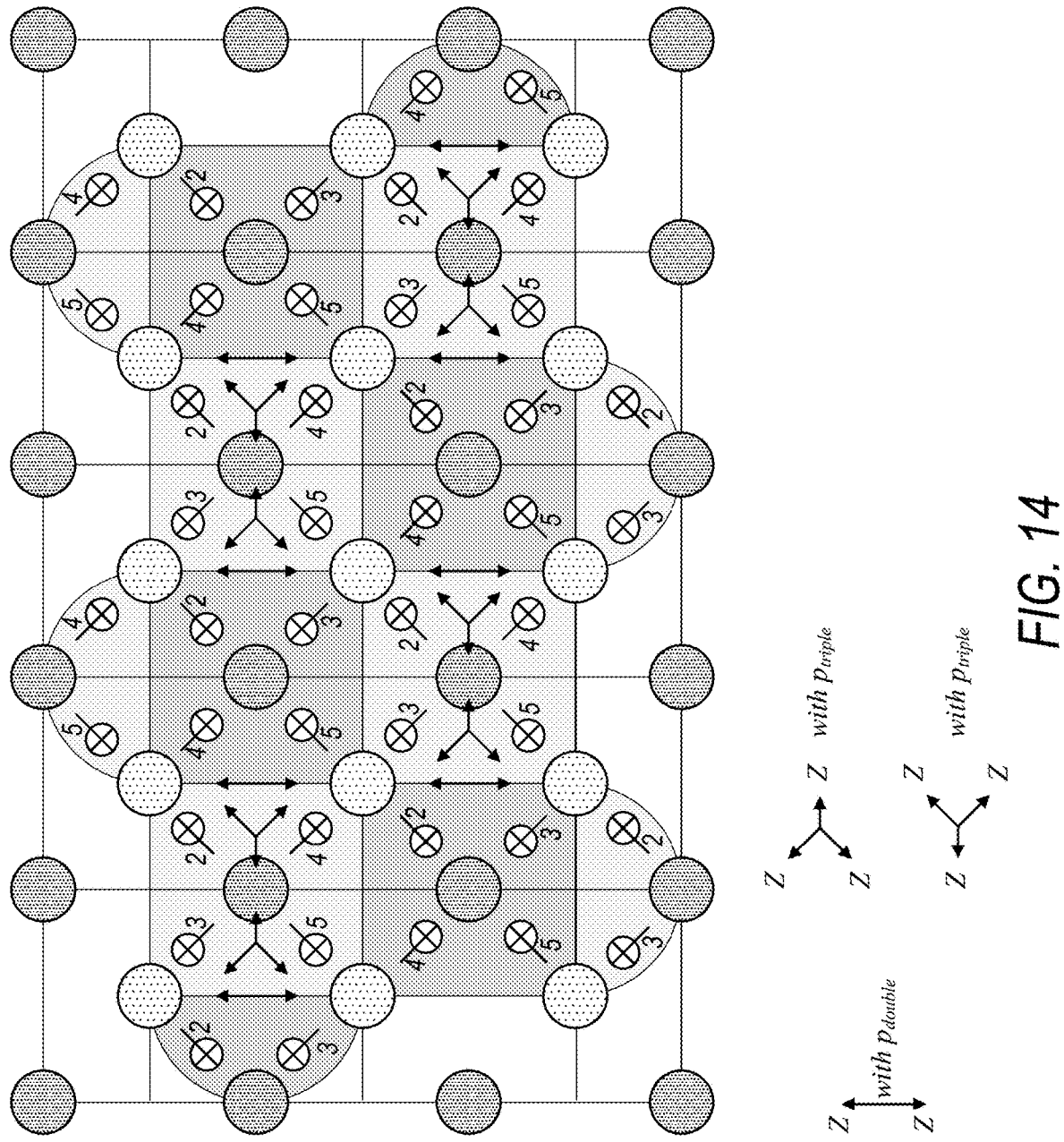
FIG. 14 illustrates a surface code and further illustrates cross talk errors experienced by phononic modes of the surface code that share a multiplexed control circuit (e.g. multiplexed ATS), according to some embodiments.

Using Additional Edges in a Decoding Graph to Identify/Correct Errors Caused by Cross-Talk Recall that each ATS stabilizes multiple phononic modes. Since the ATS mediates various spurious interactions as well as desired interactions, phononic modes that are connected by the same ATS undergo crosstalk errors. While stochastic crosstalk errors can be strongly suppressed by filtering and careful choice of the frequencies of the phononic modes, coherent micro-oscillation errors cannot be eliminated by the filters. In particular, such residual crosstalk errors result in two non-trivial noise processes: every pair of data qubits that are connected by a shared ATS (hence aligned vertically) experiences a correlated Z error with probability $p_{double}$ and every triple of two data qubits and an ancilla qubit that measures an X stabilizer of the surface code experiences a correlated Z error with probability $p_{triple}$. In particular, the Z error on the ancilla qubit is realized in the form of a flipped measurement outcome of the corresponding X-type stabilizer (as shown in FIG. 14). Note the arrows in FIG. 14 show where the Z errors could occur.

As discussed in the previous section, the frequencies of the five phononic modes coupled to a shared ATS can be optimized to minimize $p_{double}$ and $p_{triple}$, assuming that the maximum frequency difference between different phononic modes is 2π×1 GHz.

With such an optimal choice of phononic mode frequencies, in some embodiments, it is found that the correlated error rates $p_{double}$ and $p_{triple}$ are given by $$p_{double} = 1.829 \times 10^{-8} |\alpha|^8 \left(\frac{g_2/(2\pi)}{1 \text{ MHz}}\right)^4$$

$$p_{triple} = 5.205 \times 10^{-10} |\alpha|^8 \left(\frac{g_2/(2\pi)}{1 \text{ MHz}}\right)^4$$

As discussed above, $g_2$ is the strength of the desired interaction $\hat{a}^2 \hat{b}^\dagger$ needed for the engineered two-photon dissipation. Note that $p_{triple}$ is 35 times smaller than $p_{double}$.

Figure 15A:
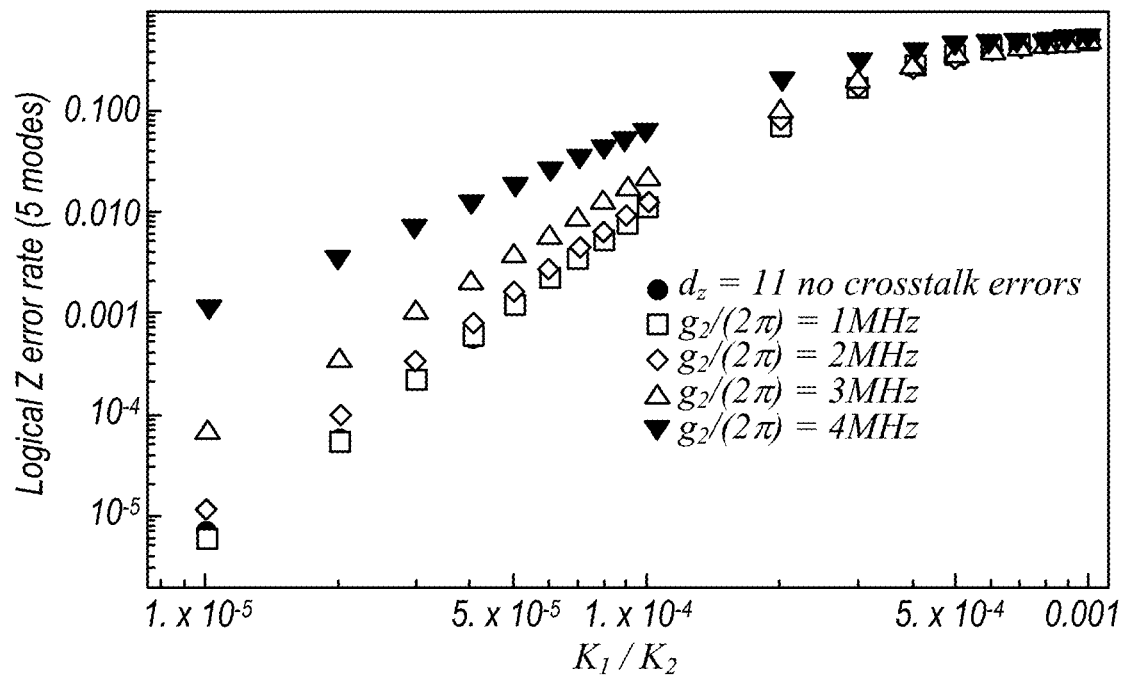
FIG. 15A illustrates logical Z error rates in the presence of residual cross talk errors for a plurality of different coupling rates ($g_2$), wherein five phononic modes are coupled to a respective multiplexed control circuit (e.g. multiplexed ATS), according to some embodiments.

FIG. 15A logical Z failure rates of the thin surface code under the presence of the crosstalk errors described above are illustrated for various values of $g_2$, where five modes are coupled to each ATS. It is noted that in the presence of crosstalk errors with probabilities $p_{double}$ and $p_{triple}$ extra edges need to be added to the matching graphs of the surface code. Details of the modified graphs in addition to the edge weight calculations are provided below.

Figure 15B:
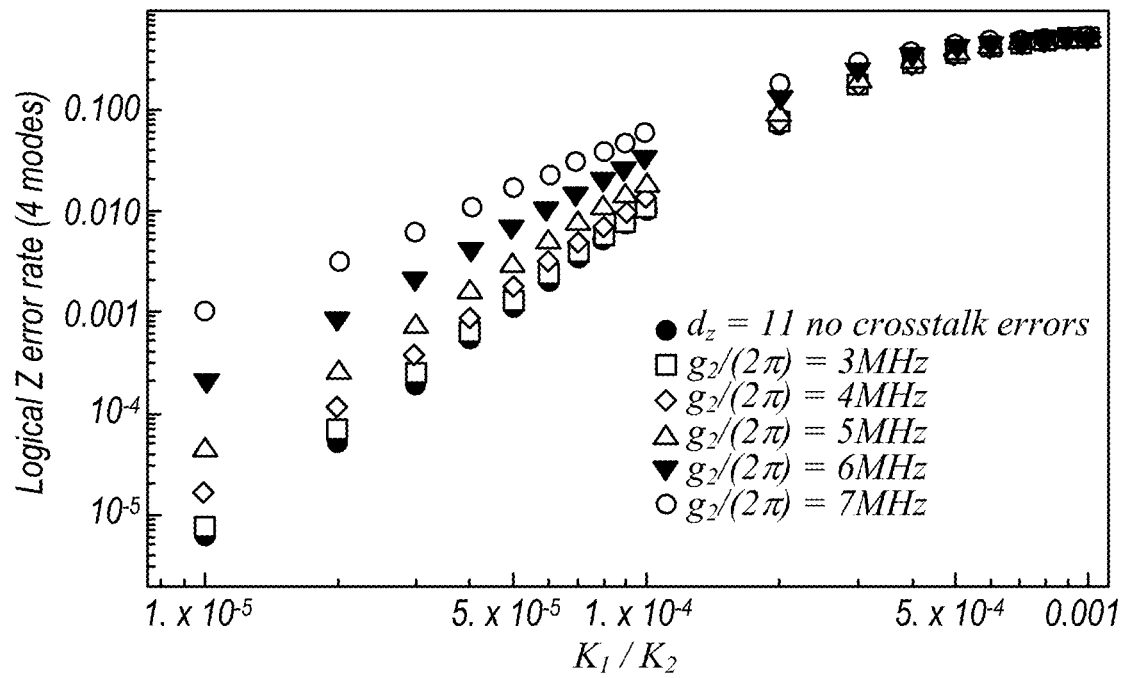
FIG. 15B illustrates logical Z error rates in the presence of residual cross talk errors for a plurality of different coupling rates ($g_2$), wherein four phononic modes are coupled to a respective multiplexed control circuit (e.g. multiplexed ATS), according to some embodiments.

In FIG. 15B logical Z errors are illustrated in the presence of crosstalk where the X readout of the cat qubits is performed directly using an optomechanical coupling (so that the crosstalk error probabilities are reduced by only having 4 phononic modes coupled to an ATS instead of five. As can be seen from FIG. 15B, when $g_2/(2\pi)=1$ MHz, the effects from crosstalk errors are negligible (the logical error rate curves with and without crosstalk almost perfectly overlap). When $g_2/(2\pi)=2$ MHz, the effects are very small. However, if $g_2/(2\pi0=3$ MHz, the difference between logical Z error rates of the surface code with and without crosstalk errors is large enough such that one would need to use larger code distances to achieve the target logical failure rates for the algorithms as described herein. Hence, to maintain the overhead results, it would be preferable to use values of $g_2/(2\pi)=2$ MHz since in such a case, effects from crosstalk errors are very small.

Lastly, when only 4 modes are coupled to the ATS, the results from FIG. 15B indicate that $g_2/(2\pi)$ can go up to 4 MHz before effects from crosstalk become large enough such that one would need to use larger surface codes to achieve logical failure rates for the algorithms considered herein. In some cases, the maximum achievable $g_2$ is fundamentally limited by $4J/(10\alpha)$ due to the filter design and validity of adiabatic elimination. Here, 4J is the filter bandwidth which is given by $2\pi \times 100$ MHz for 5 modes per ATS and $2\pi \times 180$ MHz for 4 modes per ATS under the optimal choice of phononic mode frequencies. Hence, the maximum achievable $g_2/(2\pi)$ set by the filter design is given by 3.53 MHz and (6.36 MHz) for the setting with 5 and (4) modes per ATS. On the other hand, the crosstalk errors limit $g_2/(2\pi)$ to be bounded below 2 MHz (4 MHz). Thus, the crosstalk errors are currently a limiting factor and need to be further suppressed.

Adding Edges for Dealing with Correlated Errors

Extra edges are added to deal with two-qubit and three-qubit correlated errors arising from micro oscillations (e.g. cross-talk).

Figure 16A:
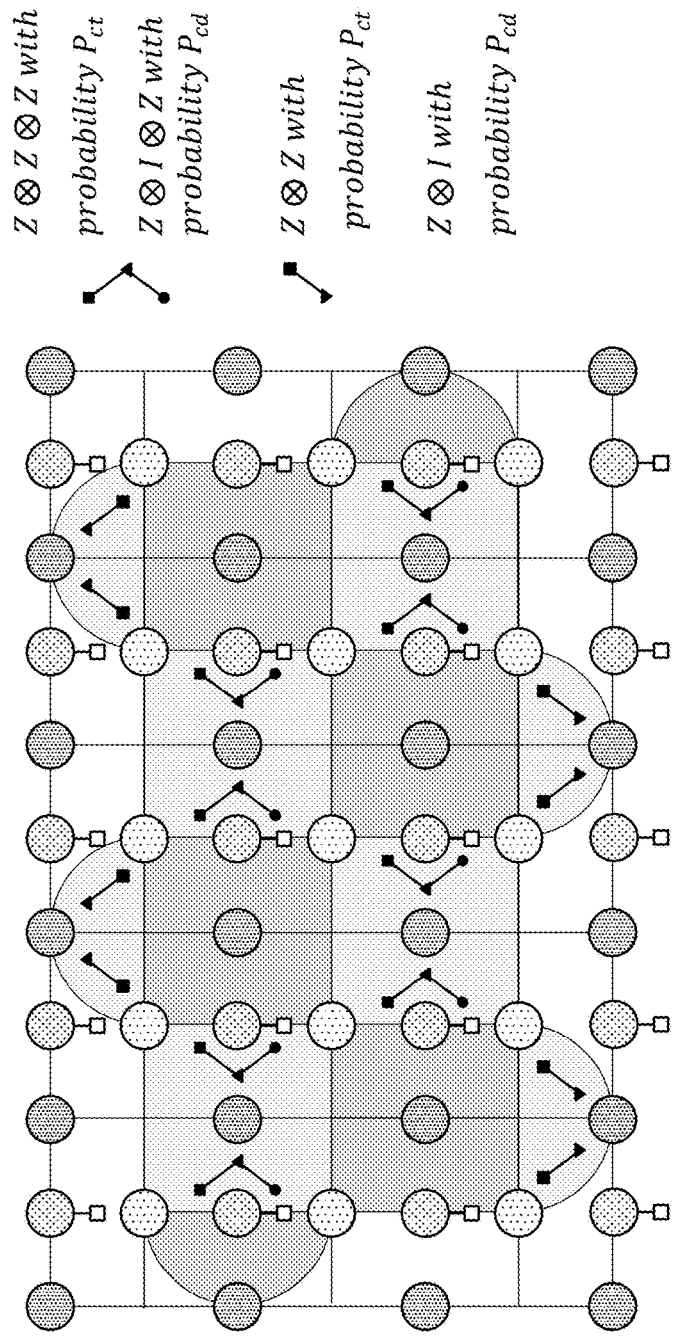
FIG. 16A illustrates a surface code and further illustrates fictitious gates used to show possible correlated errors that may arise before the X-basis measurement of the X-type ancilla qubits, wherein the correlated errors arise due to cross talk experienced by phononic modes of the surface code that share a multiplexed control circuit (e.g. multiplexed ATS), according to some embodiments.

For the purposes of the edge weight analysis, FIG. 16A illustrates, fictitious two-qubit and three-qubit gates which act as the identity and which are applied immediately prior to the X-basis measurements of the light grey plaquettes. The two-qubit correlated errors can be viewed as an $Z\otimes I\otimes Z$-type error at a three-qubit gate location, where the Z errors act on the qubits adjacent to the small squares and small triangles of such gates. Such errors occur with probability $P_{cd}$. Similarly, the three-qubit correlated errors can be viewed as an $Z\otimes Z\otimes Z$-type error at a three-qubit gate location. Such errors occur with probability Pet. Additionally, there can be correlated errors occurring between the ancilla and data qubits at the top and bottom boundaries of the lattice in FIG. 16A. Hence, fictitious two-qubit gate locations are added at such boundaries as shown in FIG. 16A.

Figure 16B:
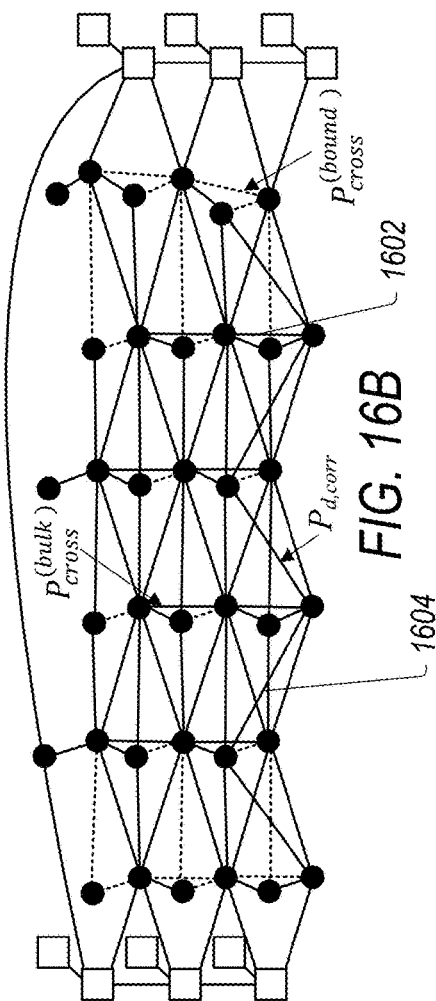
FIG. 16B illustrates a corresponding decoding graph for stabilizer measurements of the surface code shown in FIG. 16A, wherein additional edges have been added to correct for the correlated errors arising due to cross talk, according to some embodiments.

In order to incorporate the different types of correlated errors mentioned above into the MWPM decoding protocol, extra edges are added to the graph $G_{d_x}^{(3D)}$ as shown in FIG. 16B. The first type of extra edges are two-dimensional cross edges (1602) shown in that deal with two and three qubit correlated errors arising at the three-qubit fictitious gate locations of FIG. 16A. The edge-weight probabilities of such edges are labeled $P_{cross}^{(bulk)}$. Due to boundary effects, we also add dashed edges with edge-weight probabilities labeled $P_{cross}^{(bound)}$. Additionally, extra spacetime correlated edges (1604) are added at the bottom row of the graph in FIG. 16B with edge weight probabilities labeled by $P_{d(corr)}$. Note that the two-qubit correlated errors arising at the top boundary of FIG. 16A result in space-time correlated edges which are already included in $G_{d_x}^{(3D)}$.

In addition to the extra edges added to $G_{d_x}^{(3D)}$, the edge-weight probabilities of a subset of the edges already included in $G_{d_x}^{(3D)}$ need to be renormalized. The edge-weight probabilities of the added edges in addition to the renormalized edges are given by:

$P_{cross}^{(bulk)}=\Gamma(P_{ct},P_{cd};2,2)$, $P_{cross}^{(bound)}=\Gamma(P_{ct},P_{cd};1,1)$, $P_{d(corr)}=P_{ct}$ $P_{TB2X}=\Gamma(P_{ZZCX}^{(1)},P_{IZCX}^{(1)},P_d^{(1)},P_{cd};1,1,1,1)$ $P_{TB1X}=\Gamma(P_{ZZCX}^{(1)},P_{IZCX}^{(1)},P_{IZCX}^{(2)},P_d^{(1)},P_{cd};2,1,1,1,1)$ $P_{C2X}=\Gamma(P_{IZCX}^{(3)},P_{IZCX}^{(2)},P_{ZZCX}^{(1)},P_d^{(1)},P_{cd};1,1,1,1,1)$ $P_{BB2X}=\Gamma(P_{ZZCX}^{(1)},P_{IZCX}^{(1)},P_d^{(1)},P_{cd};1,1,1,1)$ $P_{BB1X}=\Gamma(P_{IZCX}^{(1)},P_{ZZCX}^{(1)},P_{ZICX}^{(1)},P_d^{(1)},P_{cd};2,1,1,1,1)$ $P_{C4X}=\Gamma(P_{IZCX}^{(3)},P_{IZCX}^{(1)},P_{IZCX}^{(1)},P_d^{(1)},P_{cd},P_{ct};1,1,1,1,1,1)$ $P_V^X=\Gamma(P_{VCX},P_s,P_m,P_{ct};4,1,1,1)$ For the space-time correlated edges, at the top row of the graph shown in FIG. 16B:

$P_{d_1,X}^{(bound,top)}=\Gamma P_{IZCX}^{(1)},P_{ZZCX}^{(1)},P_{ZICX}^{(2)},P_{ct};1,1,1,1)$.

Also, at the top row of FIG. 16B:

$P_{d_2,X}^{(top)}=\Gamma(P_{IZCX}^{(1)},P_{ZZCX}^{(1)},P_{ct};1,1,1)$.

In the above equations the F function is defined as follows:

$\Gamma(P_1,P_2,\ldots,P_j;n_1,N_2,\ldots,N_j)\equiv$
$\Sigma_{k=1}^j n_k P_k(1-P_k)^{n_k-1}\Pi_{i=1,i\neq k}^j (1-P_i)^{n_i}$.

Figure 17:
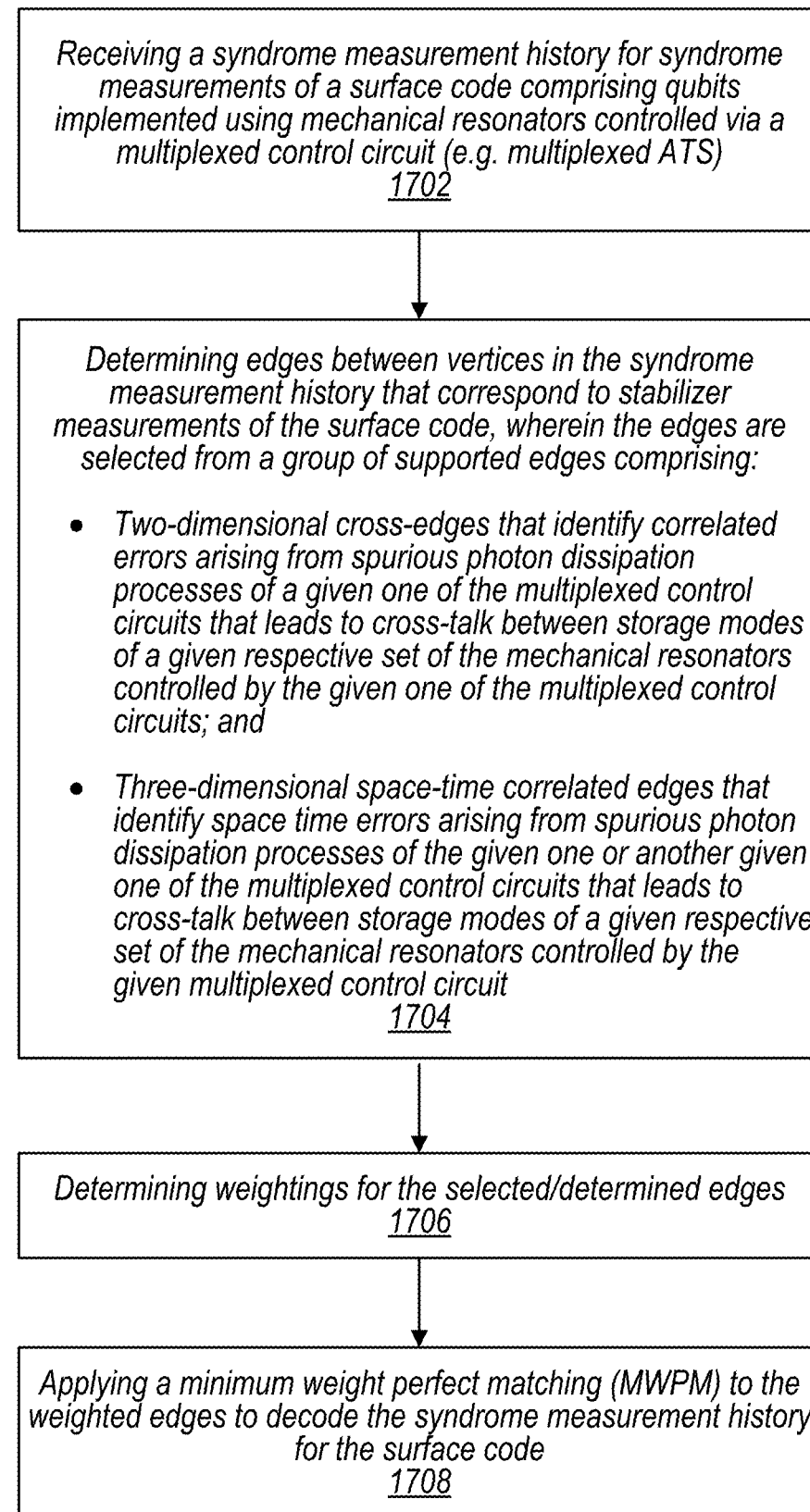
FIG. 17 is a flowchart illustrating a process of decoding a syndrome measurement history using additional edges to correct for cross talk errors, according to some embodiments.

FIG. 17 is a flowchart illustrating a process of decoding a syndrome measurement history using additional edges to correct for cross talk errors, according to some embodiments.

Figure 23:
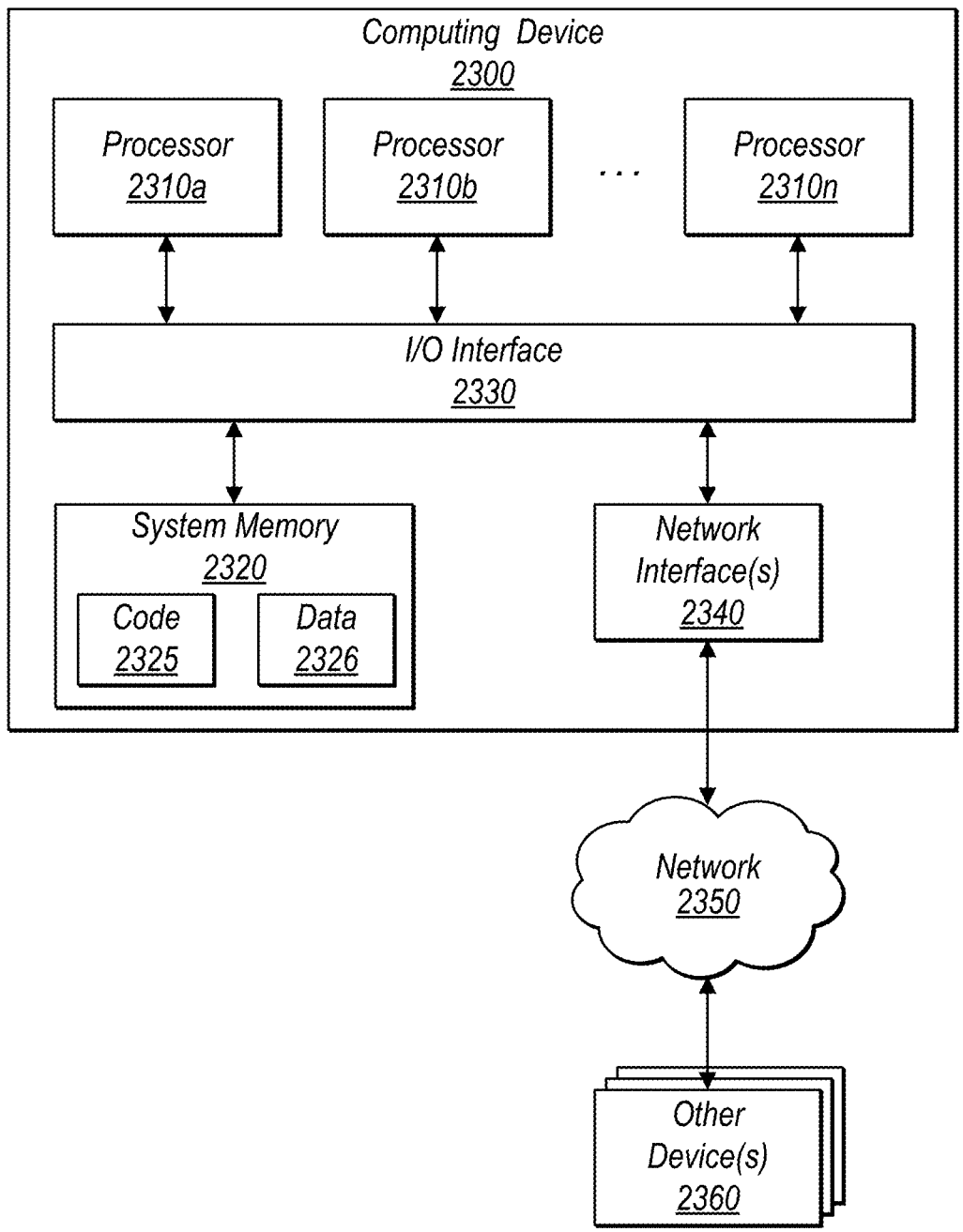
FIG. 23 is a block diagram illustrating an example computing device that may be used in at least some embodiments.

At 1702, a classical computer configured to decode syndrome measurement histories, such as computer system 23 illustrated in FIG. 23 storing program instructions for implementing syndrome measurement decoding, receives a syndrome measurement history for syndrome measurements of a surface code comprising qubits implemented using mechanical resonators controlled via a multiplexed control circuit (e.g. multiplexed ATS).

At 1704, the computer determines edges between vertices in the syndrome measurement history that correspond to stabilizer measurements of the surface code. The edges from which the computer may select edges to include the matching graph include vertical edges that identify measurement errors of the syndrome measurements, space-time correlated edges that identify CNOT gate failures of the surface code, two-dimensional cross-edges that identify correlated errors arising from spurious photon dissipation processes of a multiplexed control circuit that leads to cross-talk between storage modes of a set of the mechanical resonators controlled by the given multiplexed control circuit, and three-dimensional additional space-time correlated edges that identify space time errors arising from spurious photon dissipation processes of the given multiplexed control circuit or another given multiplexed control circuit that leads to cross-talk between storage modes of the set of the mechanical resonators controlled by the given multiplexed control circuit or the other given multiplexed control circuit.

At 1706, the computer determines weightings for the selected/determined edges. Also, at 1708, the computer applies a minimum weight perfect matching (MWPM) to the weighted edges to decode the syndrome measurement history for the surface code.

Hybrid Bacon-Shor Surface Code

Figure 18:
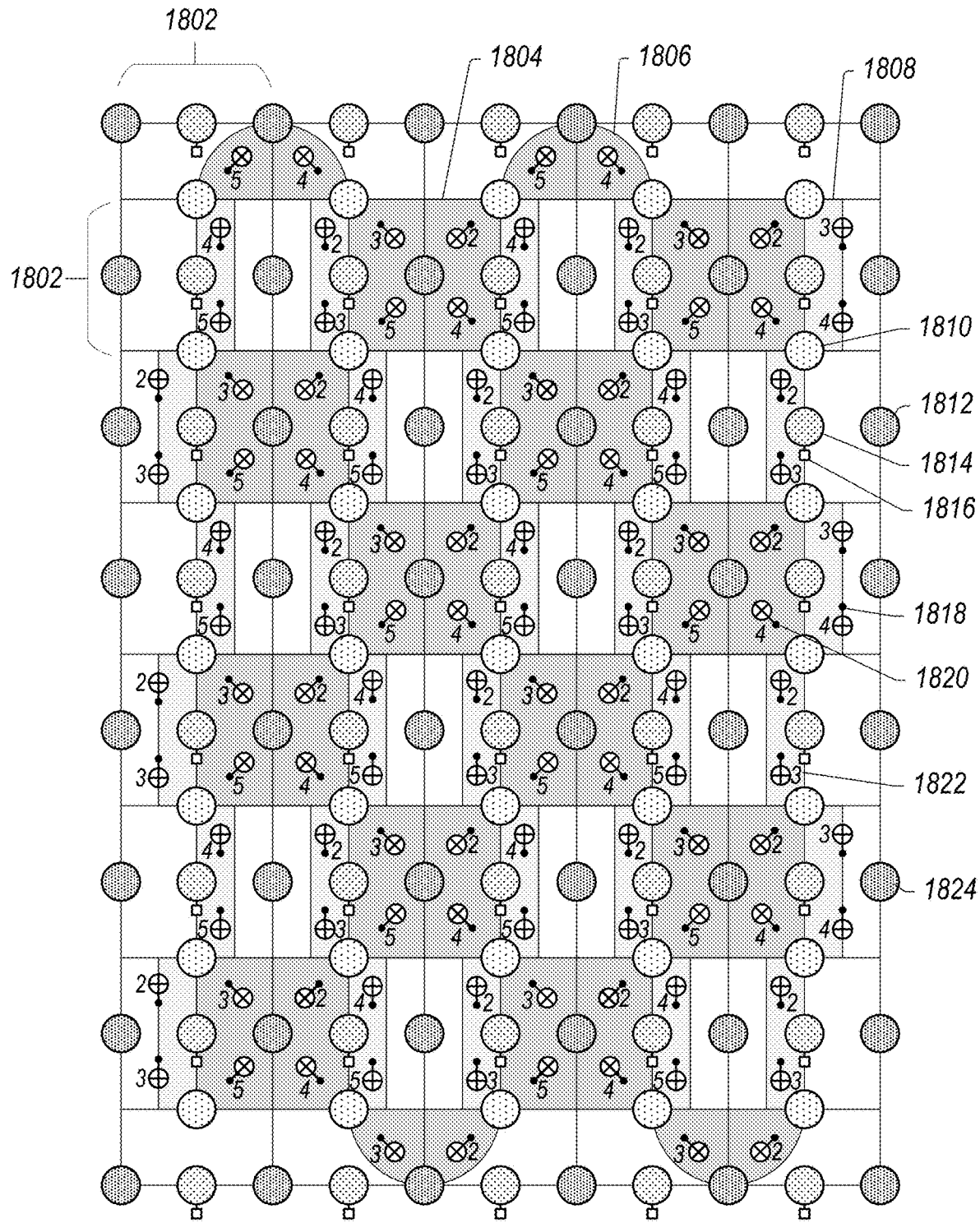
FIG. 18 illustrates an example hybrid Bacon-Shor surface code, according to some embodiments.

FIG. 18 illustrates an example hybrid Bacon-Shor surface code, according to some embodiments.

For example, in FIG. 18 the hybrid Bacon-Shor surface code (also referred to herein as a hybrid Surface/Bacon-Shor code or SBS code) has dimensions $d_x=5$ and $d_z=7$. The SBS code may be implemented using a bosonic architecture as described herein, such as system comprising mechanical resonators and multiplex control circuits, such as multiplexed ATSs. Each of the white boxes 1802 corresponds to an ATS. The darker grey squares (1804) and darker grey semi-circles (1806) correspond to Z-type gauge operators of the Bacon-Shor code portions of the SBS code. The lighter grey rectangles (1808) correspond to X-type gauge operators of surface code portions of the SBS code. The product of two X-type gauge operators between adjacent ATS's correspond to a stabilizer of the surface code. Data qubits are shown by the less densely hatched circles (1810). Ancilla qubits for the syndrome readout are shown by the more densely hatched circles (1812). The phononic readout modes are shown by the medium densely hatched circles. (1814). The white squares (1816) attached to the phononic readout modes show transom qubits associated with the phononic readout modes. The phononic readout mode (1814) can be used to directly measure the weight-two gauge operators. Ancilla qubits for the X-type gauge operators are initialized in the $|+\rangle$ state and measured in the X-basis. Ancilla qubits for the Z-type gauge operators are prepared in the $|0\rangle$ state and measured in the Z-basis. All the two-qubit gates (1818 for X-type gauge operators and 1820 for Z-type gauge operators) are CNOT gates. The numbers (1822) beside each operator indicate the time step in which it is applied.

In some embodiments, a hybrid Bacon-Shor surface code (SBS code) may reduce a number of modes coupled to an ATS, as compared to a traditional non-hybrid surface code. For example, a SBS code may only couple four phononic modes per ATS instead of five phononic modes per ATS as is the case for a traditional surface code. As discussed above in the section regarding Cross-Talk Mitigation Using Mode Frequency Optimization, having only four modes instead of five modes coupled to an ATS may reduce the probabilities of cross-talk, such as Type I, Type II, and Type III errors. Additionally, coupling fewer modes to an ATS may provide additional flexibility in selecting optimized frequencies and pump detunings to reduce Type III errors.

Hybrid Bacon-Shor surface codes (SBS codes) belong to a family of Compass codes, where stabilizers used to correct one type of Pauli error (say X-type errors) are the stabilizers of the Bacon-Shor code, and stabilizers used to correct the other type of Pauli error (say Z-type errors) are surface code stabilizers. SBS codes are subsystem stabilizer codes with the corresponding gauge group given by:

$$G = \langle X_{i,j}X_{i+1,j}, Z_{i,j}Z_{i,j+1}Z_{i+1,j}Z_{i+1,j+1}, Z_{1,2k-1}Z_{1,2k},$$
$$Z_{d_z,2k}Z_{d_z,2+1}\rangle$$

where $i \in \{1, 2, \ldots, d_z-1\}, j \in \{1, 2, \ldots, d_x-1\}$ and $$k \in \left\{1, 2, \ldots, \frac{d_x - 1}{2}\right\}.$$

Here $d_x$ corresponds to the minimum weight of a logical X operator (which consists of horizontal X strings) and $d_z$ corresponds to the minimum weight of a logical Z operator (which consists of vertical Z strings). An example of a $d_x=5$ and $d_z=7$ SBS code is shown in FIG. 18. The darker grey squares (1804) and darker grey semi-circles (1806) correspond to the Z-type gauge operators in the above equation and are used to detect X-type Pauli errors. The lighter grey rectangles (1808) correspond to the X-type gauge operators in the above equation and are used to detect Z-type errors.

The stabilizer group representing the logical subspace of SBS codes is given by:

$$S = \left\langle X_{i,j}X_{i,j+1}X_{i+1,j}X_{i+1,j+1}, X_{2t,d_x}X_{2t+1,d_x}X_{2t-1,1}X_{2t,1}, \prod_{i=1}^{d_z}Z_{i,j}Z_{i,j+1}\right\rangle,$$

where $$t \in \left\{1, 2, \ldots, \frac{d_z - 1}{2}\right\}.$$

The weight-four operator $X_{i,j}X_{i,j+1}X_{i+1,j}X_{i+1,j+1}$ in the bulk is a surface code stabilizer which can be measured by taking the product of the measured eigenvalues of the weight-two gauge operators $X_{i,j}X_{i+1,j}$ and $X_{i,j+1}X_{i+1,j+1}$. Furthermore, $\prod_{i=1}^{d_z}Z_{i,j}Z_{i,j+1}$ is a Bacon-Shor type stabilizer whose eigenvalue is obtained by taking the product of the measured eigenvalue of weight-four and weight-two Z-type gauge operators along a vertical strip. It is noted that due to the non-commutation of Z and X-type gauge operators in the equation above for the gage groups (G), only stabilizer measurement outcomes are used to correct errors. The gate scheduling for the CNOT gates used to measure the gauge operators the equation above for the gage groups (G) are chosen to be symmetry in the bulk, which is contrary to the gate scheduling chosen in other Bacon Shor hybrid codes. Such a scheduling is chosen so that three parity measurements between the phononic readout mode and the transmon qubit can be implemented in one syndrome measurement cycle. The circuit for measuring the weight-two X-type gauge operators of the equation above for the gage groups (G) is shown in FIG. 20.

Figure 20:
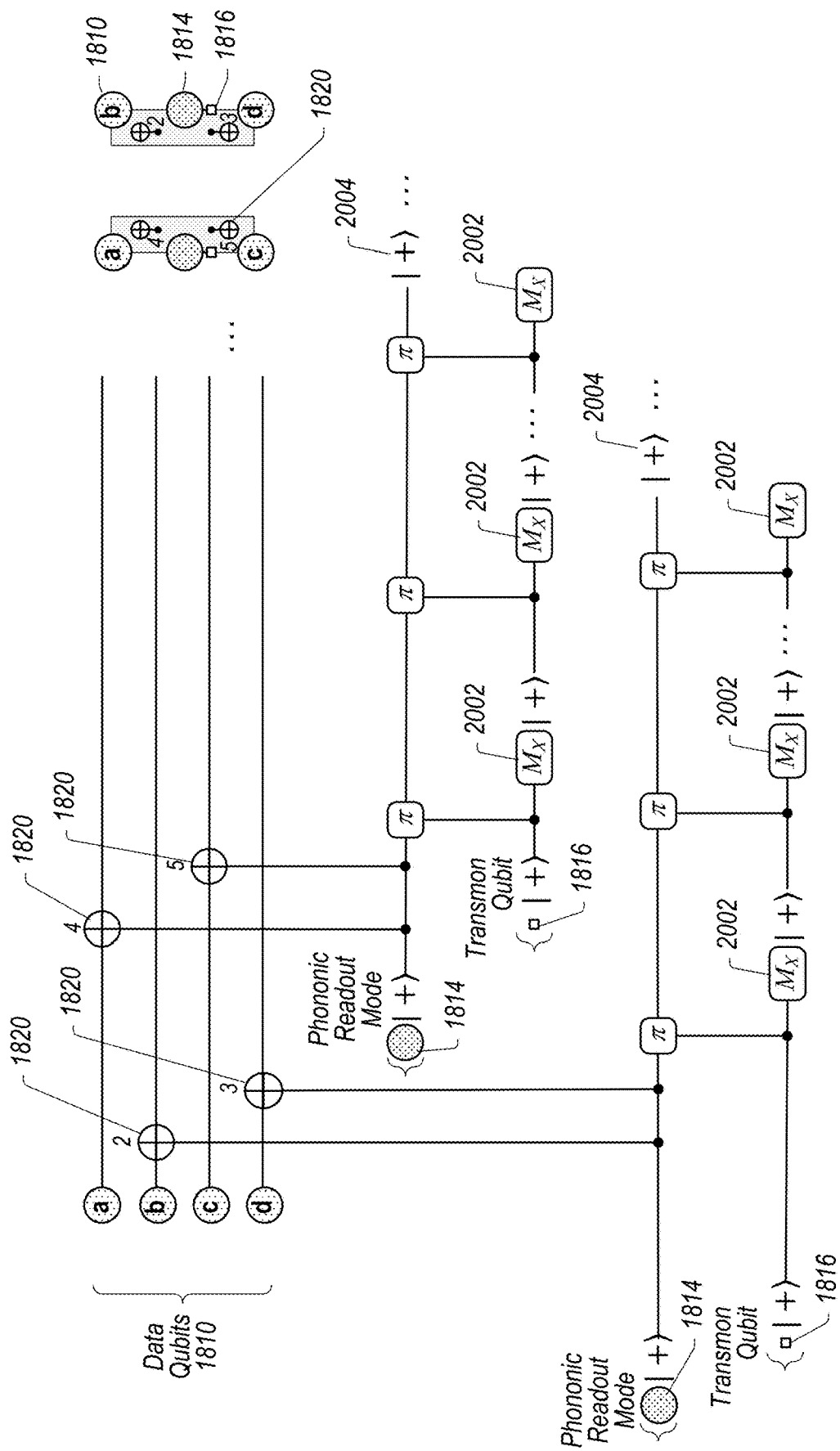
FIG. 20 illustrates a circuit for measuring weight-two gauge operators in relation to a hybrid Bacon-Shor surface code, according to some embodiments.
Figure 21:
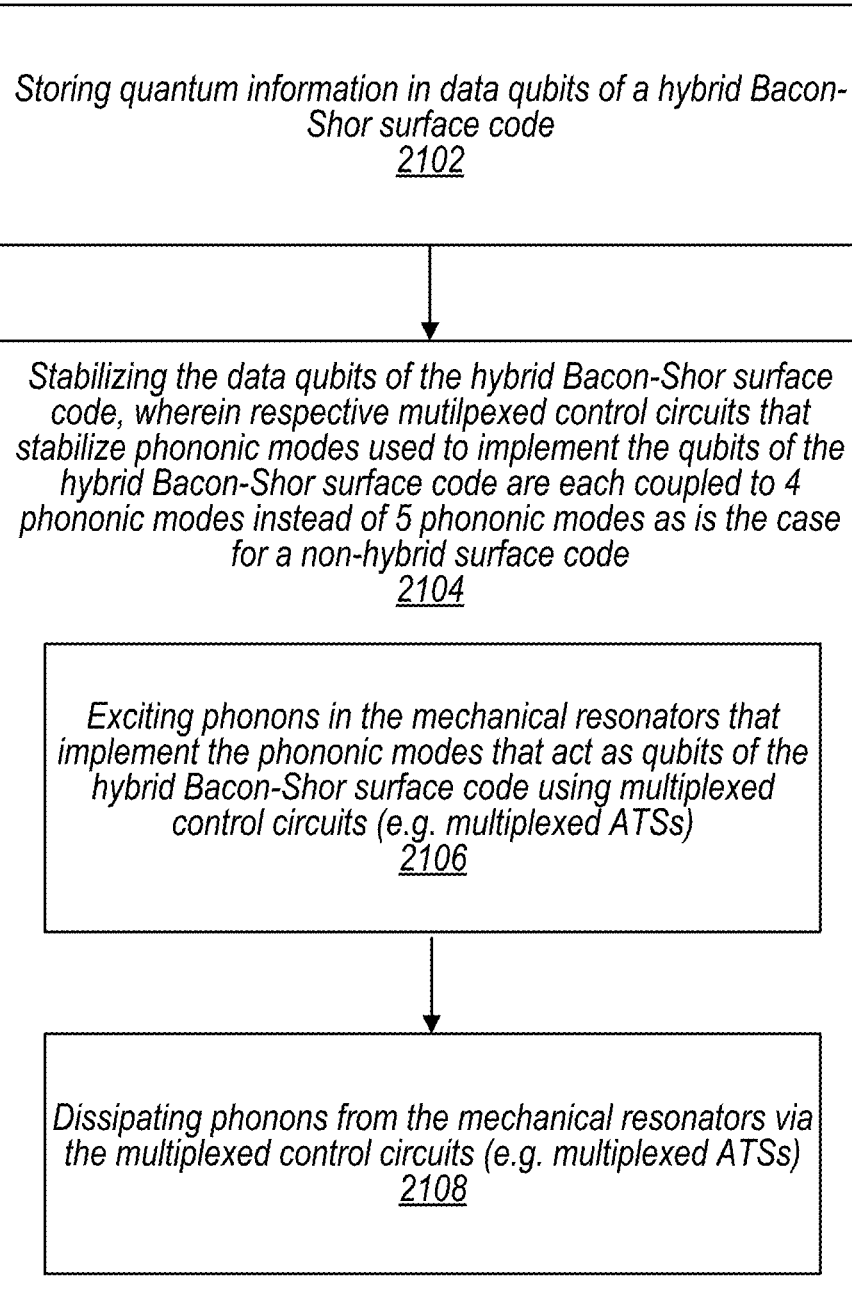
FIG. 21 is a flowchart illustrating a process of using a hybrid Bacon-Shor surface code, according to some embodiments.
Figure 22:
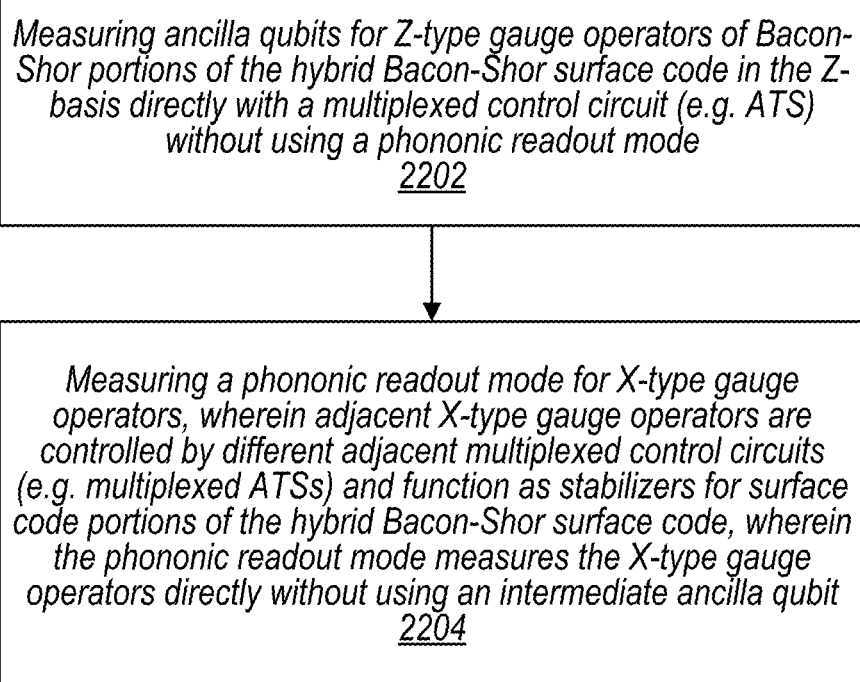
FIG. 22 is a flowchart illustrating an example process for performing measurements for a hybrid Bacon-Shor surface code, according to some embodiments.

For example, in FIG. 20, phononic read out modes (1814) are shown with associated transmons (1816) and wherein CNOT gates (1820) are applied between the data qubits 1810 and the phononic readout modes 1814. Note that the CNOT gate scheduling is selected such that three (or more) parity measurements (2002) are performed in a given syndrome cycle before the phononic readout mode must be reset to the $|+\rangle$ state (2004).

Thin-stripped surface codes may require five modes per ATS to measure the surface code stabilizers. In particular, a crucial step when performing an X-basis measurement in a thin-stripped surface code is to swap ancillas (shown as the darker grey circles 1824) with other ancillas with associated transmons (e.g. ancillas 1814) (after all four CNOT gates have been applied) and perform repeated parity measurements between the ancillas (1814) and a transmon qubit (white square (1816) connected to the phononic readout mode ancilla (1814)).

Figure 19A:
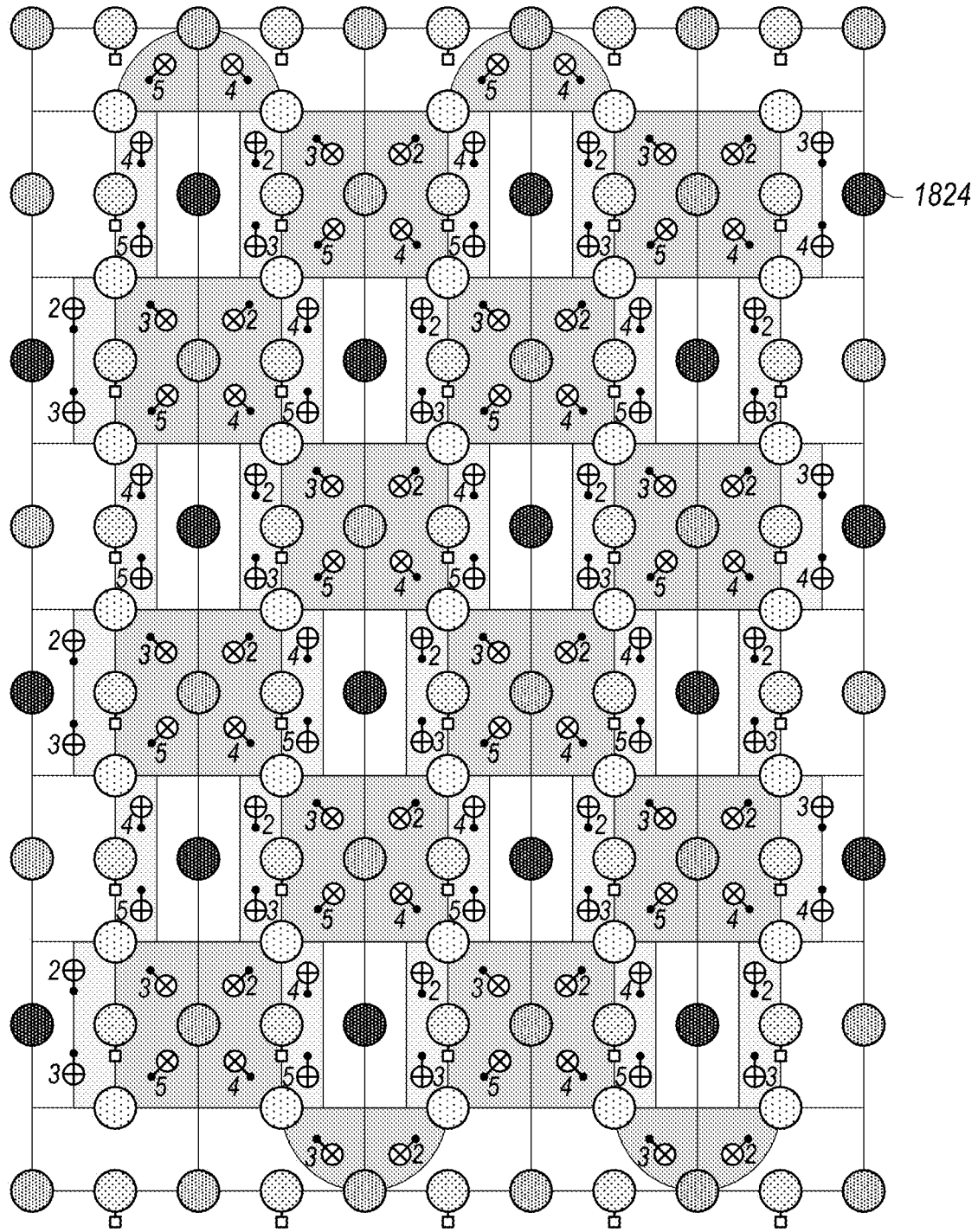
FIG. 19A illustrates the example hybrid Bacon-Shor surface code, wherein vertices that are not coupled to a multiplexed control circuit (e.g. multiplexed ATS) are highlighted (for example the highlighted vertices may be omitted such that a ratio of phononic modes per ATS is reduced from 5 to 4 as compared to a surface code that is a not a hybrid Bacon-Shor surface code), according to some embodiments.
Figure 19B:
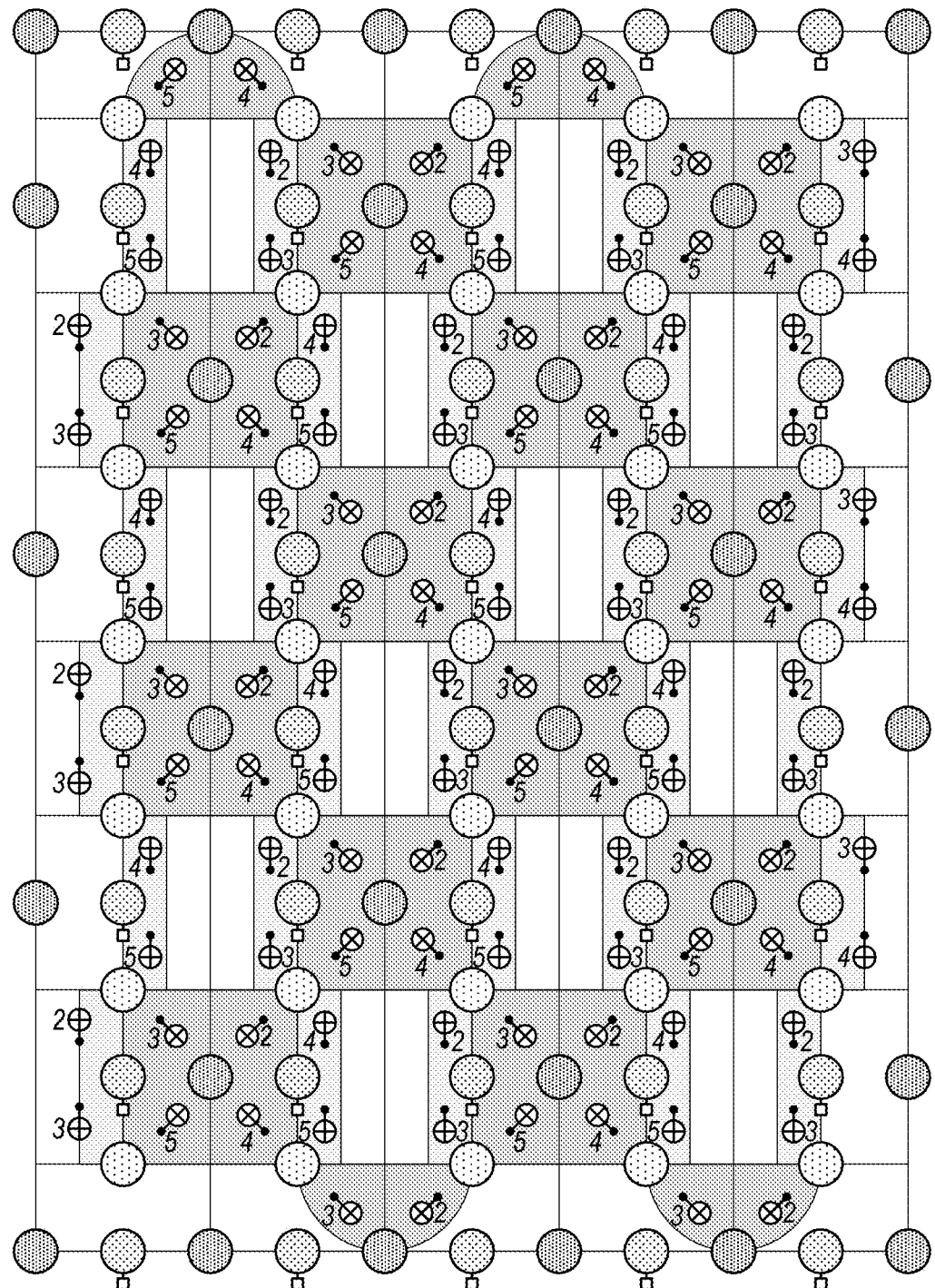
FIG. 19B illustrates the example hybrid Bacon-Shor surface code, wherein vertices that are not coupled to a multiplexed control circuit are removed, according to some embodiments.

However, in some embodiments, in order to improve the measurement fidelity, the SBS codes only require four modes per ATS. Such a reduction in the number of modes per ATS is shown in FIGS. 19A and 19B. For example in FIG. 19A the un-used phononic 1824 are highlighted and in FIG. 19B the unused phononic modes 1924 are omitted. In particular, due to the decomposition of the surface code stabilizers as a product of two weight-two X-type gauge operators in the equation above for the gage groups (G), the phononic readout mode can be used directly to measure such weight-two gauge operators. Furthermore, since the ancilla qubits for Z-type gauge operators are measured in the Z-basis, such measurements can be implemented directly without the use of a phononic readout. As such, all red vertices 1824 in FIGS. 18 and 19A can be removed as shown in FIG. 19B when implementing the SBS code.

As shown in the table discussed above with regard to the section Cross-Talk Mitigation Using Mode Frequency Optimization it can be seen that crosstalk errors are reduced by roughly one order of magnitude when only four modes are coupled to an ATS compared to five modes. As such, the hybrid Bacon-Shor surface code as described herein can correct both phase-flip and bit-flip errors while substantially reducing the effects of cross-talk errors as compared to the thin-stripped surface codes.

It is noted that other Bacon Shor surface codes may use flag qubits to measure the gauge operators of the code. However, the extra flag qubits and larger circuit depth required to measure such gauge operators contribute to an increase in logical failure rates for the same code parameters due to the larger number of fault locations. In contrast, the architecture proposed in this work has a circuit depth of 6 time steps compared to 11 time steps for measuring the stabilizers in other approached using flag qubits and does not require any flag qubits. The total qubit count $n_{tot}$ for the implementation of the SBS code considered in this work is:

$$n_{tot} = \frac{d_x(5d_z - 1) - d_z - 1}{2}.$$

Additionally, it is pointed out that because no flag qubits are required to measure the stabilizers of the SBS code, the MWPM decoder used to decode the error syndromes requires fewer operations as compared to MWPM decoders used to decode Bacon-Shor codes that include flag qubits. This at least in part because dynamical edge weight renormalization in each syndrome measurement round is not necessary when using a hybrid Bacon-Shor surface code (SBS code) as described herein.

Illustrative Computer System

FIG. 23 is a block diagram illustrating an example computing device that may be used in at least some embodiments.

FIG. 23 illustrates such a general-purpose computing device 2300 as may be used in any of the embodiments described herein. In the illustrated embodiment, computing device 2300 includes one or more processors 2310 coupled to a system memory 2320 (which may comprise both non-volatile and volatile memory modules) via an input/output (I/O) interface 2330. Computing device 2300 further includes a network interface 2340 coupled to I/O interface 2330.

In various embodiments, computing device 2300 may be a uniprocessor system including one processor 2310, or a multiprocessor system including several processors 2310 (e.g., two, four, eight, or another suitable number). Processors 2310 may be any suitable processors capable of executing instructions. For example, in various embodiments, processors 2310 may be general-purpose or embedded processors implementing any of a variety of instruction set architectures (ISAs), such as the x86, PowerPC, SPARC, or MIPS ISAs, or any other suitable ISA. In multiprocessor systems, each of processors 2310 may commonly, but not necessarily, implement the same ISA. In some implementations, graphics processing units (GPUs) may be used instead of, or in addition to, conventional processors.

System memory 2320 may be configured to store instructions and data accessible by processor(s) 2310. In at least some embodiments, the system memory 2320 may comprise both volatile and non-volatile portions; in other embodiments, only volatile memory may be used. In various embodiments, the volatile portion of system memory 2320 may be implemented using any suitable memory technology, such as static random access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random access memory (ReRAM), three-dimensional NAND technologies, Ferroelectric RAM, magnetoresistive RAM (MRAM), or any of various types of phase change memory (PCM) may be used at least for the non-volatile portion of system memory. In the illustrated embodiment, program instructions and data implementing one or more desired functions, such as those methods, techniques, and data described above, are shown stored within system memory 2320 as code 2325 and data 2326.

In some embodiments, I/O interface 2330 may be configured to coordinate I/O traffic between processor 2310, system memory 2320, and any peripheral devices in the device, including network interface 2340 or other peripheral interfaces such as various types of persistent and/or volatile storage devices. In some embodiments, I/O interface 2330 may perform any necessary protocol, timing or other data transformations to convert data signals from one component (e.g., system memory 2320) into a format suitable for use by another component (e.g., processor 2310). In some embodiments, I/O interface 2330 may include support for devices attached through various types of peripheral buses, such as a variant of the Peripheral Component Interconnect (PCI) bus standard or the Universal Serial Bus (USB) standard, for example. In some embodiments, the function of I/O interface 2330 may be split into two or more separate components, such as a north bridge and a south bridge, for example. Also, in some embodiments some or all of the functionality of I/O interface 2330, such as an interface to system memory 2320, may be incorporated directly into processor 2310.

Network interface 2340 may be configured to allow data to be exchanged between computing device 2300 and other devices 2360 attached to a network or networks 2350, such as other computer systems or devices. In various embodiments, network interface 2340 may support communication via any suitable wired or wireless general data networks, such as types of Ethernet network, for example. Additionally, network interface 2340 may support communication via telecommunications/telephony networks such as analog voice networks or digital fiber communications networks, via storage area networks such as Fibre Channel SANs, or via any other suitable type of network and/or protocol.

In some embodiments, system memory 2320 may represent one embodiment of a computer-accessible medium configured to store at least a subset of program instructions and data used for implementing the methods and apparatus discussed in the context of FIG. 1 through FIG. 22. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computing device 2300 via I/O interface 2330. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computing device 2300 as system memory 2320 or another type of memory. In some embodiments, a plurality of non-transitory computer-readable storage media may collectively store program instructions that when executed on or across one or more processors implement at least a subset of the methods and techniques described above. A computer-accessible medium may further include transmission media or signals such as electrical, electromagnetic, or digital signals, conveyed via a communication medium such as a network and/or a wireless link, such as may be implemented via network interface 2340. Portions or all of multiple computing devices such as that illustrated in FIG. 23 may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "computing device", as used herein, refers to at least all these types of devices, and is not limited to these types of devices.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A system comprising:
a plurality of mechanical resonators;
a multiplexed control circuit coupled with the mechanical resonators configured to stabilize arbitrary coherent state superpositions (cat states) of the mechanical resonators, wherein to stabilize the cat states, the multiplexed control circuit is configured to:
drive respective storage modes of the respective mechanical resonators; and
dissipate phonons from the respective mechanical resonators via an open transmission line coupled to the multiplexed control circuit that is configured to absorb photons from a dump mode of the multiplexed control circuit,
wherein the mechanical resonators are detuned such that phonons supplied from the multiplexed control circuit are supplied in an incoherent manner; and
one or more filters configured to suppress one or more spurious photon dissipation processes of the multiplexed control circuit that lead to cross-talk between the storage modes of the respective mechanical resonators if not suppressed.

2. The system of claim 1, wherein the suppressed one or more spurious photon dissipation processes of the multiplexed control circuit that lead to cross talk generate undesired terms in a Hamiltonian of the form:

$g_2 \hat{a}_i \hat{a}_j \hat{b}^\dagger e^{i\delta_{ijk}t} + h.c.$, where: $\delta_{ijk} = \omega_k^{(p)} - \omega_i - \omega_j + \omega_b$.

3. The system of claim 2, wherein the undesired terms in the Hamiltonian have comparable coupling strengths to desired terms in the Hamiltonian that provide the dump mode of the multiplexed control circuit that absorbs the photons.

4. The system of claim 2, wherein the one or more spurious photon dissipation processes of the multiplexed control circuit that lead to cross talk comprise:
effective dissipators of the multiplexed control circuit that induce stochastic errors.

5. The system of claim 2, wherein the one or more spurious photon dissipation processes of the multiplexed control circuit that lead to cross talk comprise:
effective Hamiltonians of the multiplexed control circuit that induce stochastic errors.

6. The system of claim 2, wherein the one or more spurious photon dissipation processes of the multiplexed control circuit that lead to cross talk comprise:
effective Hamiltonians of the multiplexed control circuit that induce coherent errors.

7. The system of claim 2, wherein the one or more spurious photon dissipation processes of the multiplexed control circuit that lead to cross talk comprise:
effective dissipators of the multiplexed control circuit that induce stochastic errors; and
effective Hamiltonians of the multiplexed control circuit that induce stochastic errors; and
wherein the effective dissipators of the multiplexed control circuit that induce stochastic errors and the effective Hamiltonians of the multiplexed control circuit that induce stochastic errors are suppressed based on placing the frequencies of the photons emitted from the multiplexed control circuit via the dump mode outside of a passband of the filter.

8. The system of claim 7, wherein the one or more spurious photon dissipation processes of the multiplexed control circuit that lead to cross talk further comprise:
effective Hamiltonians of the multiplexed control circuit that induce coherent errors,
wherein:
the mechanical resonators, the multiplexed control circuit, additional mechanical resonators, and one or more additional multiplexed control circuits, implement a surface code,
respective ones of the respective multiplexed control circuits are coupled to five phononic modes provided by a set of the mechanical resonators that implement the surface code,
the five phononic modes comprise two data modes, two ancilla modes, and a readout mode, the respective ones of the multiplexed control circuits stabilize two data modes and two ancilla modes, and timing of stabilizations performed for the surface code by the respective multiplexed control circuits are timed such that a target mode of a CNOT gate stabilized by a given multiplexed control circuit is also coupled to a control mode of the CNOT gate stabilized by the same given multiplexed control circuit.

9. The system of claim 8, wherein for a given multiplexed control circuit respective pump modes and the five phononic modes of the mechanical resonators stabilized by the given multiplexed control circuit are selected such that sets of pump modes and corresponding phononic modes are detuned from other sets of pump modes and corresponding phononic modes.

10. The system of claim 9, wherein frequencies of the phononic modes for given set of the mechanical resonators are selected based on a cost function that takes into account frequencies for the five phononic modes of the mechanical resonators and four pump detunings for pumps of the corresponding multiplexed control circuit that stabilize the two data modes and the two ancilla modes implemented using four of the five phononic modes.

11. The system of claim 10, wherein the cost function selects frequencies for the five phononic modes and four dump modes of the corresponding multiplexed control circuit such that:

effective dissipators of the corresponding multiplexed control circuit that induce stochastic errors; and effective Hamiltonians of the corresponding multiplexed control circuit that induce stochastic errors, fall outside of a passband of the filter; and the frequencies for the five phononic modes and the four dump modes are spaced such that probabilities of the effective Hamiltonians of the corresponding multiplexed control circuit inducing coherent errors is minimized or less than a threshold probability.

12. The system of claim 1, wherein respective ones of the multiplexed control circuits are coupled to five phononic modes.

13. The system of claim 1, wherein respective ones of the multiplexed control circuits are coupled to four phononic modes.

14. The system of claim 13, wherein fewer spurious photon dissipation processes occur in a configuration of the system wherein respective ones of the multiplexed control circuits are coupled to four phononic modes than occur in a configuration wherein respective ones of the multiplexed control circuits are coupled to five phononic modes.

15. A method, comprising:

selecting frequencies for phononic modes of cat states of a surface code; and selecting detunings for dump modes of multiplexed control circuits that stabilize the phononic modes of the cat states, wherein the frequencies for the phononic modes and the detunings for the dump modes are selected such that probabilities of effective Hamiltonians of the multiplexed control circuits inducing coherent errors is minimized or less than a threshold probability.

16. The method of claim 15, wherein the frequencies are further selected such that:

effective dissipators of a given one of the multiplexed control circuits that induce stochastic errors; and effective Hamiltonians of the given one of the multiplexed control circuits that induce stochastic errors, fall outside of a passband of a filter of the given one of the multiplexed control circuits.

17. The method of claim 16, further comprising:

using a cost function to select the frequencies for the phononic modes and the detunings of for the dump modes.

18. The method of claim 17, wherein, costs assigned when evaluating the cost function range from a low cost to a high cost, and wherein the cost function:

assigns a high cost to frequency and dump mode detunings that result in stochastic errors induced by effective dissipators; and assigns a high cost to stochastic errors inducted by effective Hamiltonians placed within a bandpass of a filter of the multiplexed control circuit.

19. The method of claim 18, wherein the cost function assigns respective costs for coherent errors induced by effective Hamiltonians based on an average of respective probabilities of such errors occurring in measurement time steps for measuring stabilizers of the surface code, wherein the assigned probabilities range from the low cost of 0 to the high cost of 1, and wherein a probability of 1 indicates a high probability of occurrence.

20. A method, comprising:

driving, via a control circuit respective storage modes of mechanical resonators that implement arbitrary coherent state superpositions (cat states); and dissipating phonons from the respective mechanical resonators via an open transmission line coupled to the control circuit that is configured to absorb photons from a dump mode of the control circuit; and suppressing, via a filter of the control circuit, one or more spurious photon dissipation processes of the control circuit that lead to cross-talk between the storage modes of the respective mechanical resonators if not suppressed.

21. The method of claim 20, wherein the suppressed one or more spurious photon dissipation processes of the control circuit that lead to cross talk generate undesired terms in the Hamiltonian of the form:

$g_2 \hat{a}_i \hat{a}_j \hat{b}^\dagger e^{i\delta_{ijk} t} + H.c.$, where: $\delta_{ijk} = \omega_k^{(p)} - \omega_i - \omega_j + \omega_b$.

22. The method of claim 21, wherein the one or more spurious photon dissipation processes of the control circuit that lead to cross talk comprise:

effective dissipators of the control circuit that induce stochastic errors; and effective Hamiltonians of the control circuit that induce stochastic errors.

23. The method of claim 22, wherein the effective dissipators of the control circuit that induce stochastic errors and the effective Hamiltonians of the control circuit that induce stochastic errors are suppressed based on placing the frequencies of the photons emitted from the control circuit outside of a passband of the filter.

* * * * *